(12) United States Patent
Liaw

(10) Patent No.: US 11,158,741 B2
(45) Date of Patent: Oct. 26, 2021

(54) NANOSTRUCTURE DEVICE AND METHOD

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/787,423

(22) Filed: Feb. 11, 2020

(65) Prior Publication Data
US 2021/0249531 A1 Aug. 12, 2021

(51) Int. Cl.
*H01L 29/78* (2006.01)
*H01L 29/66* (2006.01)
*H01L 29/423* (2006.01)
*H01L 29/06* (2006.01)

(52) U.S. Cl.
CPC ........ *H01L 29/785* (2013.01); *H01L 29/0665* (2013.01); *H01L 29/42364* (2013.01); *H01L 29/42376* (2013.01); *H01L 29/66795* (2013.01); *H01L 29/66818* (2013.01)

(58) Field of Classification Search
CPC .................................................. H01L 29/7853
See application file for complete search history.

(56) References Cited

U.S. PATENT DOCUMENTS

| | | | |
|---|---|---|---|
| 4,054,894 A * | 10/1977 | Heagerty | H01L 29/78609 257/354 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,439,044 B1 * | 10/2019 | Lee | H01L 21/3083 |
| 2007/0126035 A1 * | 6/2007 | Ernst | H01L 29/42384 257/288 |
| 2009/0159967 A1 * | 6/2009 | Edwards | H01L 29/66659 257/335 |
| 2010/0207208 A1 * | 8/2010 | Bedell | B82Y 40/00 257/346 |
| 2019/0131403 A1 * | 5/2019 | Lu | H01L 29/7848 |
| 2020/0365687 A1 * | 11/2020 | Xie | H01L 21/823481 |
| 2021/0098627 A1 * | 4/2021 | Liaw | H01L 29/0847 |
| 2021/0104613 A1 * | 4/2021 | Noh | H01L 29/41791 |

* cited by examiner

*Primary Examiner* — Grant S Withers
(74) *Attorney, Agent, or Firm* — Slater Matsil, LLP

(57) ABSTRACT

A semiconductor device includes a channel region, a first source/drain region and a second source/drain region on opposing sides of the channel region, and a gate electrode over the channel region. The channel region includes a first portion having a first surface and a second surface opposite the first surface, a second portion having a third surface and a fourth surface opposite the third surface, such that the third surface of the second portion faces the second surface of the first portion, and a fin portion extending from the second surface of the first portion to the third surface of the second portion. The gate electrode surrounds at least a portion of the channel region.

20 Claims, 54 Drawing Sheets

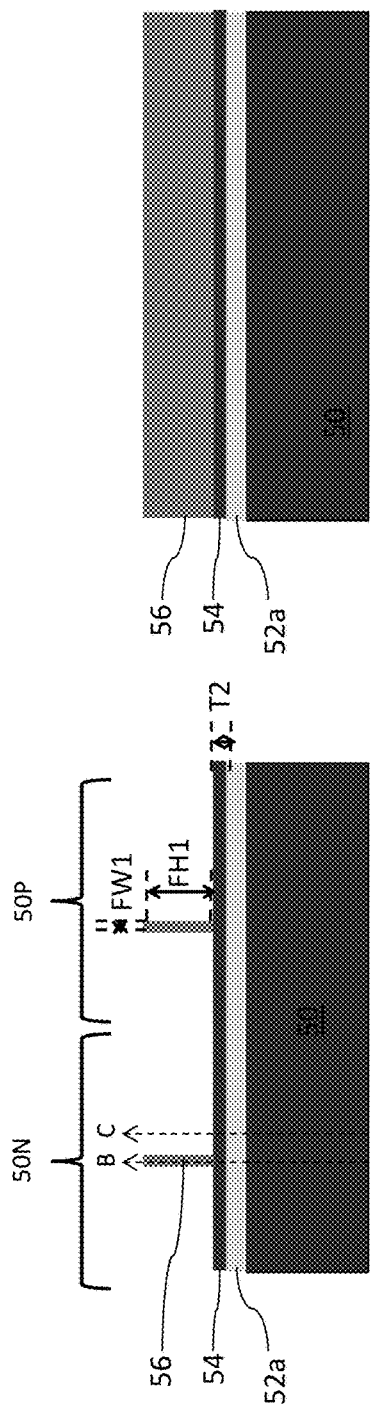
Figure 4A
Figure 4B
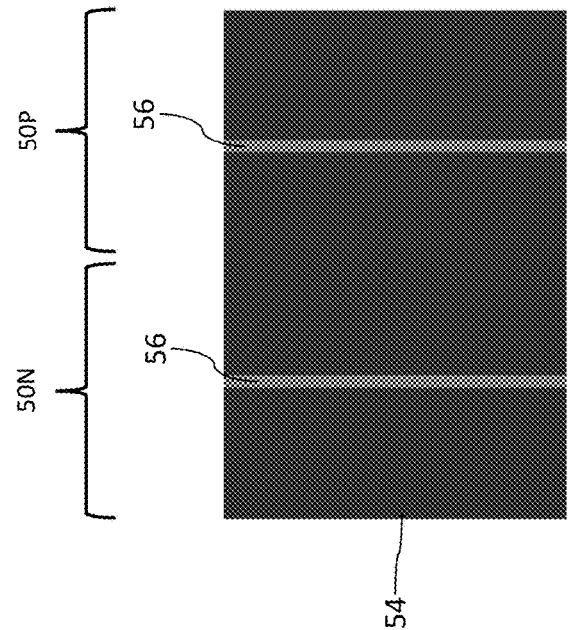
Figure 4D
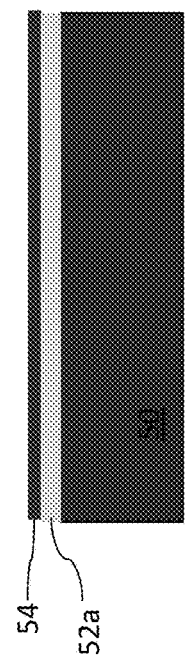
Figure 4C

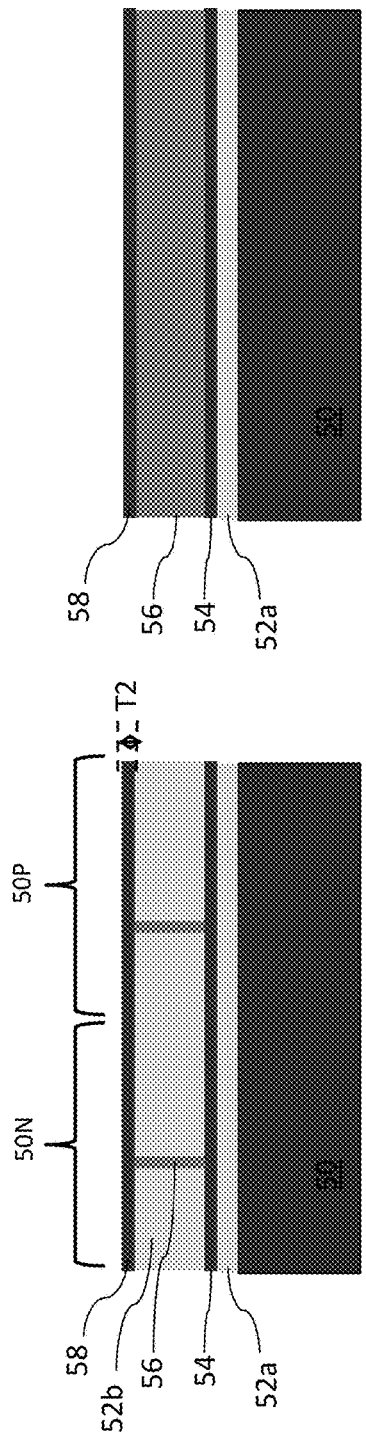
Figure 7A
Figure 7B
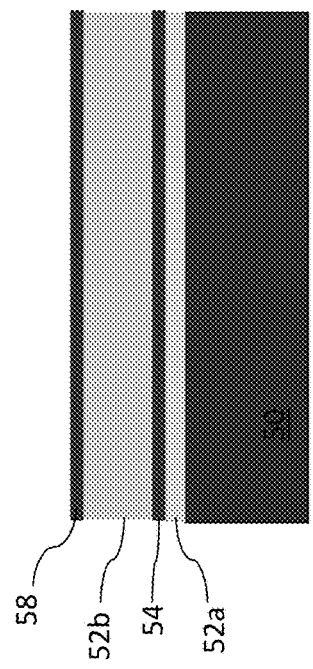
Figure 7C
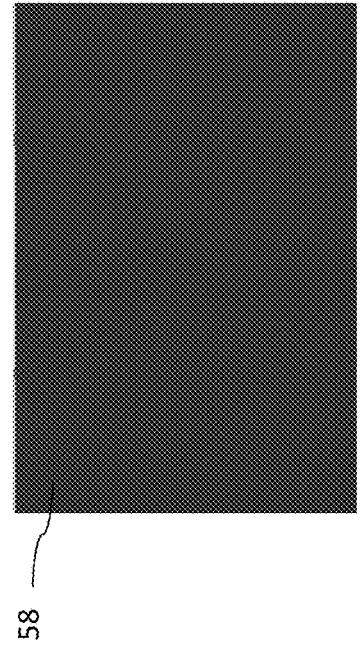
Figure 7D

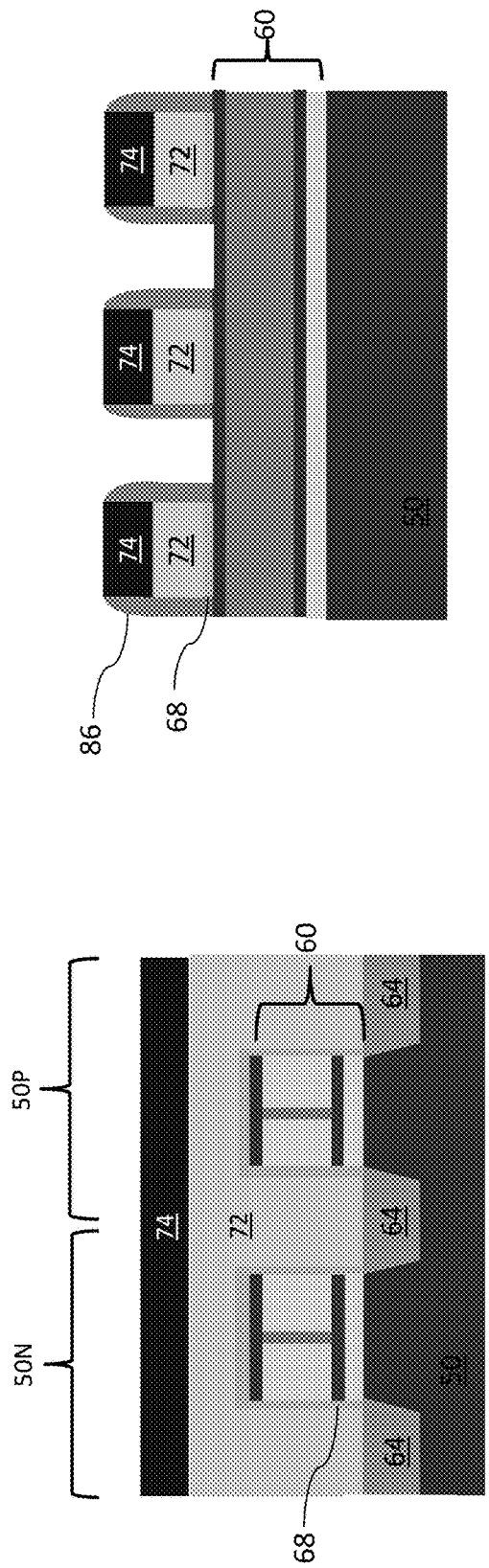
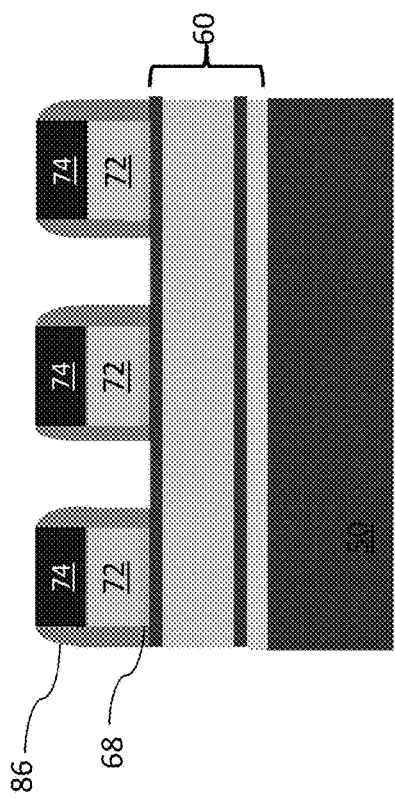
Figure 12A
Figure 12B
Figure 12C

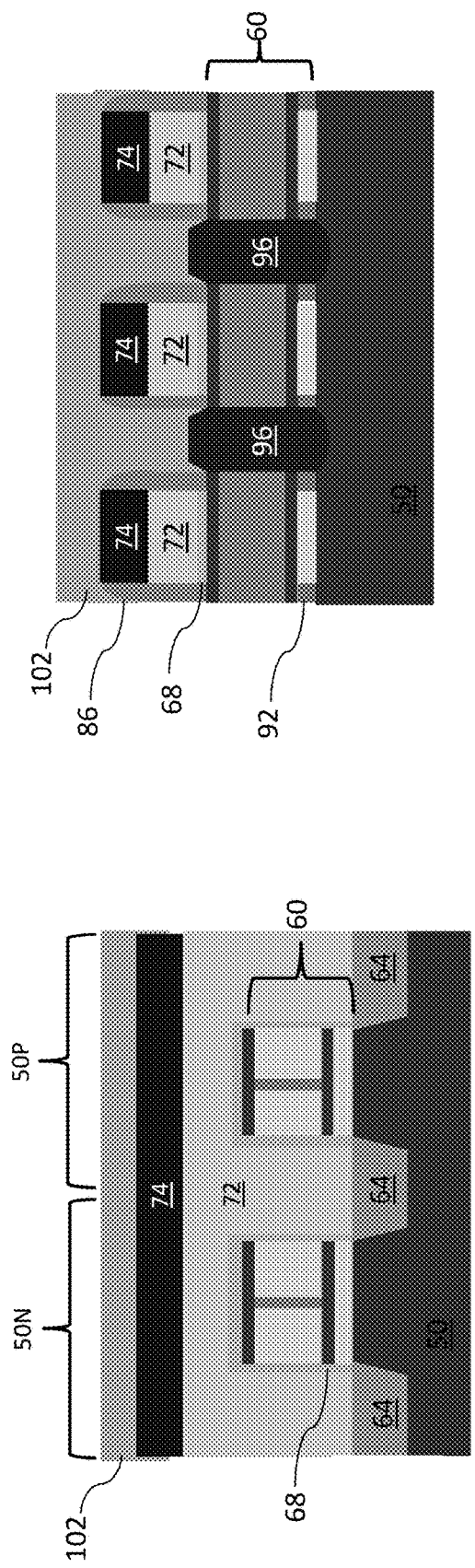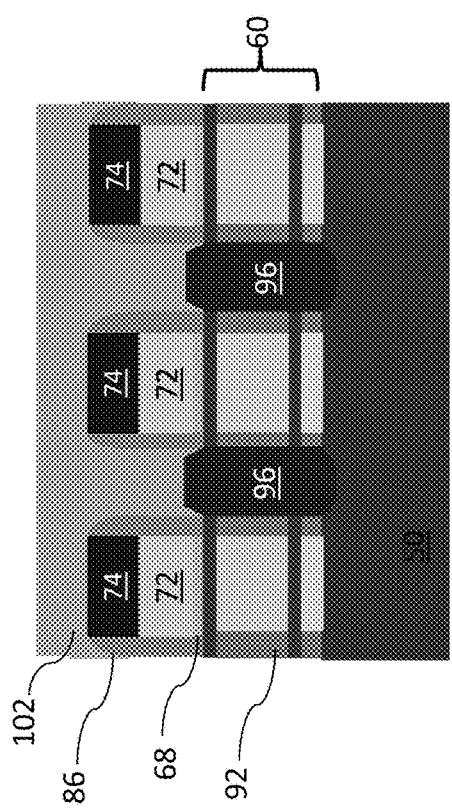
Figure 17A
Figure 17B
Figure 17C

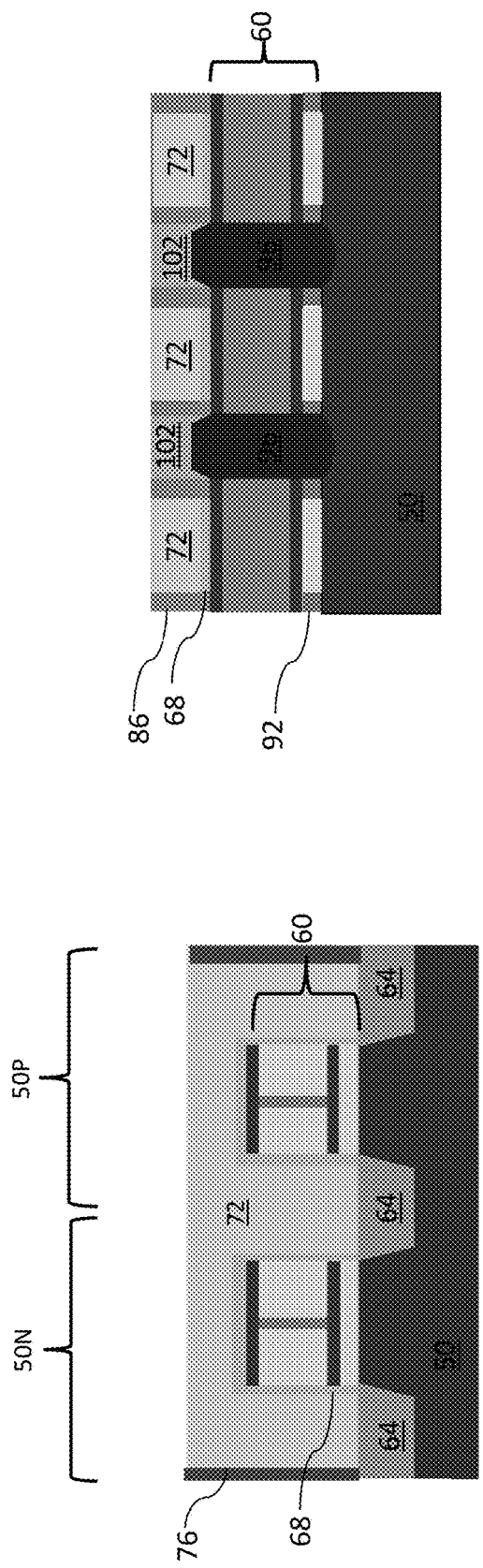
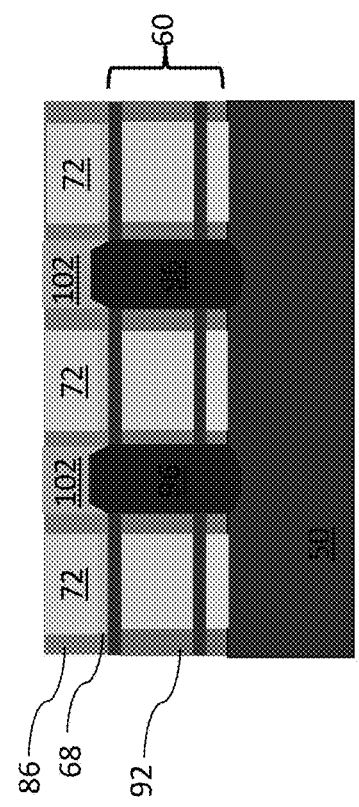
Figure 18B
Figure 18A
Figure 18C

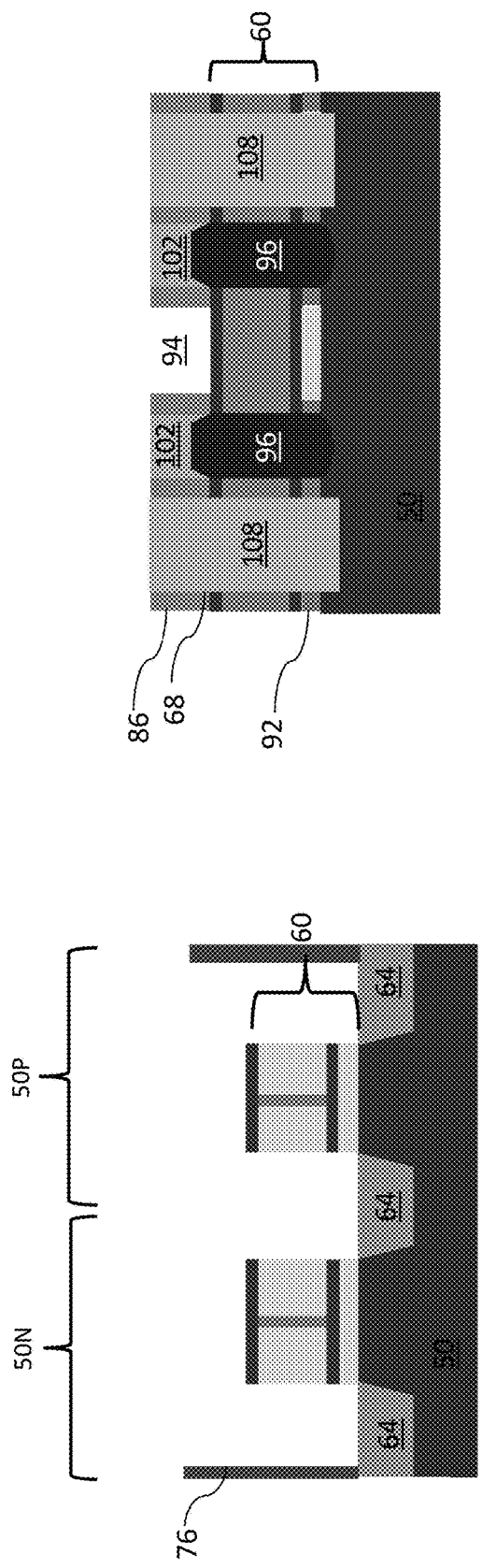
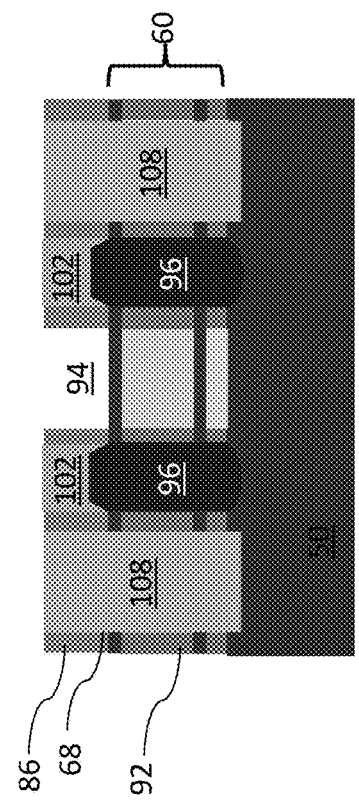
Figure 20A
Figure 20B
Figure 20C

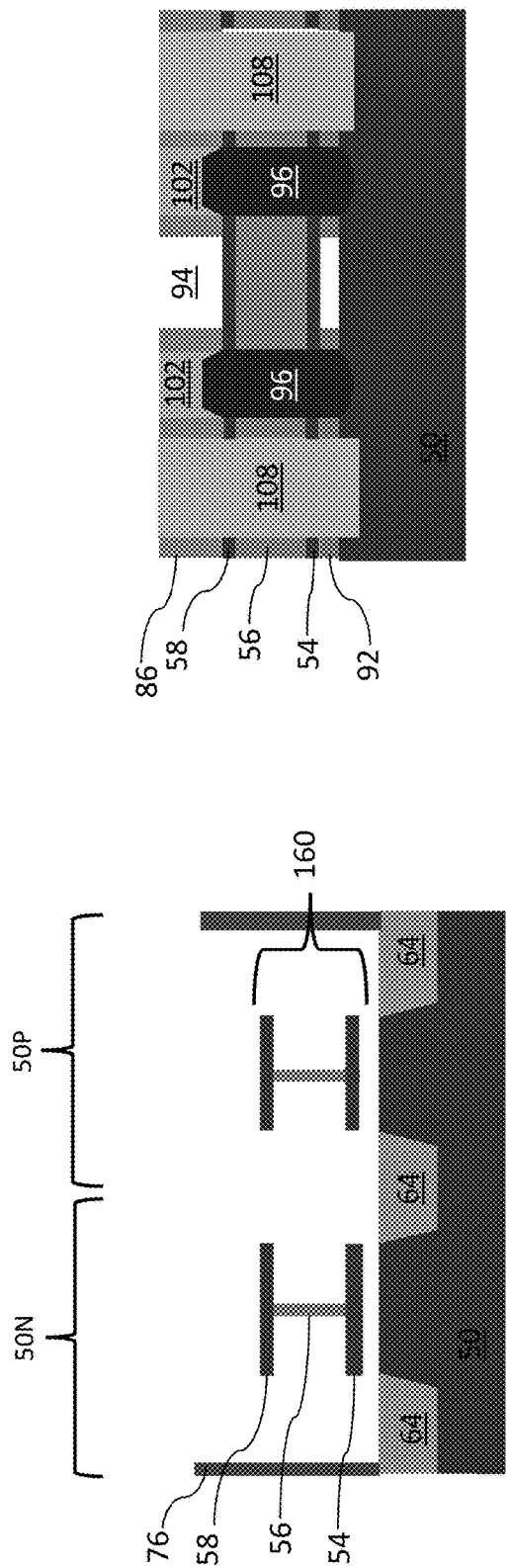
Figure 21B
Figure 21A
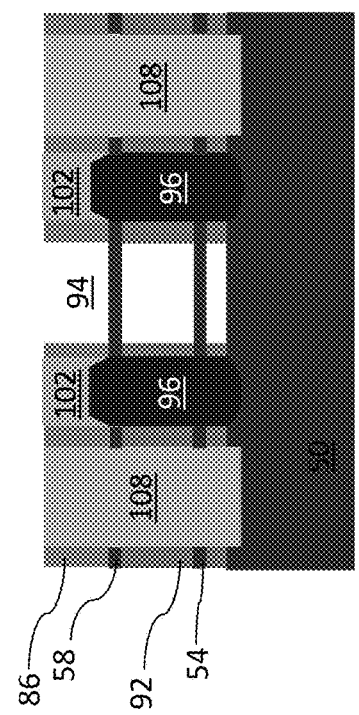
Figure 21C

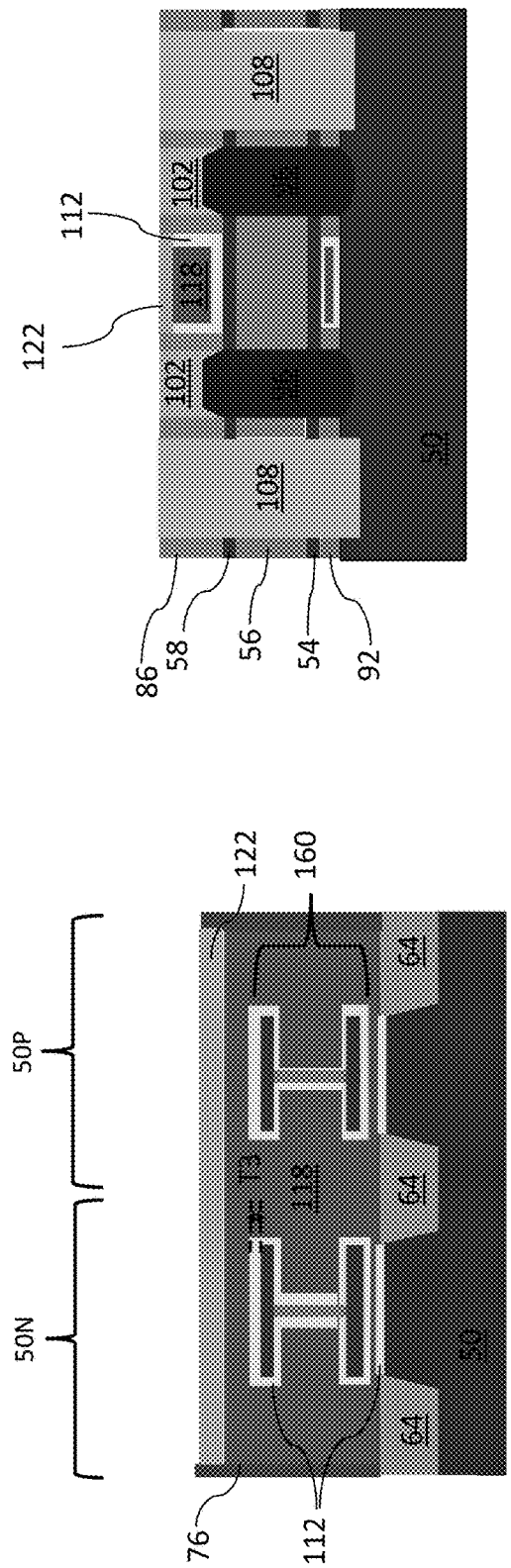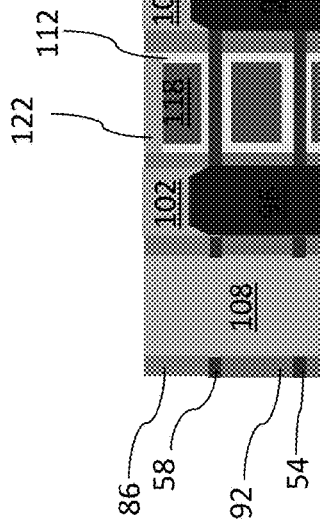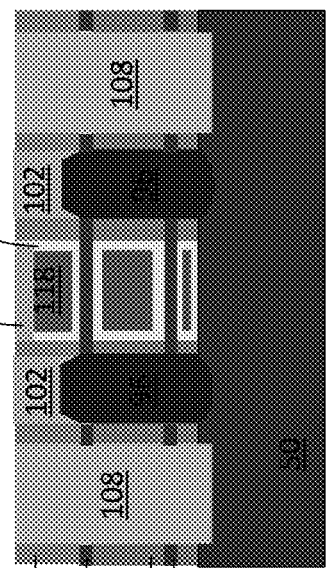
Figure 22A
Figure 22B
Figure 22C

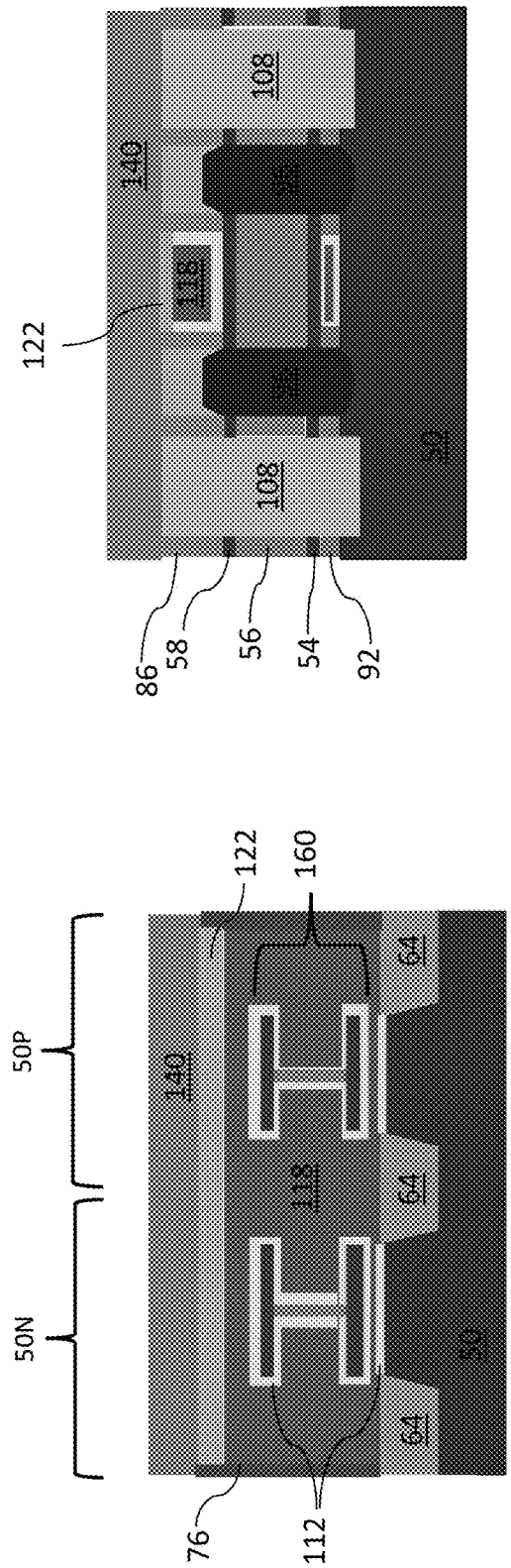
Figure 23A
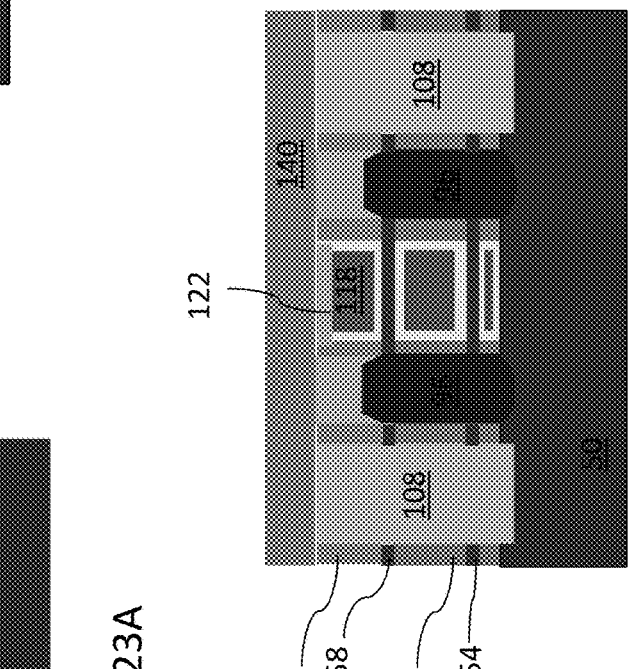
Figure 23B
Figure 23C

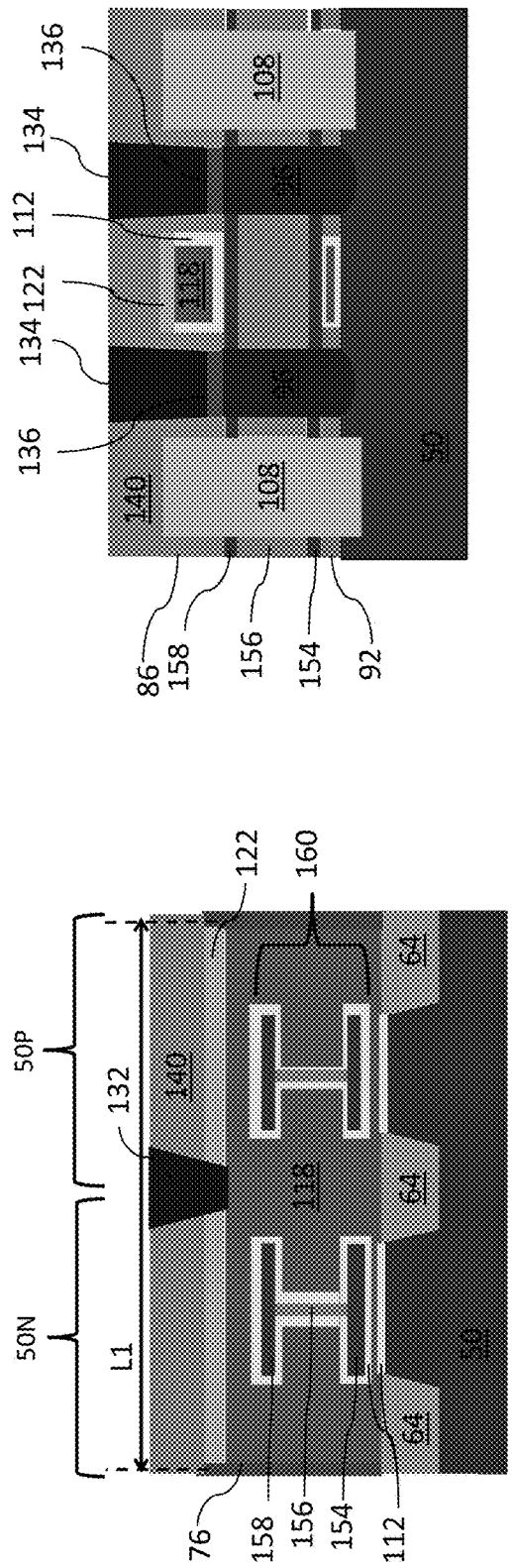
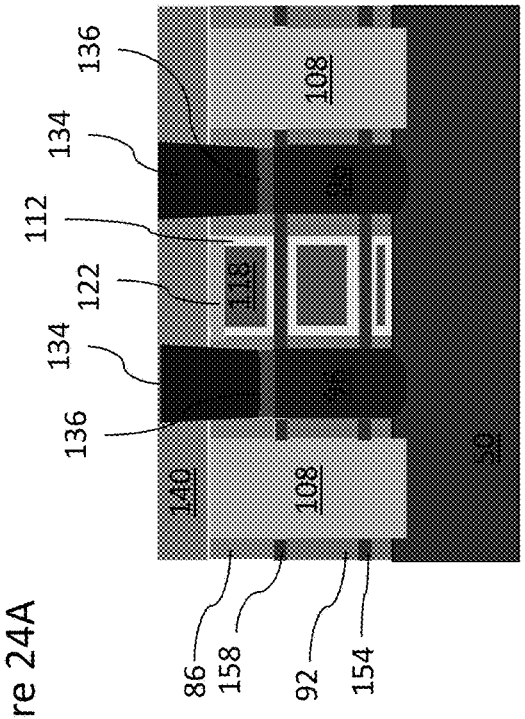
Figure 24A
Figure 24B
Figure 24C

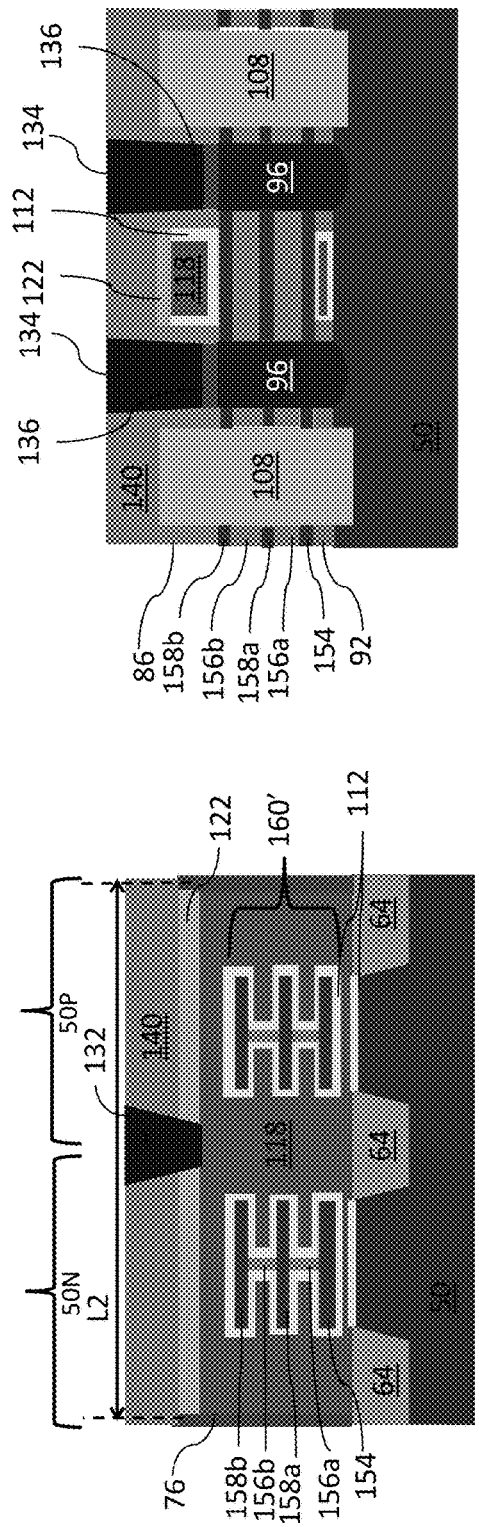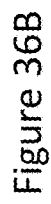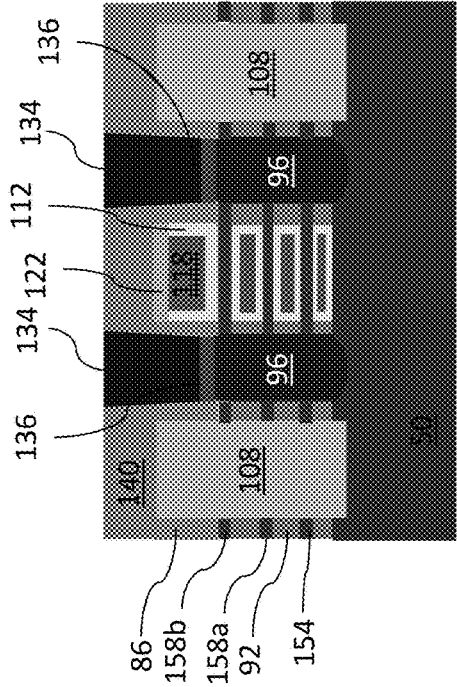
Figure 36A
Figure 36B
Figure 36C

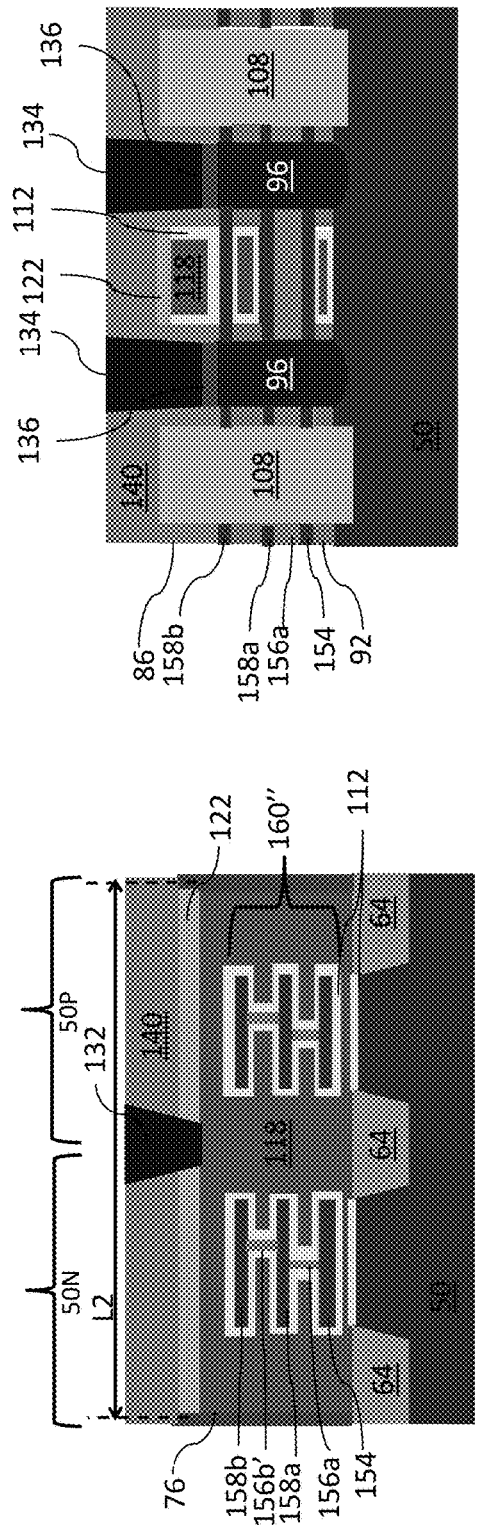
Figure 37A
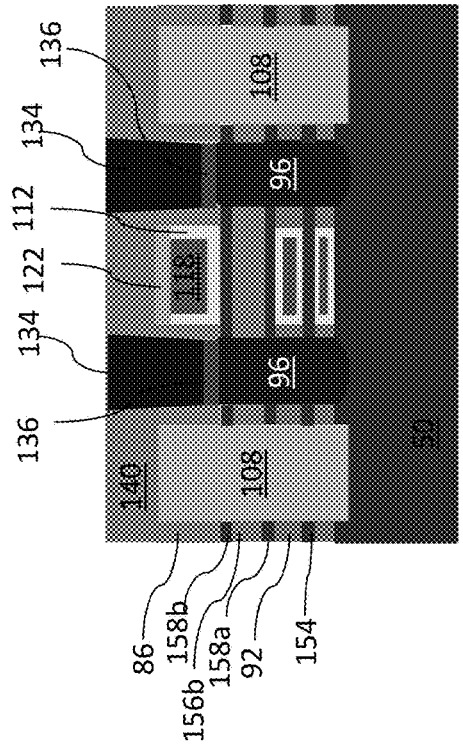
Figure 37B
Figure 37C

NANOSTRUCTURE DEVICE AND METHOD

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. For example, in the 22 nm and smaller nodes, FinFET devices have become a popular candidate for high performance and lower leakage applications. This is due in part to additional sidewall device width (leading to better on current performance) as well as better short channel control (leading to reduced subthreshold leakage).

Nanostructure (NS) devices have been proposed as potential successors to FinFET devices. In NS devices, MOSFET devices having, for example, vertically stacked multiple channels arranged as horizontal nanostructures (e.g., nanowires or nanosheets) with narrow cylindrical or sheet-shaped channel bodies are promising for continuing to shrink dimensions of complementary metal oxide semiconductor (CMOS) transistors. This is due to nanostructure field-effect transistors (NSFETs) having improved gate control ability, lower leakage current, greater capacity to be further shrunk, and comparable layout to existing FinFET devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 37C are cross-sectional and plan views of intermediate stages in the manufacturing of an MFCNS device, in accordance with some embodiments.

DETAILED DESCRIPTION

Figure 1:
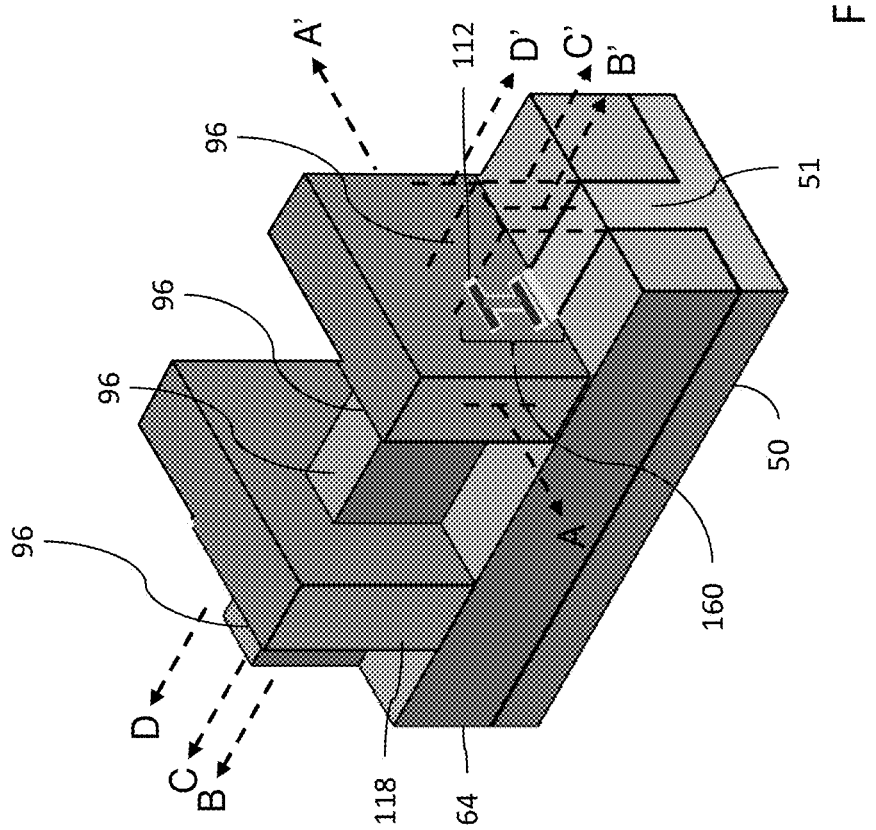
FIG. 1 illustrates an example of a Multi-Finger-Channel Nanostructure (MFCNS) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, this disclosure describes embodiments of Multi-Finger-Channel Nanostructure (MFCNS) devices for applications such as high performance and low supply voltage applications. The MFCNS devices comprise channel regions with horizontal sheets physically connected by vertical fins. Source/drain regions extend from the channel regions. The increased sidewall space provided by the vertical fins may benefit the epitaxial growth margin of the source/drain regions. Device on current ($I_{on}$) performance may be improved by more effective channel width from the combination of horizontal sheets and vertical fins. Embodiments such as those described herein may additionally reduce the current crowding issue in a top-facing channel sheet that may be experienced in a NS structure during on stage and high voltage operation by the use of multiple horizontal sheets connected by one or more vertical fins. The MFCNS device structure comprises both vertical and horizontal channel orientations which may provide for more balanced performance between NMOSFETs and PMOSFETs. The MFCNS device may also allow input/output devices and core devices to share the same structure, enabling cost reduction.

FIG. 1 illustrates a perspective view of an example of an MFCNS device, in accordance with some embodiments. The MFCNS device comprises a channel region 16o over a substrate 50 (e.g., a semiconductor substrate). Isolation regions 64 are disposed in the substrate 50. In some embodiments, the channel region 16o may be positioned above a fin 51 protruding between neighboring isolation regions 64. Although the isolation regions 64 are described/illustrated as being separate from the substrate 50, as used herein the term "substrate" may be used to refer to just the semiconductor substrate or a semiconductor substrate inclusive of isolation regions 64. Additionally, although the fin 51 is illustrated as a single, continuous material as the substrate 50, the fin 51 and/or the substrate 50 may comprise a single material or a plurality of materials. In this context, the fin 51 refers to the portion extending between the neighboring isolation regions 64.

A gate dielectric layer 112 is along outer surfaces of the channel region 16o, and a gate electrode 118 is over the gate dielectric layer 112. Source/drain regions 96 are disposed on the fin 51 on opposite sides of the gate dielectric layer 112 and gate electrode 118. FIG. 1 further illustrates reference cross-sections that are used in later figures. Cross-section A-A' is along a longitudinal axis of the gate electrode 118 and in a direction, for example, perpendicular to the direction of current flow between the source/drain regions 96 of the MFCNS device. Cross-section B-B' is perpendicular to cross-section A-A' and is along a longitudinal axis of the fin 51 and in a direction of, for example, a current flow between the source/drain regions 96 of the MFCNS device. Cross-section C-C' is parallel to cross-section B-B' at a horizontal offset, passing through a different portion of the channel region 160 from cross-section B-B'. Cross-section D-D' is parallel to cross-section B-B' and extends above a Shallow Trench Isolation (STI) region 64 of the MFCNS device. Subsequent figures refer to these reference cross-sections for clarity.

FIGS. 2 through 37C are cross-sectional or plan views of intermediate stages in the manufacturing of MFCNS devices, in accordance with some embodiments. FIGS. 2, 3, 4A, 5A, 6A, 7A, 8A, 9A, 10A, 11A, 12A, 13A, 14A, 15A, 16A, 17A, 18A, 19A, 20A, 21A, 22A, 23A, 24A, 25, 26, 27, 28, 29A, 29B, 30A, 30B, 31A, 31B, 32A, 32B, 33A, 33B, 36A, and 37A are illustrated along reference cross-section A-A' illustrated in FIG. 1, except for multiple fins/MFCNS devices. FIGS. 4B, 5B, 6B, 7B, 8B, 9B, 10B, 11B, 12B, 13B, 14B, 15B, 16B, 17B, 18B, 19B, 20B, 21B, 22B, 23B, and 24B are illustrated along reference cross-section B-B' illustrated in FIGS. 1 and 4A, except for multiple fins/MFCNS devices. FIGS. 4C, 5C, 6C, 7C, 8C, 9C, 10C, 11C, 12C, 13C, 14C, 15C, 16C, 17C, 18C, 19C, 20C, 21C, 22C, 23C, and 24C are illustrated along reference cross-section C-C' illustrated in FIG. 4A, except for multiple fins/MFCNS devices. FIGS. 4D, 5D, 6D, 7D, 8D, 9D, 10D, 11D, 12D, 13D, 14D, 15D, 16D, 17D, 18D, 19D, 20D, 21D, 22D, 23D, and 24D are plan views from above the structures illustrated in the various cross-sectional views of FIGS. 4A through 24E, except for multiple fins/MFCNS devices. FIGS. 9E, 10E, 11E, 12E, 13E, 14E, 15E, 16E, 17E, 18E, 19E, 20E, 21E, 22E, 23E, and 24E are illustrated along reference cross-section D-D' illustrated in FIGS. 1 and 9D, except for multiple fins/MFCNS devices. FIG. 36B is illustrated along reference cross-section E-E' illustrated in FIG. 29A, except for multiple fins/MFCNS devices. FIGS. 34A, 34B, 35A, 35B, 35C, 35D, 36C, 36D, and 36E are illustrated along reference cross-section F-F' illustrated in FIG. 29A, except for multiple fins/MFCNS devices. FIG. 37B is illustrated along reference cross-section E-E' illustrated in FIG. 29B, except for multiple fins/MFCNS devices. FIG. 37C is illustrated along reference cross-section F-F' illustrated in FIG. 29B, except for multiple fins/MFCNS devices.

FIGS. 2 through 24E illustrate the forming of embodiments in which channel regions are formed with two horizontal sheets physically connected by one vertical fin. In other embodiments, such as those illustrated by FIGS. 25 through 37C, more than two horizontal sheets and more than one vertical fin may be formed.

Figure 2:
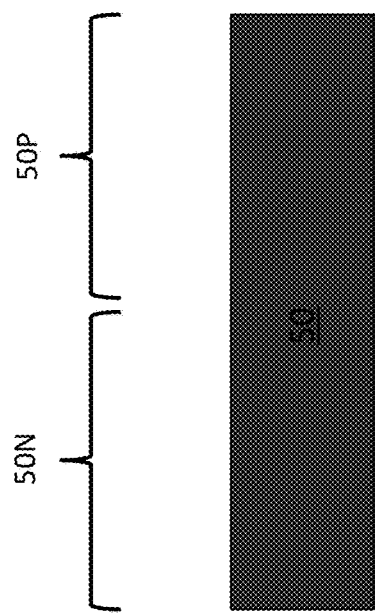

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon or bulk-Si; germanium; a compound semiconductor including SiC, SiP, SiPC, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; a silicon-on-insulator silicon (SOI-Si) or SOI-SiGe layered material, a group III-group VI compound material; or combinations thereof.

The substrate 50 may have a region 50N and a region 50P. The region 50N can be for forming n-type devices, such as NMOS transistors, e.g., n-type MFCNS devices. The region 50P can be for forming p-type devices, such as PMOS transistors, e.g., p-type MFCNS devices.

Appropriate wells (not shown) may be formed in the substrate 50. For example, a P well may be formed in the region 50N, and an N well may be formed in the region 50P. In the embodiments with different well types, the different implant steps for the region 50N and the region 50P may be achieved using a photoresist or other masks (not shown). For example, a photoresist may be formed over the substrate 50 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P to form the N well, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over substrate 50 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N to form the P well, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 3:
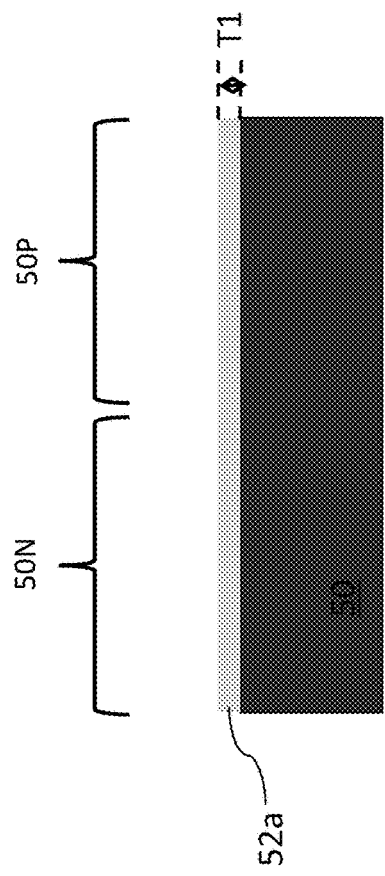
Figure 5B:
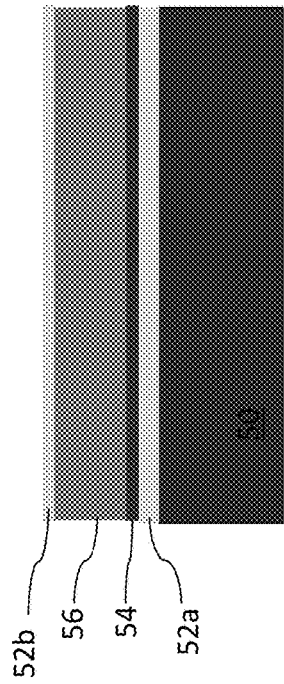
Figure 5D:
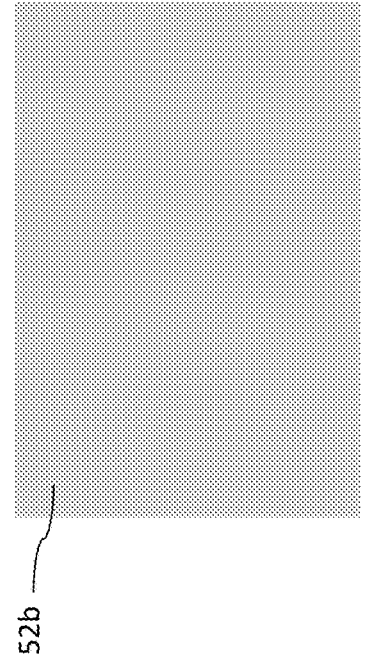
Figure 5A:
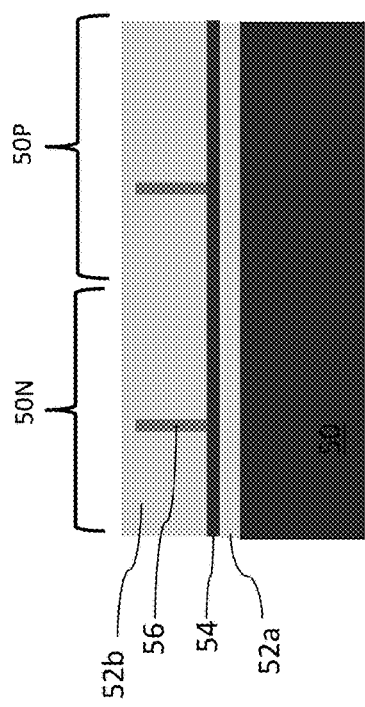
Figure 5C:
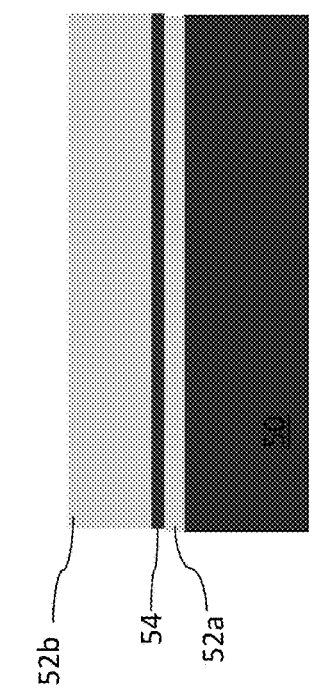
Figure 6A:
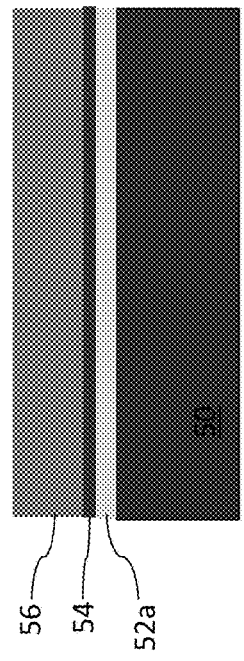
Figure 6B:
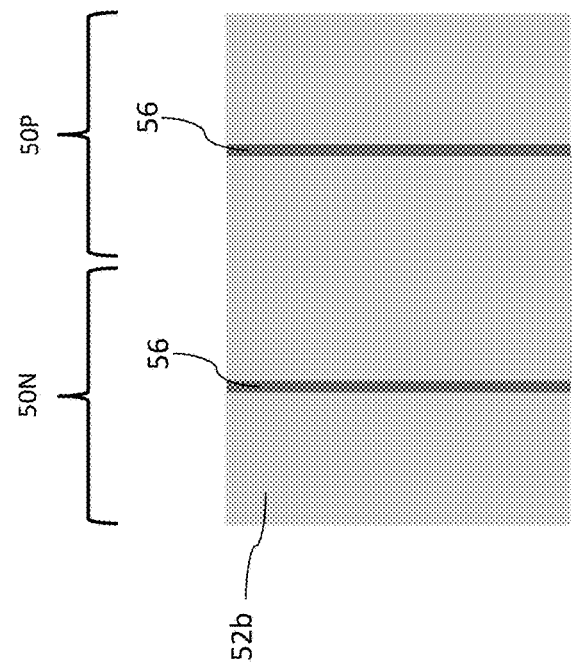
Figure 6C:
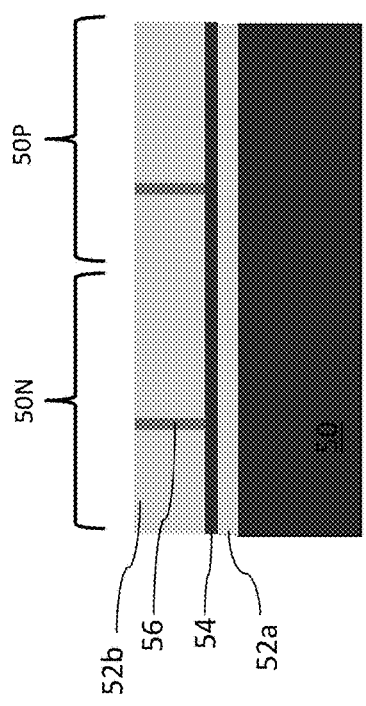
Figure 6D:
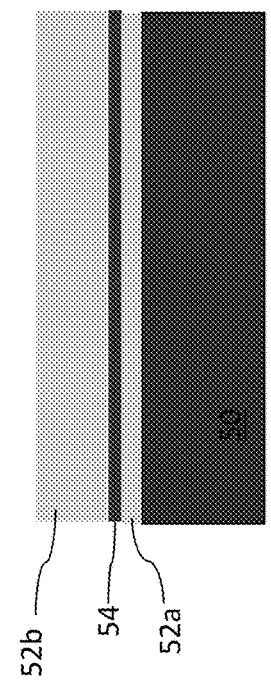

In FIG. 3, a first sacrificial layer 52a is formed on the substrate 50. In some embodiments, the first sacrificial layer 52a is epitaxially grown on the substrate 50. The epitaxial growth can use CVD, MOCVD, MBE, LPE, VPE, UHVCVD, or the like, or a combination thereof. The first sacrificial layer 52a is a semiconductor material that acts as a seed layer for a subsequent epitaxial growth process for forming a material from which a channel region is to be formed. In some embodiments, the first sacrificial layer 52a comprises a group IV material, such as SiGe, Si, Ge, SiGeSn, SiC or the like; a group III-group V compound material, such as GaAs, GaP, GaAsP, AlInAs, AlGaAs, GaInAs, InAs, GaInP, InP, InSb, GaInAsP or the like. In some embodiments, the first sacrificial layer 52a comprises or is substantially SiGe.

In some embodiments, the material of the first sacrificial layer 52a may be selected to induce a strain in the subsequently deposited channel material, and accordingly, the first sacrificial layer 52a may be selected to have a smaller or larger lattice structure than the subsequently deposited channel material. Further, FIG. 3 illustrates the first sacrificial layer 52a as being a same material in both region 50N and region 50P for illustrative purposes. In some embodiments, the first sacrificial layer 52a may be one material in region 50N and a different material in region 50P to further control the performance characteristics of the different devices.

The first sacrificial layer 52a may have a thickness T1 in a range of about 4 nm to about 15 nm, which may be advantageous for subsequent selective removal of the first sacrificial layer 52a and a following formation of a metal gate. The first sacrificial layer 52a having a thickness T1 less than about 4 nm may be disadvantageous because it will result in a narrower space after a subsequent selective removal of the first sacrificial layer 52a, which may adversely affect the following metal gate formation due to the difficulty of filling the metal gate material into a narrower space of less than about 4 nm. The first sacrificial layer 52a having a thickness T1 greater than about 15 nm may be disadvantageous because it may result in higher capacitance between a subsequently formed source/drain region and metal gate, which may degrade the device performance.

In FIG. 4A, a first sheet layer 54 and first fins 56 extending from the first sheet layer 54 are formed on the first sacrificial layer 52a. As will be explained in greater detail below, the first sheet layer 54 and the first fins 56 will be subsequently patterned to act as part of channel regions of transistors. FIG. 4B is a cross-sectional view illustrated along cross-section B-B' through first fin 56 as shown in FIG. 4A. FIG. 4C is a cross-sectional view illustrated along cross-section C-C' adjacent and parallel to first fins 56 as shown in FIG. 4A. FIG. 4D is a plan view illustrated from above looking directly down at the structure shown in FIGS. 4A, 4B, and 4C.

As illustrated in FIGS. 4A-4D, the first sheet layer 54 is formed on the first sacrificial layer 52a. In some embodiments, the first sheet layer 54 is epitaxially grown on the first sacrificial layer 52a. The first sheet layer 54 is a semiconductor material, for example a crystalline material such as a group IV material (e.g., Si, Ge, SiGe, SiGeSn, SiC or the like); a group III-group V compound material (e.g., GaAs, GaP, GaAsP, AlInAs, AlGaAs, GaInAs, InAs, GaInP, InP, InSb, GaInAsP or the like); or the like. In some embodiments, the first sacrificial layer 52a comprises or is substantially SiGe and the first sheet layer 54 comprises or is substantially Si. The first sheet layer 54 may have an initial thickness T2 in a range of about 4 nm to about 12 nm chosen to target a final thickness after induced loss from subsequent processes of about 3 nm to about 10 nm, such as about 4 nm to about 7 nm, which may be advantageous for device performance. The first sheet layer 54 having an initial thickness T2 less than about 4 nm may be disadvantageous because the first sheet layer 54 will form part of the channel region and having a final thickness less than about 3 nm may lead to worse on current ($I_{on}$) performance, which may cause degradation of device performance. The first sheet layer 54 having an initial thickness T2 greater than about 12 nm may be disadvantageous because the first sheet layer 54 will form part of the channel region and having a final thickness greater than about 10 nm may lead to worse device leakage performance due to drain-induced barrier lowering (DIBL) and/or subthreshold swing degradation.

FIGS. 4A-4D further illustrate the first fins 56 extending from the first sheet layer 54 in the regions 50N and 50P. The first fins 56 may be formed to have heights FH1 in a range of about 20 nm to about 70 nm, which may be advantageous for device performance improvement and tuning or tradeoff of $I_{on}$ and capacitance. The first fins 56 having a height FH1 less than about 20 nm may be disadvantageous because smaller fin height may result in less width of the channel region and resulting lower $I_{on}$ performance. The first fins 56 having a height FH1 greater than about 70 nm may be disadvantageous because it may lead to worse (higher) capacitance between gate and source/drain regions and impact both device performance and power consumption. The first fins 56 may be formed to have initial fin widths FW1 in a range of 4 nm to about 12 nm chosen to target a final thickness after induced loss from subsequent processes of about 3 nm to about 10 nm, such as about 4 nm to about 7 nm, which may be advantageous for device performance. The first fins 56 having an initial fin width FW1 less than about 4 nm may be disadvantageous because the first fins 56 will form part of the channel region and having a final thickness less than about 3 nm may lead to worse on current ($I_{on}$) performance, which may cause degradation of device performance. The first fins 56 having an initial fin width FW1 greater than about 12 nm may be disadvantageous because the first fins 56 will form part of the channel region and having a final thickness greater than about 10 nm may lead to worse device leakage performance due to drain-induced barrier lowering (DIBL) and/or subthreshold swing degradation.

In some embodiments, the first fins 56 are formed from the same material as the first sheet layer 54 using the same process. For example, a thick layer is epitaxially grown on the first sacrificial layer 52a to a thickness in a range of about 10 nm to about 70 nm. The thick layer is then etched or otherwise patterned to form the first sheet layer 54 and the first fins 56 as illustrated in FIG. 4A by any suitable method. For example, the first fins 56 may be patterned using one or more photolithography processes, including EUV direct definition, double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the thick layer and patterned using a photolithography process. Spacers are formed alongside the patterned sacrificial layer using a self-aligned process. The sacrificial layer is then removed, and the remaining spacers may then be used to pattern the thick layer to form the first fins 56. The etching process may be timed such that the first sheet layer 54 remains from the thick layer. The thickness of the first sheet layer 54 may be controlled by using measurement of the thickness of the first sheet layer 54 (the thick layer) prior to formation of the first fins 56 and feedback to the etching process in order to target the desired thickness of the first sheet layer 54 and height of the first fins 56.

The process described with respect to FIGS. 4A-4D is just one example of how the first fins 56 may be formed, and in some embodiments, other processes may be utilized, such as using a patterned mask to form the first fins 56. For example, first an epitaxial growth process may be used to form the first sheet layer 54 to the desired thickness, and subsequently, a masking layer (e.g., a dielectric layer) can be formed and patterned over a top surface of the first sheet layer 54, wherein trenches in the masking layer define the pattern of the first fins 56. The first fins 56 can then be epitaxially grown in the trenches, and the masking layer can be removed. The first fins 56 may be the same material as the first sheet layer 54 or one or more different materials than the first sheet layer 54.

In FIGS. 5A-5D, a second sacrificial layer 52b is formed over the first sheet layer 54 and the first fins 56. In some embodiments, the second sacrificial layer 52b is epitaxially grown using a substantially similar process and substantially similar materials as used to form the first sacrificial layer 52a, as described above with respect to FIG. 3.

In FIGS. 6A-6D, a top portion of the second sacrificial layer 52b is removed to expose top surfaces of the first fins 56. In some embodiments, the second sacrificial layer 52b is formed to a depth greater than a height of the first fins or such that an upper surface of the first fins 56 is covered. As illustrated in FIGS. 6A-6D, the top portion of the second sacrificial layer 52b may be removed by, for example, a planarization process such as a chemical mechanical polish (CMP), to expose an upper surface of the first fins.

In FIGS. 7A-7D, a second sheet layer 58 is formed on the second sacrificial layer 52b and on top surfaces of the first fins 56. The second sheet layer 58, together with the first fins 56 and the first sheet layer 54, will be subsequently patterned to form a channel region of a transistor. In some embodiments, the second sheet layer 58 is epitaxially grown using a substantially similar process and substantially similar materials as used to form the first sheet layer 54 and/or the first fins 56, as described above with respect to FIGS. 4A-4D, although in some embodiments the second sheet layer 58 may comprise different materials than the first sheet layer 54 and/or the first fins 56. In some embodiments, the second sheet layer 58 is planarized by a CMP after being epitaxially grown in order to achieve a desired thickness. The second sheet layer 58 may have a thickness T2 substantially similar to the thickness T2 of the first sheet layer 54.

In some embodiments, the first sheet layer 54, the first fins 56, and the second sheet layer 58 are doped in situ during the epitaxial growth or by implantation after the epitaxial growth. In embodiments in which the first sheet layer 54, the first fins 56, and the second sheet layer 58 are doped in situ, the materials in the region 50N and region 50P may be grown separately. In some embodiments, the first sheet layer 54, the first fins 56, and the second sheet layer 58 in region 50N may be doped with boron to a concentration in a range of about $1\times10^{16}$ cm$^{-3}$ to about $1\times10^{18}$ cm$^{-3}$, and the first sheet layer 54, the first fins 56, and the second sheet layer 58 in region 50P may be doped with phosphorus to a concentration in a range of about $1\times10^{16}$ cm$^{-3}$ to about $1\times10^{18}$ cm$^{-3}$. Additionally, the first sheet layer 54, the first fins 56, and/or the second sheet layer 58 may be a gradient layer having a varying concentration of elements and/or doping levels.

The processes described above form a homoepitaxial structure. In some embodiments, heteroepitaxial structures can be used for the first fins 56. For example, the first fins 56 illustrated above in FIGS. 6A, 6B, and 6D can be recessed, and a material different from the first fins 56 may be epitaxially grown over the recessed first fins 56. In such embodiments, the first fins 56 comprise the recessed material as well as the epitaxially grown material disposed over the recessed material. In an even further embodiment, a dielectric layer can be formed over a top surface of the first sheet layer 54, and trenches can be etched through the dielectric layer. Heteroepitaxial structures can then be epitaxially grown in the trenches using a material different from the first sheet layer 54, and the dielectric layer can be recessed such that the heteroepitaxial structures protrude from the dielectric layer to form the first fins 56.

Figure 8B:
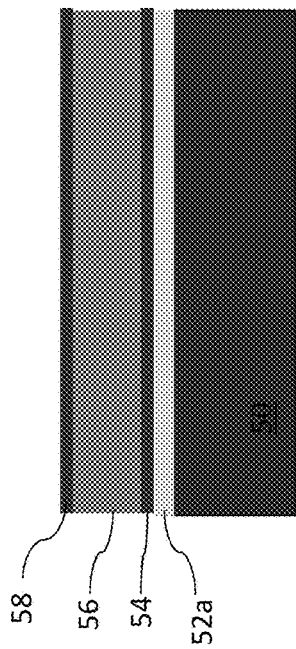
Figure 8D:
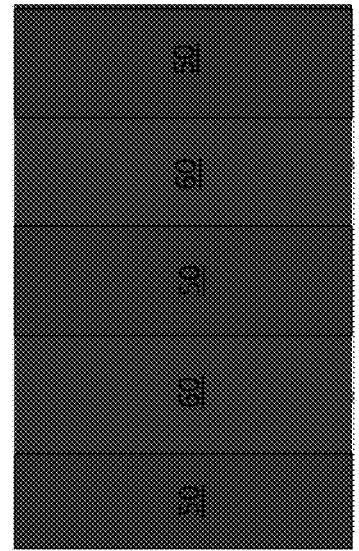

In FIGS. 8A-8D, the first sacrificial layer 52a, the first sheet layer 54, the first fins 56, the second sacrificial layer 52b, and the second sheet layer 58 are patterned to form second fins 60. The second sheet layer 58 forms the top surfaces of the second fins 60 as illustrated in FIG. 8D.

Figure 8A:
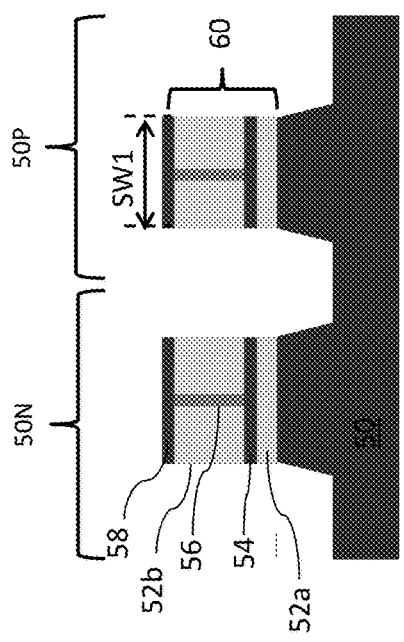
Figure 8C:
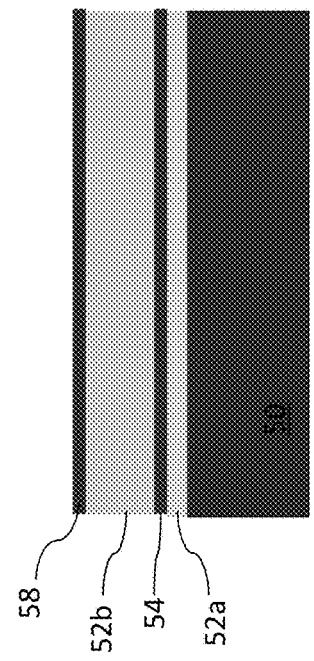

The second fins 60 may be patterned by any suitable method. For example, the fins may be patterned using one or more photolithography processes, including double-patterning or multi-patterning processes and one or more etching processes. For example, a masking layer (not shown) may be formed and patterned over the second sheet layer 58 as illustrated in FIGS. 7A-7D, and one or more etching processes may be performed to etch through the second sheet layer 58, the second sacrificial layer 52b, the first fins 56, the first sheet layer 54 and the first sacrificial layer sea. In some embodiments, trenches may be formed in the substrate 50 adjacent the second fins as illustrated in FIG. 8A. The etching processes may be any suitable etch process, such as wet etch, a reactive ion etch (RIE), neutral beam etch (NBE), the like, or a combination thereof. The etch may be anisotropic.

The second fins 60 may be formed to have sheet widths SW1 measured between opposite sidewalls of the second fins 60 in a range of about 10 nm to about 70 nm, which may be advantageous for device performance and device size optimization. The second fins 60 having a sheet width SW1 less than about 10 nm may be disadvantageous because less width may result in weaker $I_{on}$ performance. The second fins 60 having a sheet width SW1 greater than about 70 nm may be disadvantageous because it may exceed the device area constraint of the design.

Figure 9B:
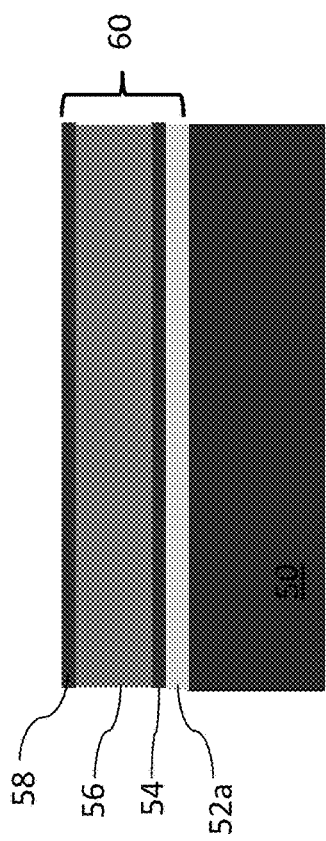
Figure 9A:
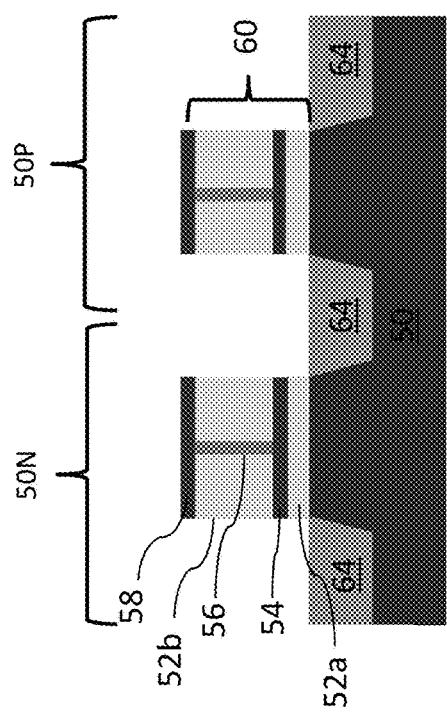
Figure 9C:
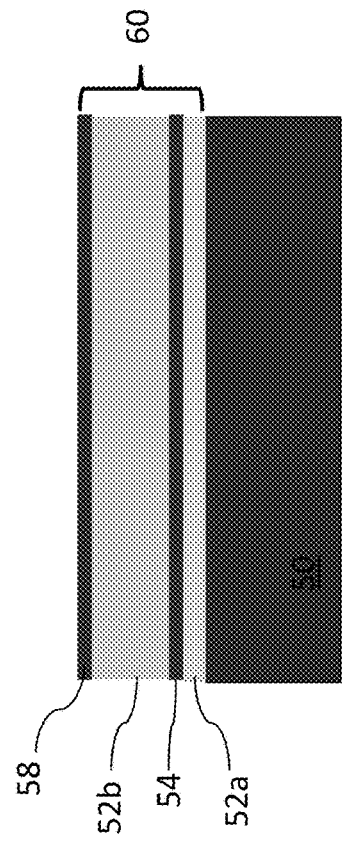
Figure 9E:
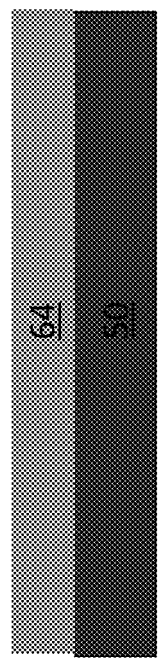
Figure 9D:
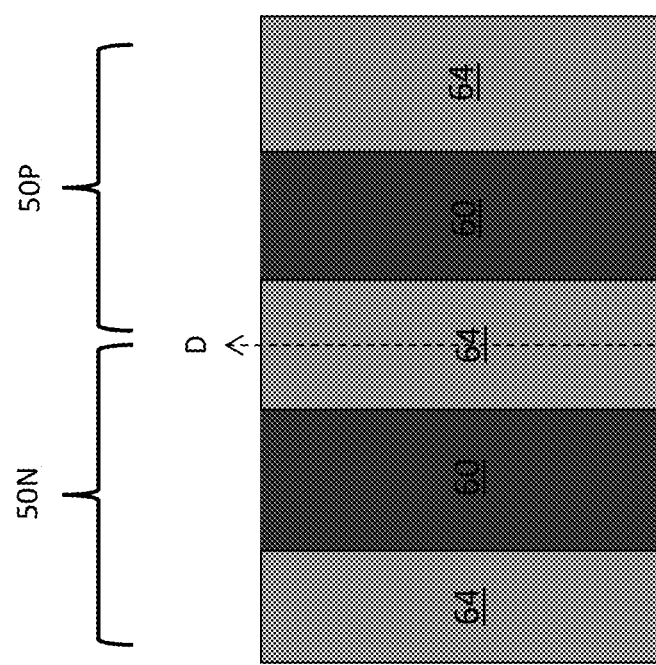
Figure 10B:
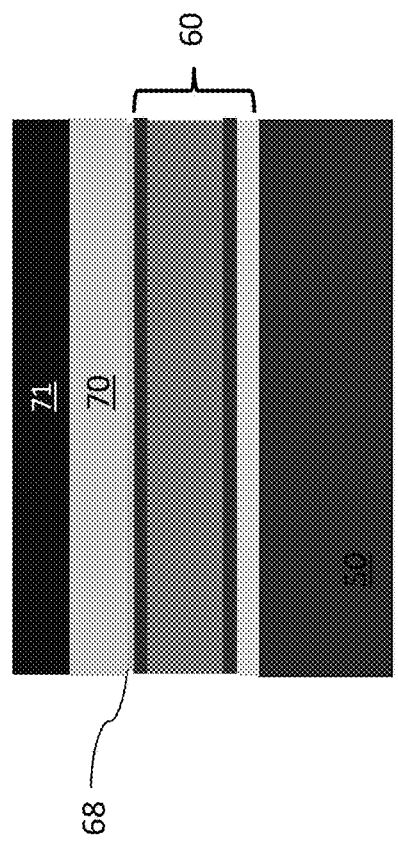
Figure 10A:
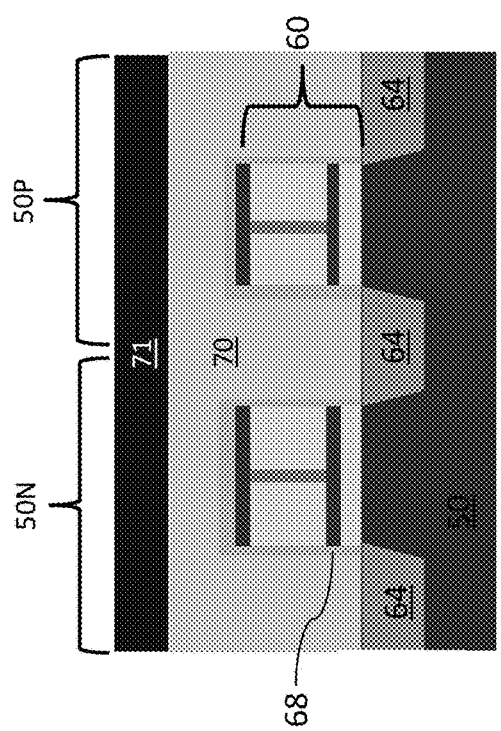
Figure 10C:
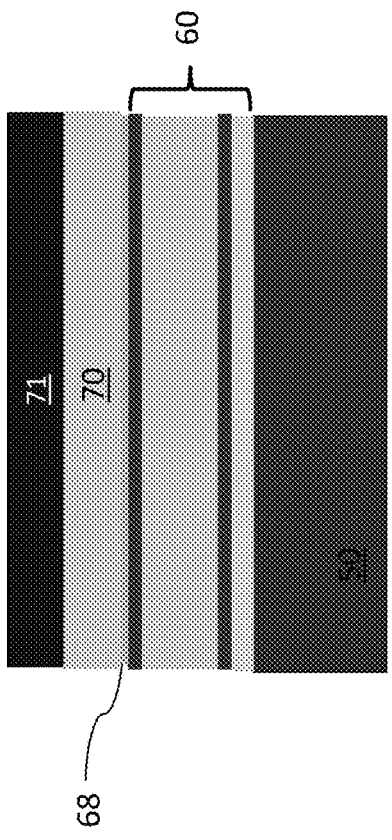
Figure 10E:
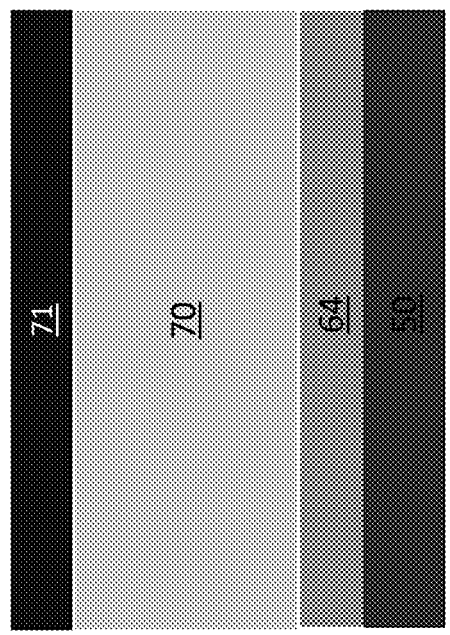
Figure 10D:
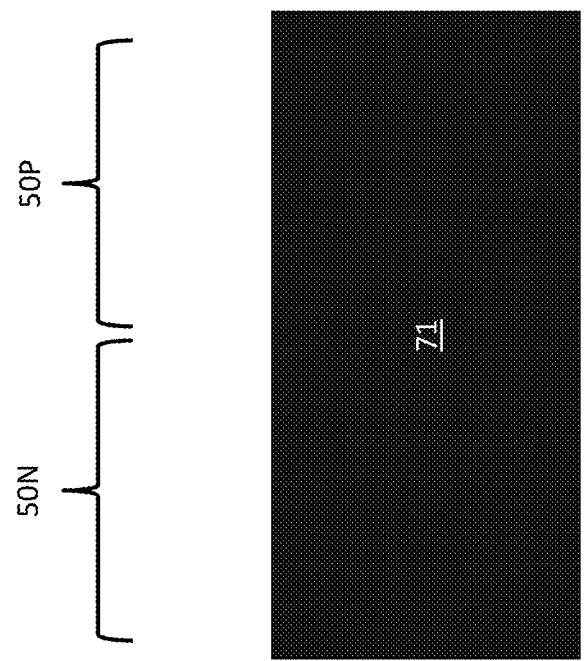
Figure 11B:
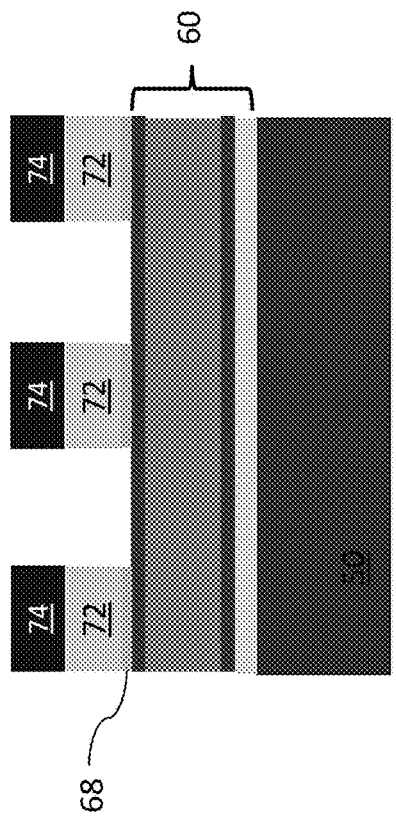
Figure 11C:
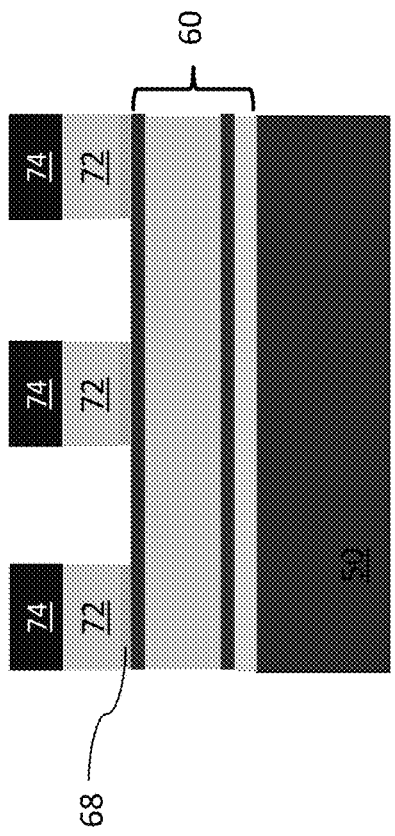
Figure 11A:
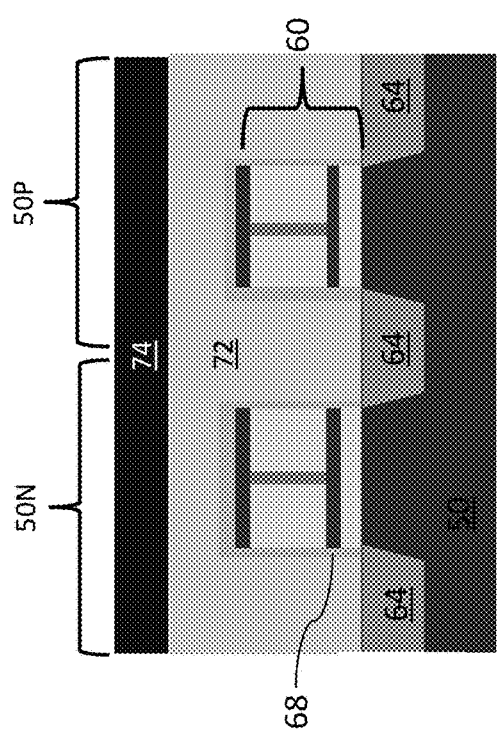
Figure 11E:
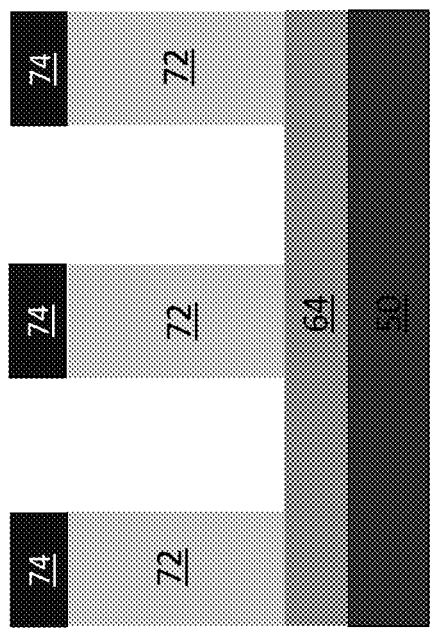
Figure 11D:
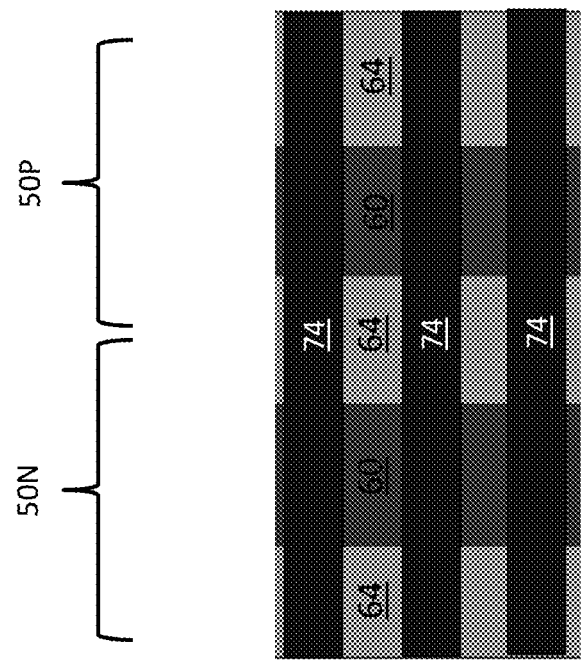
Figures 12D, 12E:
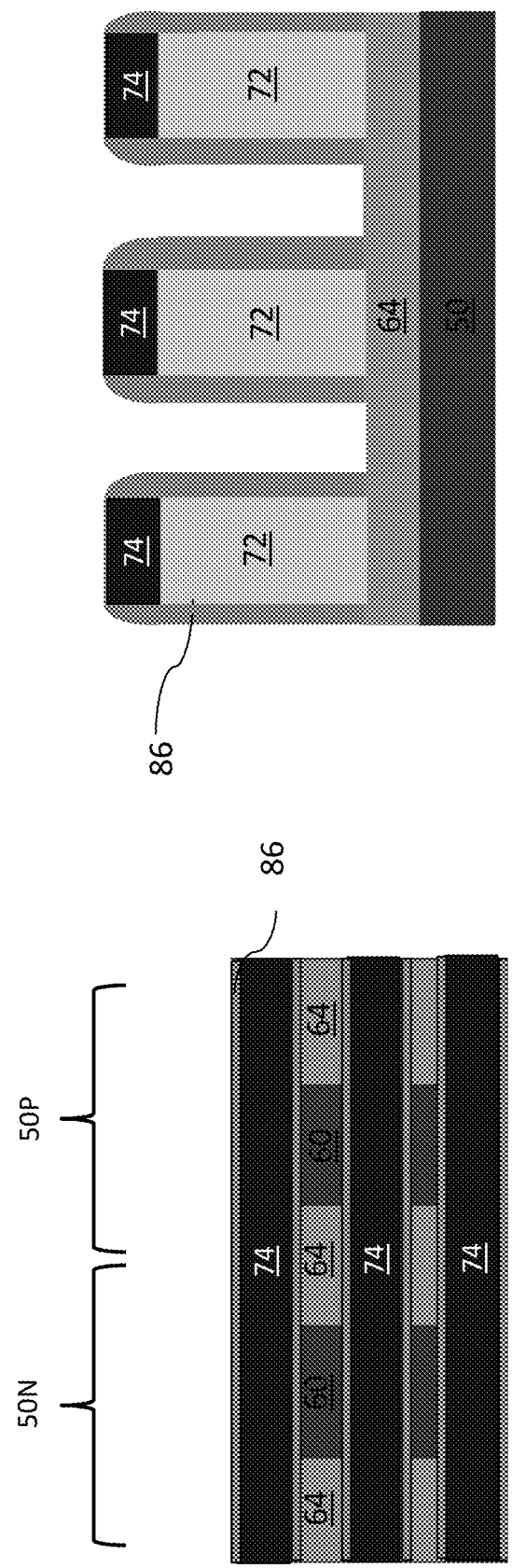

In FIGS. 9A-9E, Shallow Trench Isolation (STI) regions 64 are formed over the substrate 50 and between neighboring second fins 60. FIG. 9E is a cross-sectional view illustrated along cross-section D-D' as shown in FIG. 9D. FIG. 9E and following figures illustrated along cross-section D-D' show a cross-sectional view through the STI region 64. In some embodiments, the STI regions 64 are formed by forming an insulation material in trenches between the neighboring second fins 60 and then recessing the insulated material. The STI regions 64 comprise one or more insulation materials, such as an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to convert it to another material, such as an oxide), the like, or a combination thereof. Other insulation materials formed by any acceptable process may be used. In some embodiments, the insulation material is silicon oxide formed by a FCVD process. An anneal process may be performed once the insulation material is formed. Although the insulation material of the STI regions 64 is illustrated as a single layer, some embodiments may utilize multiple layers. For example, in some embodiments a liner (not shown) may first be formed along a surface of the substrate 50 and the second fins 60. Thereafter, a fill material, such as those discussed above may be formed over the liner.

In some embodiments, the insulation material is initially formed such that the insulation materials completely fill the trenches and cover the second fins 60. As illustrated in FIGS. 9A-9E, the insulation material may be recessed such that the second fins 60 protrude above an upper surface of the STI regions 64 using a planarization process such as a chemical mechanical polish (CMP), an etch-back process, combinations thereof, or the like. For example, a planarization process may be performed to expose upper surfaces of the second fins 60. In embodiments in which a mask remains on the second fins 60, the planarization process may expose the mask or remove the mask such that top surfaces of the mask or the second fins 60, respectively, and the insulation material are substantially level after the planarization process is complete.

After the planarization process, the insulation material may be recessed to form Shallow Trench Isolation (STI) regions 64 as illustrated in FIGS. 9A-9E. The insulation material is recessed such that upper portions of second fins 60 in the region 50N and in the region 50P protrude from between neighboring STI regions 64. Further, the top surfaces of the STI regions 64 may have a flat surface as illustrated, a convex surface, a concave surface (such as dishing), or a combination thereof. The top surfaces of the STI regions 64 may be formed flat, convex, and/or concave by an appropriate etch. The STI regions 64 may be recessed using an acceptable etching process, such as one that is selective to the material of the insulation material (e.g., etches the material of the insulation material at a faster rate than the material of the second fins 60, the first sacrificial layer 52a, or the second sacrificial layer 52b). For example, an oxide removal using, for example, dilute hydrofluoric (dHF) acid may be used.

In FIGS. 10A-10E, a dummy dielectric layer 68 and dummy gate layer 70 are formed over the second fins 60. The dummy dielectric layer 68 and the dummy gate layer 70 will be patterned to form a dummy gate structure to aid in the formation of the source/drain regions. The dummy dielectric layer 68 may be, for example, silicon oxide, silicon nitride, a combination thereof, or the like, and may be deposited or thermally grown according to acceptable techniques. A dummy gate layer 70 is formed over the dummy dielectric layer 68, and a mask layer 71 is formed over the dummy gate layer 70. The dummy gate layer 70 may be deposited over the dummy dielectric layer 68 and then planarized, such as by a CMP. The dummy gate layer 70 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 70 may be deposited by physical vapor deposition (PVD), CVD, sputter deposition, or other suitable techniques for depositing the selected material. The dummy gate layer 70 may be made of other materials that have a high etching selectivity from the etching of isolation regions and/or the dummy dielectric layer 68. The mask layer 71 may include, for example, silicon nitride, silicon oxynitride, or the like having a high etch selectivity to the materials of the dummy gate layer 70.

It is noted that the dummy dielectric layer 68 is shown covering only the second fins 60 for illustrative purposes only. In some embodiments, the dummy dielectric layer 68 may be deposited such that the dummy dielectric layer 68 covers the STI regions 64, extending between the dummy gate layer 70 and the STI regions 64.

In FIGS. 11A-11E, the mask layer 71 (see FIGS. 10A-10E) may be patterned using acceptable photolithography and etching techniques to form masks 74. The pattern of the masks 74 then may be transferred to the dummy gate layer 70 to form dummy gates 72. In some embodiments, the pattern of the masks 74 may also be transferred to the dummy dielectric layer 68 by an acceptable etching technique. The dummy gates 72 cover respective channel regions of the second fins 60. The dummy gates 72 may have a lengthwise direction substantially perpendicular to the lengthwise direction of the respective second fins 60.

In FIGS. 12A-12E, top spacers 86 and lightly doped source/drain (LDD) regions may be formed along sidewalls of the dummy gates 72 and the masks 74. Although illustrated as a single layer, the top spacers 86 may comprise one or more spacers. For example, in some embodiments a first spacer (e.g., gate seal spacers, not individually shown) is formed along exposed surfaces of the dummy gates 72, the masks 74, and/or the second fins 60. A thermal oxidation or a deposition followed by an anisotropic etch may form the gate seal spacers. The gate seal spacers may be formed of silicon oxide, silicon nitride, silicon oxynitride, or the like.

After the formation of the gate seal spacers, implants for lightly doped source/drain (LDD) regions (not explicitly illustrated) may be performed. In the embodiments with different device types (e.g., NMOS and PMOS devices), similar to the implants discussed above in FIG. 9A, a mask, such as a photoresist, may be formed over the region 50N, while exposing the region 50P, and appropriate type (e.g., p-type) impurities may be implanted into the exposed second fins 60 in the region 50P. The mask may then be removed. Subsequently, a mask, such as a photoresist, may be formed over the region 50P while exposing the region 50N, and appropriate type impurities (e.g., n-type) may be implanted into the exposed second fins 60 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Second spacers (not individually shown) may then be formed adjacent to the gate seal spacers by conformally depositing an insulating material, such as silicon oxide ($SiO_2$), silicon nitride ($Si_3N_4$), carbon doped oxide, nitrogen doped oxide, porous oxide, air gaps, a combination thereof, or the like, and subsequently anisotropically etching the insulating material. The insulating material of the outer portions of the top spacers 86 may be silicon oxide ($SiO_2$), silicon nitride ($Si_3N_4$), carbon doped oxide, nitrogen doped oxide, porous oxide, air gaps, a combination thereof, or the like. The first spacers and the second spacers are collectively referred to as the top spacers 86.

It is noted that the above disclosure generally describes a process of forming spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using a different structures and steps. For example, LDD regions for n-type devices may be formed prior to forming the gate seal spacers while the LDD regions for p-type devices may be formed after forming the gate seal spacers.

Figure 13B:
Figure 13A:
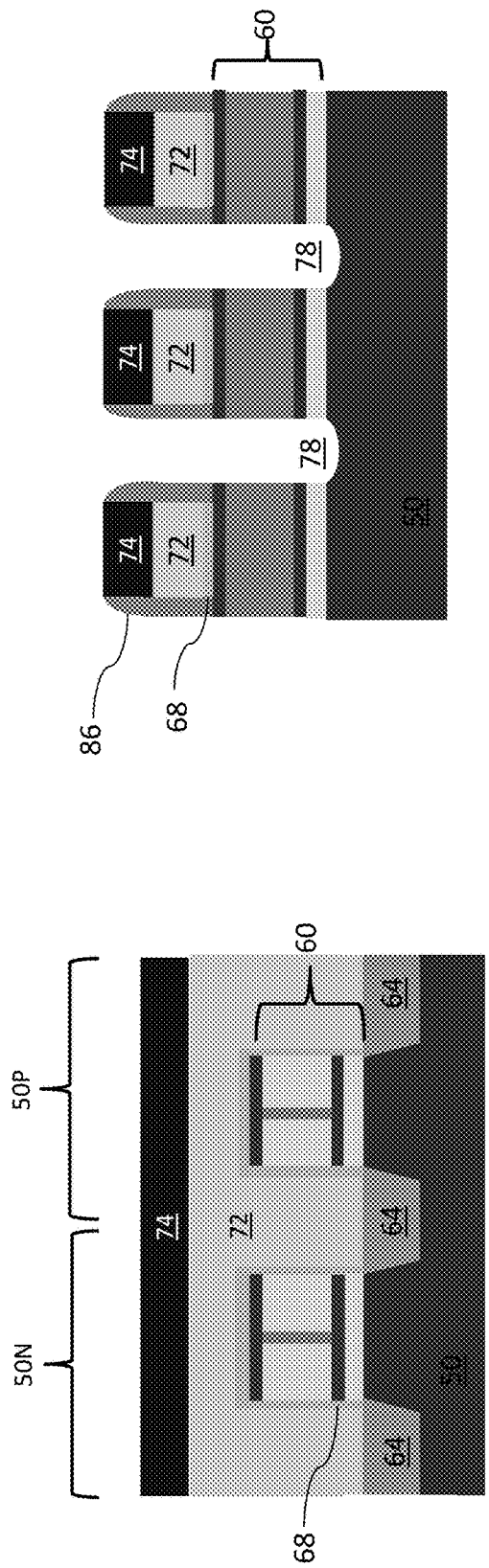
Figure 13C:
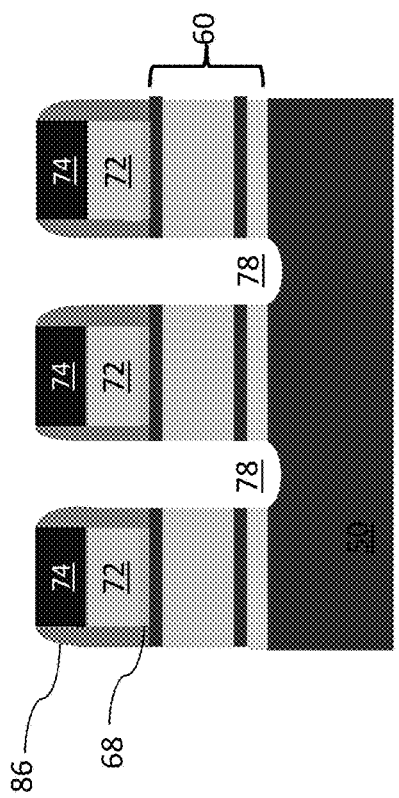
Figures 13D, 13E:
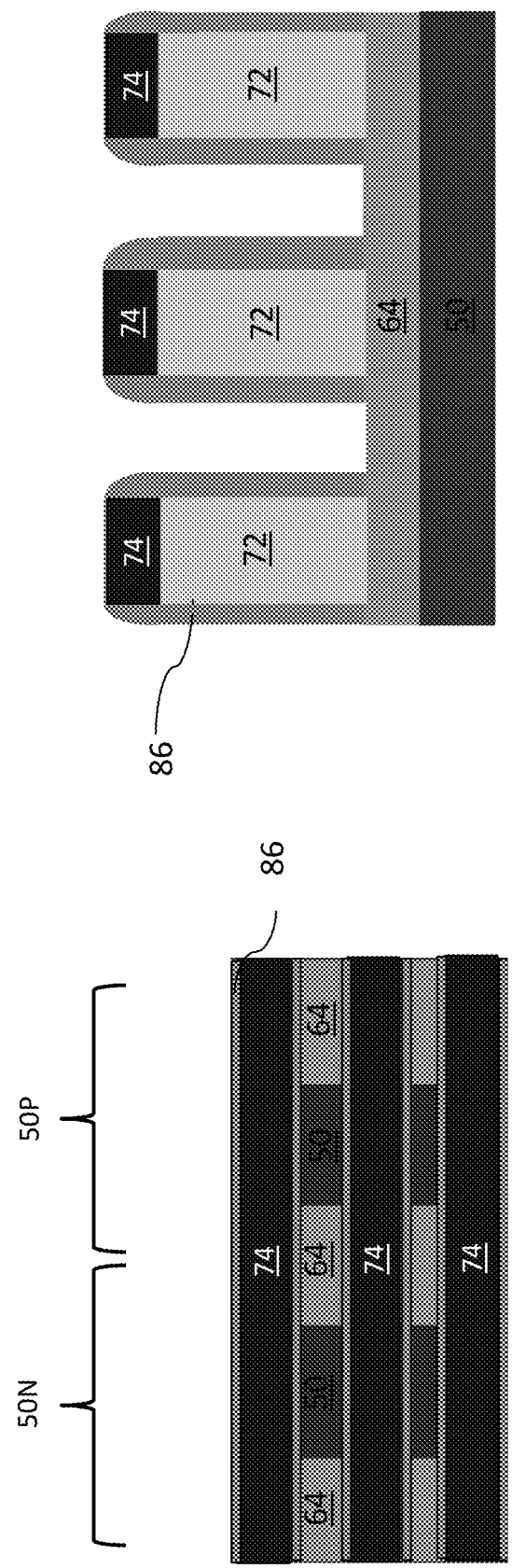
Figure 14A:
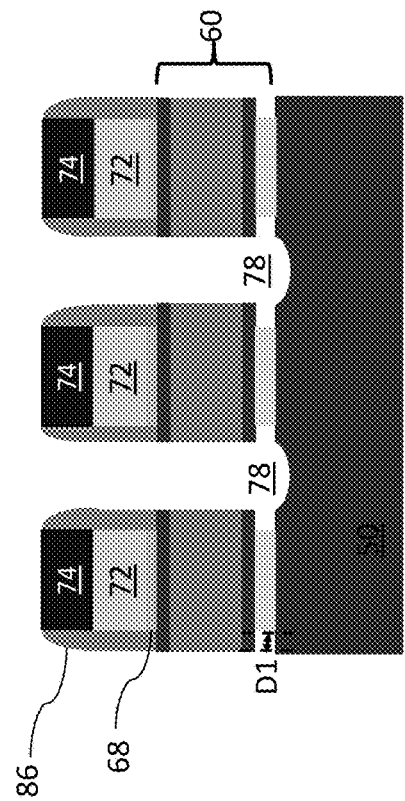
Figure 14B:
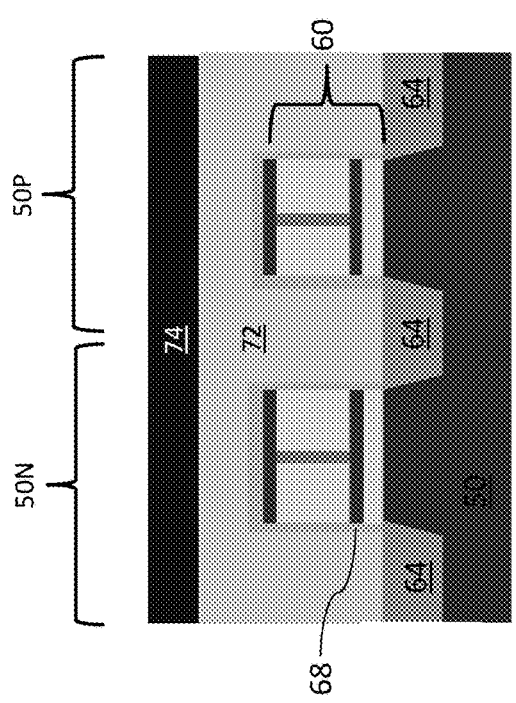
Figure 14C:
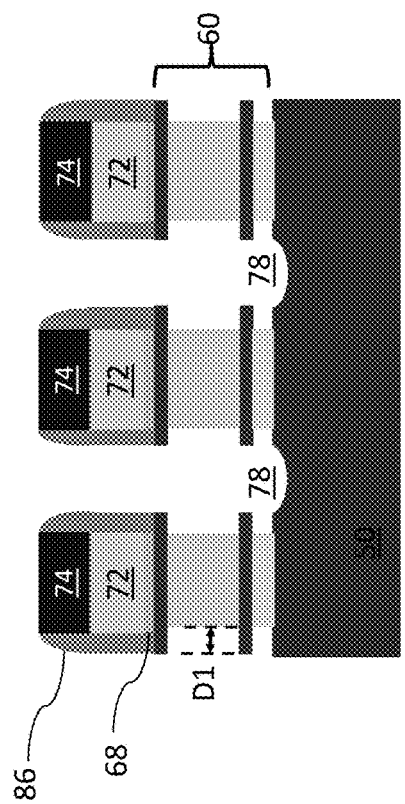
Figure 14E:
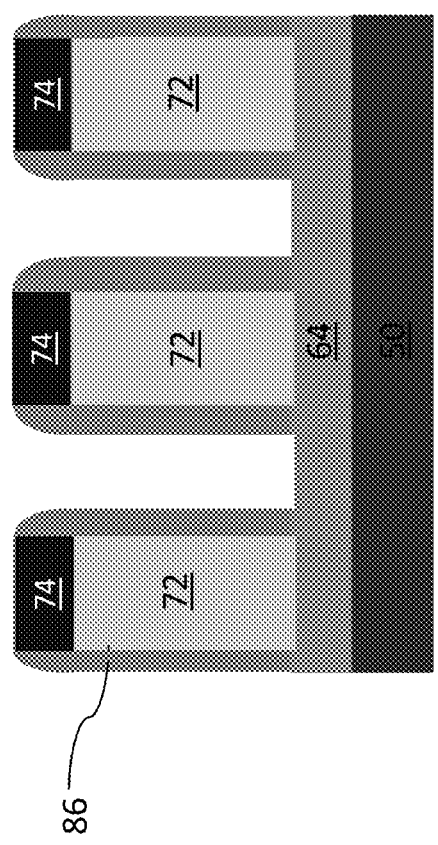
Figure 14D:
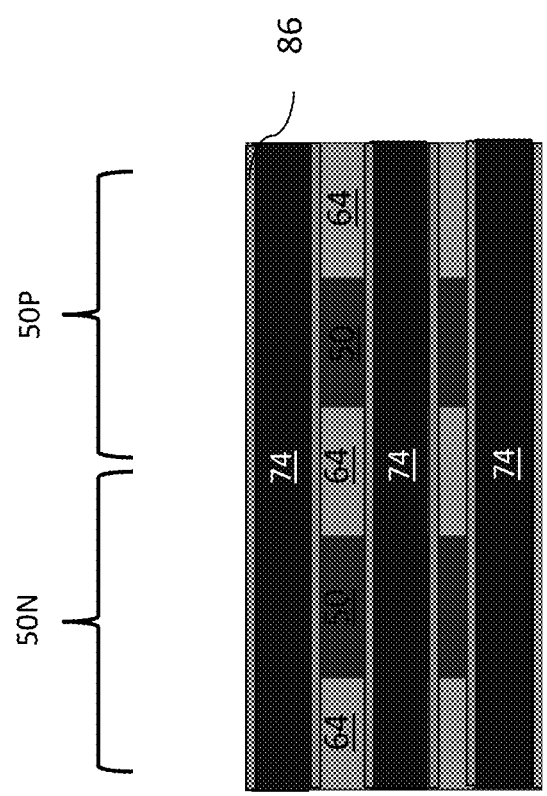

Next, FIGS. 13A-13E illustrate the forming of recesses 78 by performing of an etching process to etch through portions of the second fins 60 in the source/drain regions. As will be discussed in greater detail below, portions of the fins corresponding to source/drain regions are removed and replaced with another semiconductor material having a different lattice structure than the material. By replacing the material of the second fins 60 in the source/drain regions with another material, stress may be placed on the channel region of the second fins 60, thereby improving performance. In some embodiments, the etching process is an anisotropic etch. The formation of the recesses 78 exposes sidewalls of the second fins 60. The etching process may be performed using the dummy gates 72 as an etching mask. As shown in FIGS. 13B and 13C, the etching process may also etch the recesses 78 into the upper surface of substrate 50.

In FIGS. 14A-14E, a lateral selective etching process is performed to laterally recess exposed portions of the first sacrificial layer 52a and the second sacrificial layer 52b. The lateral selective etching process may be performed using an etchant that is selective to the material of the sacrificial layers 52a and 52b (and etching the material of the first sheet layer 54, the first fins 56, and the second sheet layer 58 less). In some embodiments in which the material of the sacrificial layers 52a and 52b is SiGe and the material of the first sheet layer 54, the first fins 56, and the second sheet layer 58 is silicon, the selective removal process may use an etchant that selectively etches the SiGe at a higher rate than the silicon, such as $NH_4OH:H_2O_2:H_2O$ (ammonia peroxide mixture, APM), $H_2SO_4+H_2O_2$ (sulfuric acid peroxide mixture, SPM), or the like, for a process time in a range of about 10 seconds to about 300 seconds. The sacrificial layers 52a and 52b may be laterally recessed a distance D1 in a range of about 4 nm to about 10 nm. Other suitable processes and materials may be used.

Next, in FIGS. 15A-15E, inner spacers 92 are formed to fill the space left by the removal (e.g., recess) of portions of the first sacrificial layer 52a and the second sacrificial layer 52b as discussed above with reference to FIGS. 14A-14E. In some embodiments, a layer of dielectric material is formed over the dummy gates 72. The dielectric material may be a low-κ dielectric material such as a dielectric material based on silicon oxide ($SiO_2$), silicon nitride ($Si_3N_4$), silicon oxynitride (SiON), silicon oxycarbide (SiOC), silicon carbonitride (SiCN), silicon oxycarbonitride (SiOCN), or air gaps, a combination thereof, or the like. The dielectric material may be formed by a suitable deposition method such as, e.g., ALD. In some embodiments, the material of the inner spacers 92 has a lower dielectric constant κ than the insulating material of the top spacers 86. In some embodiments, the material of the inner spacers 92 has a higher dielectric constant κ than the insulating material of the top spacers 86.

Figure 15B:
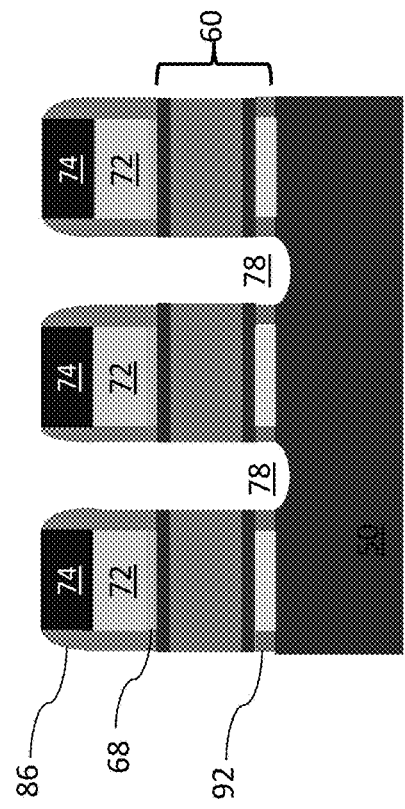
Figure 15A:
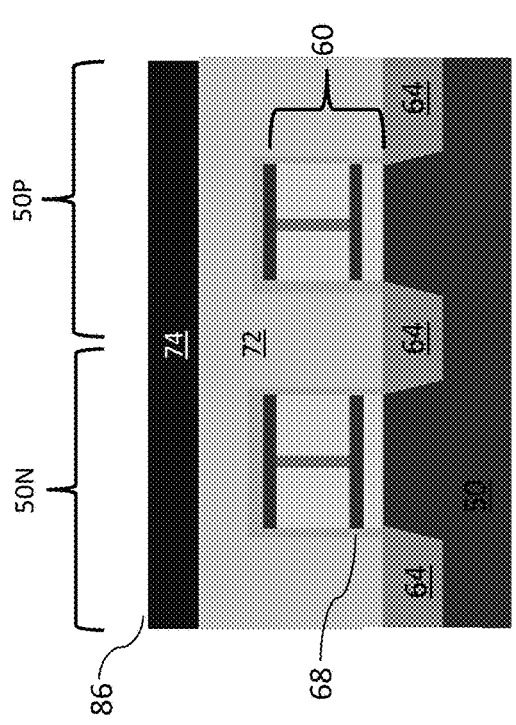
Figure 15C:
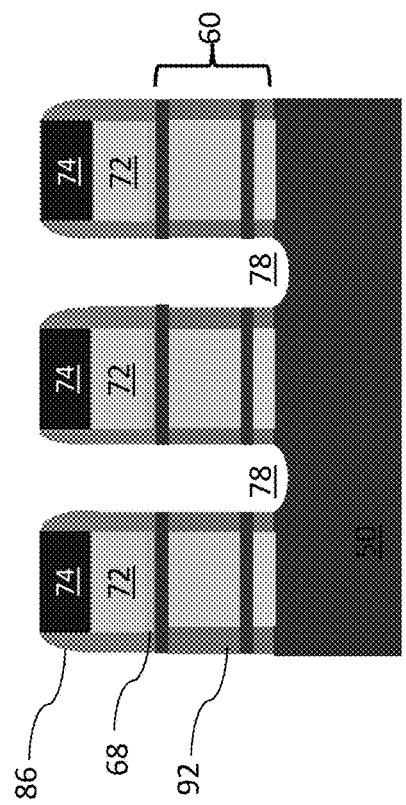
Figure 15E:
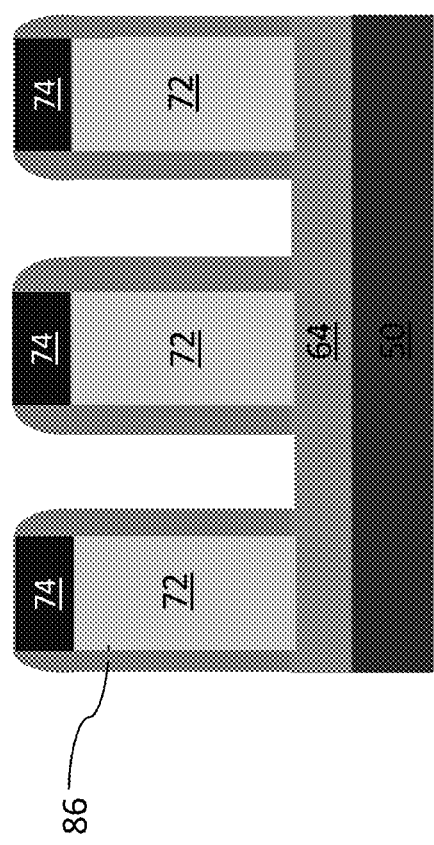
Figure 15D:
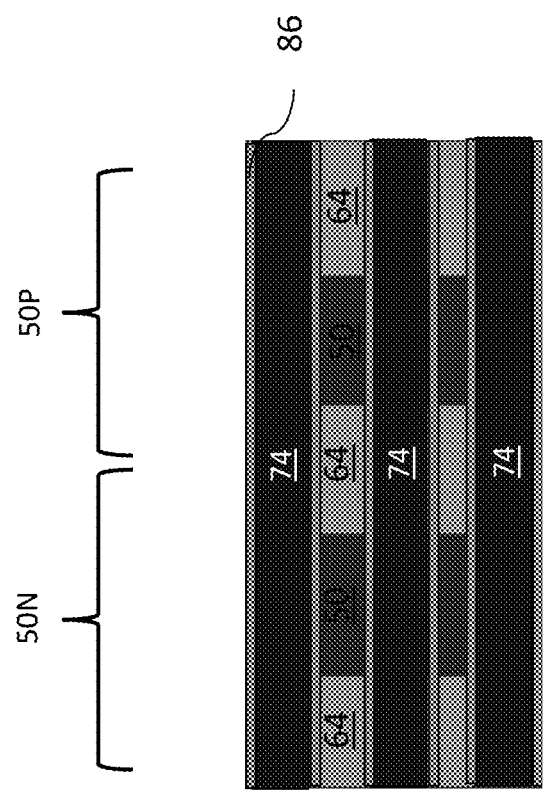

After the deposition of the dielectric material, an anisotropic etching process may be performed to trim the deposited dielectric material, such that portions of the deposited dielectric material that fill the space left by the lateral recessing of portions of the first sacrificial layer 52a and the second sacrificial layer 52b remain. After the trimming process, the remaining portions of the deposited dielectric material form the inner spacers 92. The inner spacers 92 serve to isolate gate structures from source/drain regions formed in subsequent processing. In the example of FIGS. 15B and 15C, sidewalls of the inner spacers 92 are aligned with sidewalls of the second fins 60 and sidewalls of the top spacers 86.

In FIGS. 16A-16E, epitaxial source/drain regions 96 are formed in the recesses 78 to exert stress in the respective channel regions of the second fins 60, thereby improving performance. The epitaxial source/drain regions 96 are formed in the recesses 78 such that each dummy gate 72 is disposed between respective neighboring pairs of the epitaxial source/drain regions 96. In some embodiments, the top spacers 86 are used to separate the epitaxial source/drain regions 96 from the dummy gates 72 by an appropriate lateral distance so that the epitaxial source/drain regions 96 do not short out subsequently formed gates of the resulting MFCNS devices.

Figure 16B:
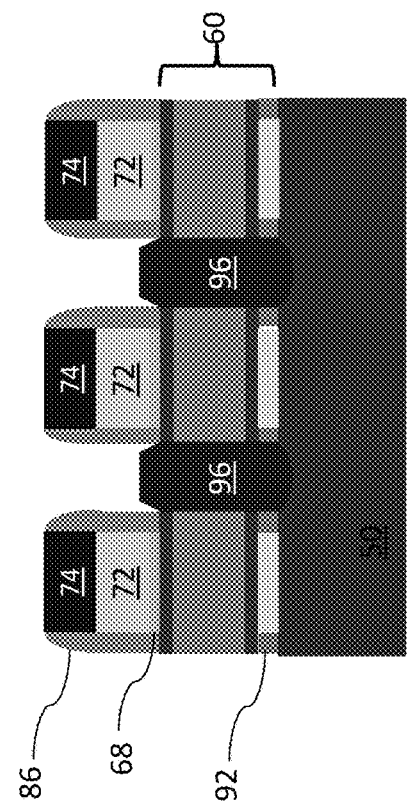
Figure 16A:
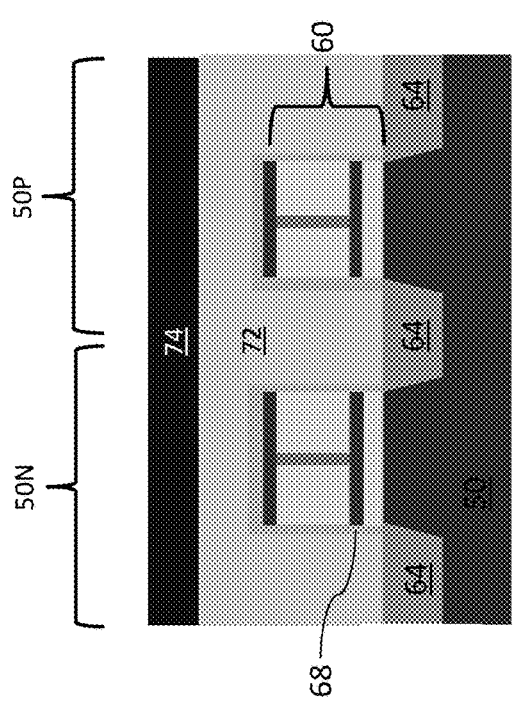
Figure 16C:
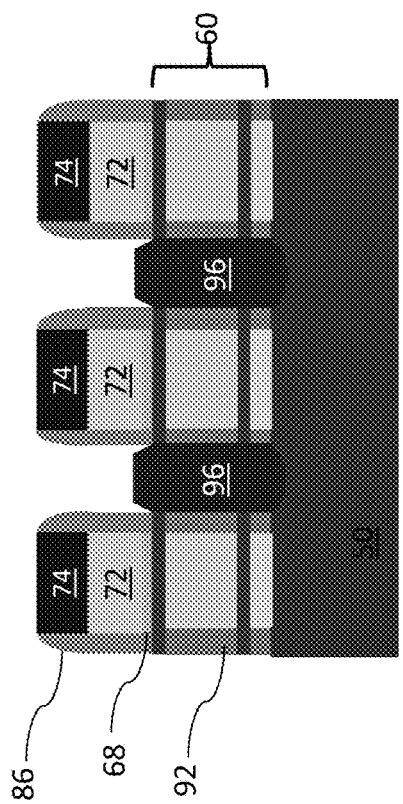
Figure 16E:
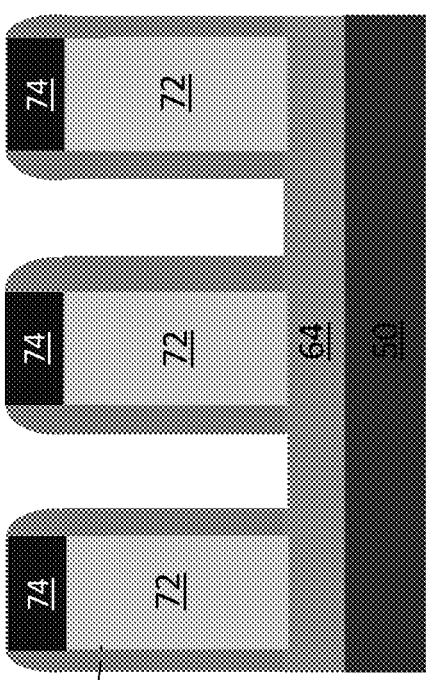

The increased sidewall space provided by the vertical first fins 56 may benefit the epitaxial growth margin of the source/drain regions 96. For example, as illustrated in FIG. 16B, which illustrates a cross-sectional view of one of the first fins 56, end portions of the first sheet layer 52, the second sheet layer 58 and the first fins 56 are exposed. The epitaxial growth of the source/drain regions 96 utilize the exposed end portions of the first sheet layer 52, the second sheet layer 58 and the first fins 56 as a seed layer. The increased area provided by exposed end portion of the vertical first fins 56 creates an increased surface area, thereby providing a larger seed layer for facilitating the epitaxial growth.

The epitaxial source/drain regions 96 in the region 50N, e.g., the NMOS region, may be formed by masking the region 50P, e.g., the PMOS region, and epitaxially growing the epitaxial source/drain regions 96 in the recesses 78 of the region 50N. The epitaxial source/drain regions 96 may include any acceptable material, such as appropriate for n-type MFCNS devices. For example, the epitaxial source/drain regions 96 in the region 50N may comprise materials such as silicon, silicon doped with carbon and/or phosphorus, a combination thereof, or the like. The epitaxial source/drain regions 96 in the region 50N may have surfaces raised from respective surfaces of the second fins 60 and may have facets.

The epitaxial source/drain regions 96 in the region 50P, e.g., the PMOS region, may be formed by masking the region 50N, e.g., the NMOS region, and epitaxially growing the epitaxial source/drain regions 96 in the recesses 78 of the region 50P. The epitaxial source/drain regions 96 may include any acceptable material, such as appropriate for p-type MFCNS devices. For example, the epitaxial source/drain regions 96 in the region 50P may comprise materials such as silicon-germanium, boron doped silicon-germanium, germanium, silicon, germanium tin, a combination thereof, or the like. The epitaxial source/drain regions 96 in the region 50P may also have surfaces raised from respective surfaces of the second fins 60 and may have facets.

The epitaxial source/drain regions 96 may be implanted with dopants similar to the process previously discussed for forming lightly-doped source/drain regions followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed, e.g. carbon and/or phosphorus for n-type impurities and boron for p-type impurities. In some embodiments, the epitaxial source/drain regions 96 may be in situ doped during growth.

Figure 16D:
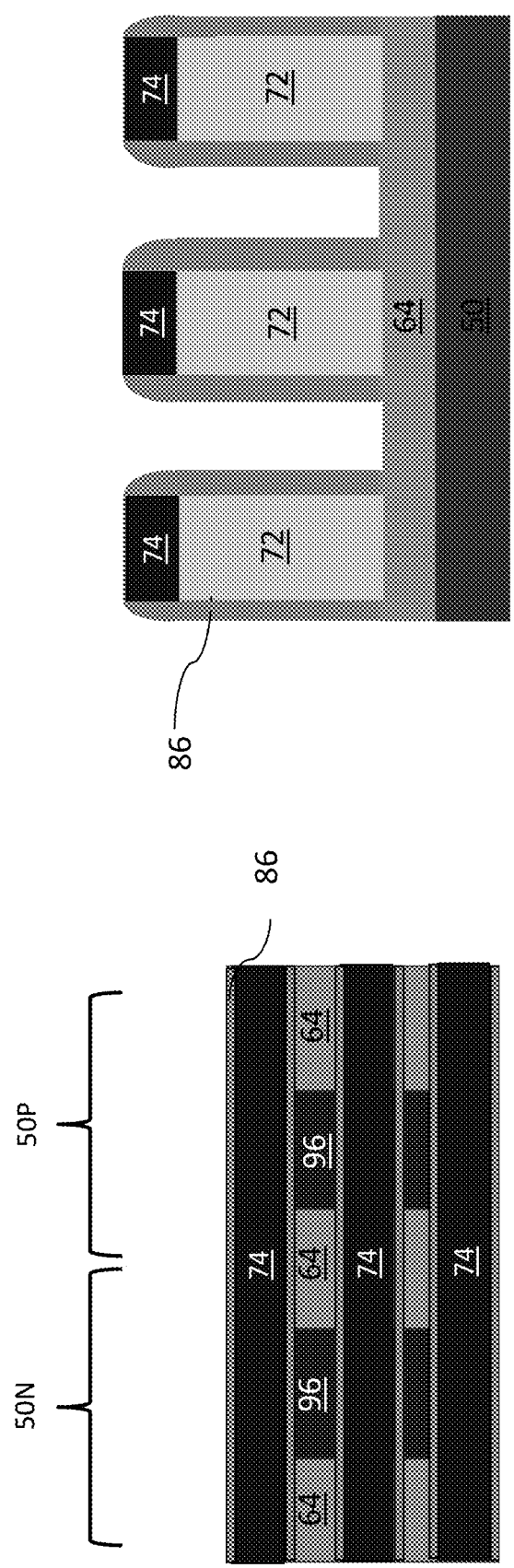
Figure 17E:
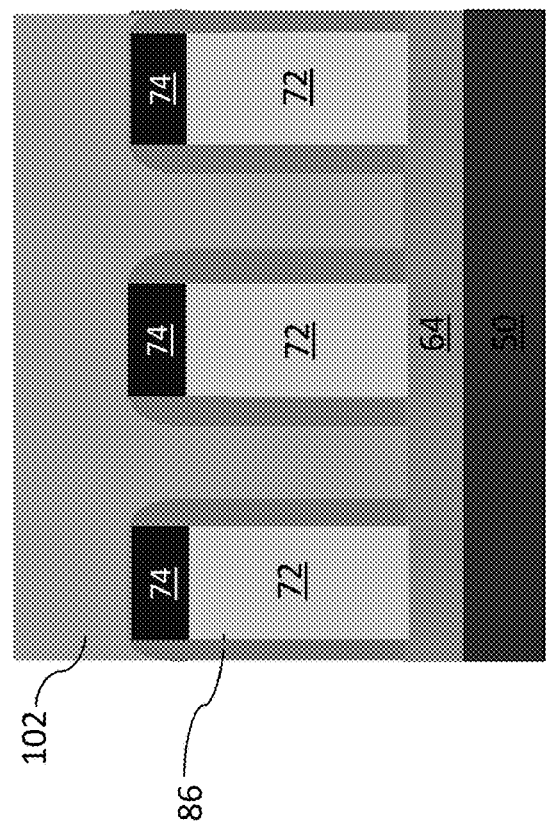
Figure 17D:
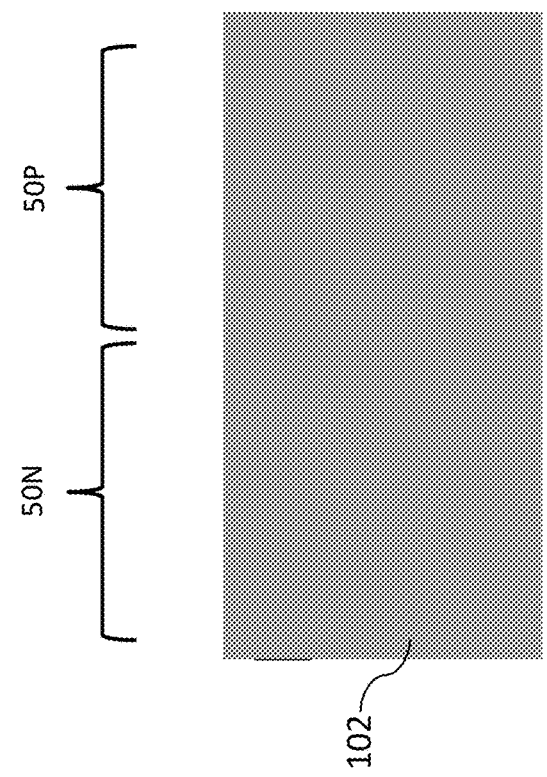

As a result of the epitaxy processes used to form the epitaxial source/drain regions 96 in the region 50N and the region 50P, upper surfaces of the epitaxial source/drain regions have facets which expand laterally outward beyond sidewalls of the second fins 60. In some embodiments, these facets cause adjacent source/drain regions 96 (not shown) of a same MFCNS device to merge. In other embodiments, adjacent source/drain regions 96 remain separated after the epitaxy process is completed as illustrated by FIG. 16D.

In FIGS. 17A-17E, a first interlayer dielectric (ILD) 102 is deposited over the structure illustrated in FIGS. 16A-16E. The first ILD 102 may be formed of a dielectric material, and may be deposited by any suitable method, such as CVD, plasma-enhanced CVD (PECVD), or FCVD. Dielectric materials may include phospho-silicate glass (PSG), borosilicate glass (BSG), boron-doped phospho-silicate glass (BPSG), undoped silicate glass (USG), or the like. Other insulation materials formed by any acceptable process may be used. In some embodiments, a contact etch stop layer (CESL) (not illustrated) is disposed between the first ILD 102 and the epitaxial source/drain regions 96, the masks 74, and the top spacers 86. The CESL may comprise a dielectric material, such as, silicon nitride, silicon oxide, silicon oxynitride, or the like, having a different etch rate than the material of the overlying first ILD 102.

In FIGS. 18A-18E, a planarization process, such as a CMP, may be performed to level the top surface of the first ILD 102 with the top surfaces of the dummy gates 72 or the masks 74. The planarization process may also remove the masks 74 on the dummy gates 72, and portions of the top spacers 86 along sidewalls of the masks 74. After the planarization process, top surfaces of the dummy gates 72, the top spacers 86, and the first ILD 102 are level. Accordingly, the top surfaces of the dummy gates 72 are exposed through the first ILD 102. In some embodiments, the masks 74 may remain, in which case the planarization process levels the top surface of the first ILD 102 with the top surfaces of the top surface of the masks 74.

As further illustrated in FIGS. 18A-18E, in some embodiments, gate end dielectrics 76 may be formed on end sidewalls of the dummy gates 72. The gate end dielectrics 76 may, for example, be used to separate different gate electrodes. For example, in some embodiments the dummy gate 72 may extend over several fins on a substrate or wafer to form multiple transistors. Depending on a desired circuit, these transistors may require different gate electrodes. As such, the gate end dielectrics may be used as an insulating material between the different gate electrodes. As will be discussed below, the remaining portions of the dummy gates 72 will be replaced with conductive active gates, wherein the gate end dielectrics remain to electrically insulate the conductive active gates from shorting together.

The gate end dielectrics 76 may be formed by suitable lithography, patterning, and etching processes to remove portions of the dummy gates 72 or by performing a dummy-gate cut process, thereby forming openings adjacent to or in the dummy gates 72. The gate end dielectrics 76 may then be formed in the respective openings adjacent to the end sidewalls of the dummy gates 72, and may be deposited by any suitable method, such as CVD, plasma-enhanced CVD (PECVD), FCVD, or ALD. The material of the gate end dielectrics 76 may have a higher κ (dielectric constant) than the κ of the top spacers 86 and the inner spacers 92. The dielectric material of the gate end dielectrics 76 may comprise a material based on $Si_3N_4$, a metal oxide, a non-metal oxide, a combination thereof, or the like.

Figures 18D, 18E:
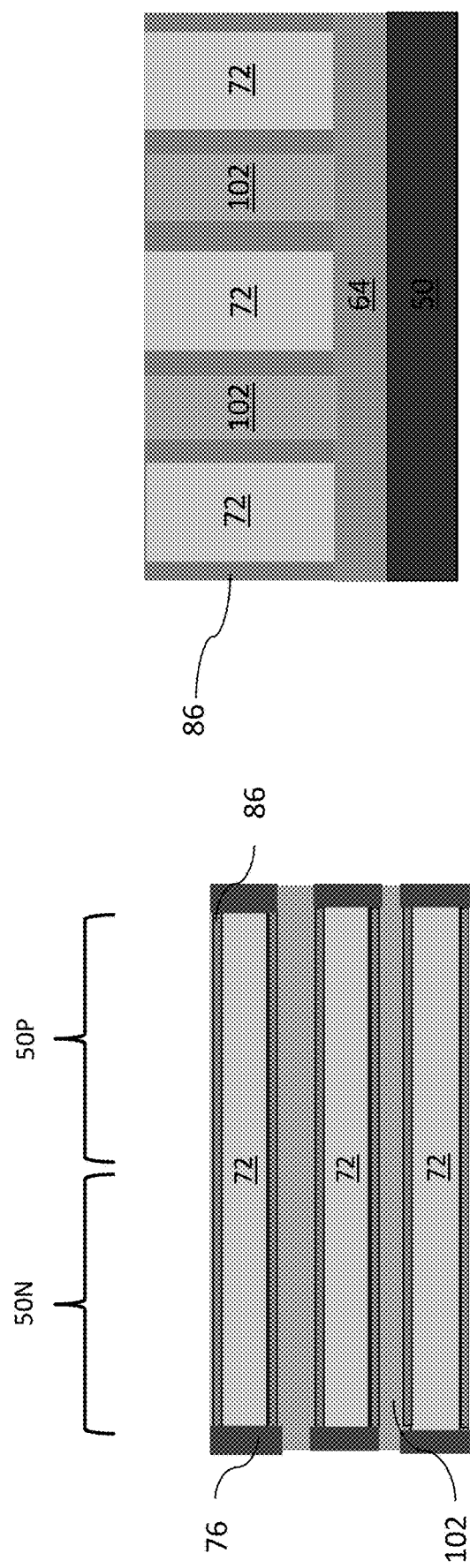

In some embodiments, the gate end dielectrics 76 are formed after forming the gate electrodes 118 and gate masks 122 as described below with respect to FIGS. 22A-22E. FIG. 18D illustrates embodiments in which the gate end dielectrics 76 extend through the dummy gates 72 and the top spacers 86 for illustrative purposes. In some embodiments, the gate end dielectrics 76 may extend through the dummy gates, but not the top spacers 86, and in some embodiments the gate end dielectrics 76 may extend into or through the first ILD 102. In some embodiments, the gate end dielectrics 76 may be continuous across multiple gates, extending through the first ILD 102 between adjacent dummy gates 72.

In FIGS. 19A-19E, alternating dummy gates 72 (e.g., the leftmost and rightmost dummy gates 72 in FIG. 18B above) and the underlying portions of the second fins 60 are replaced by dielectric base dummy gates 108, leaving a remaining dummy gate 72 (e.g., the center dummy gate 72 in FIG. 18B above) interspersed between pairs of dielectric base dummy gates 108, in accordance with some embodiments. For example, the second fins 60 may be formed as long strips, over which multiple gate electrodes may be formed. As illustrated in, for example, FIG. 19B, the dielectric base dummy gates 108 may act to isolate the source/drain regions of adjacent transistors, such as the source/drain region 96 on the left in FIG. 19B from an adjacent source/drain region (not shown) to the left of the dielectric base dummy gate 108 on the left of FIG. 19B.

Figure 19A:
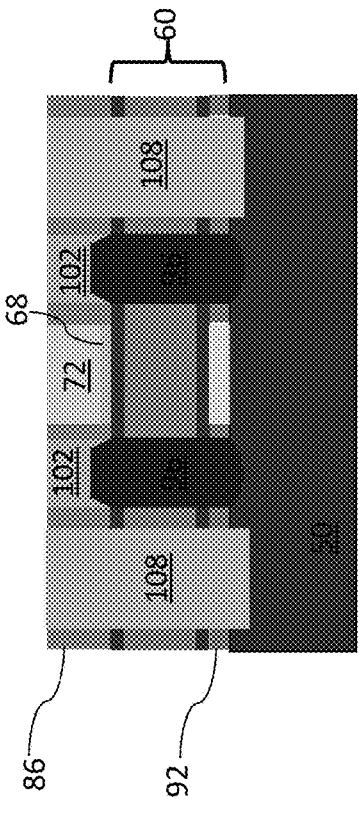
Figure 19B:
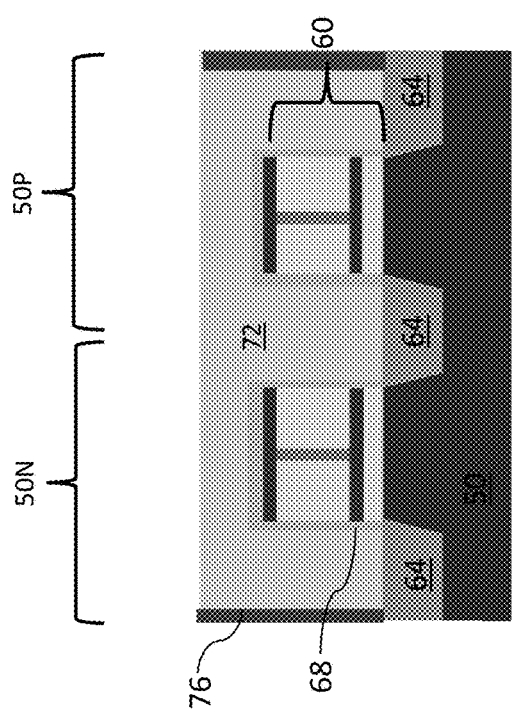
Figure 19C:
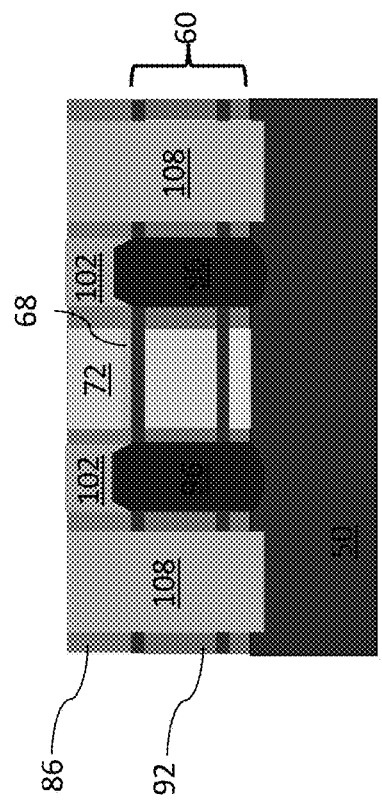
Figures 19D, 19E:
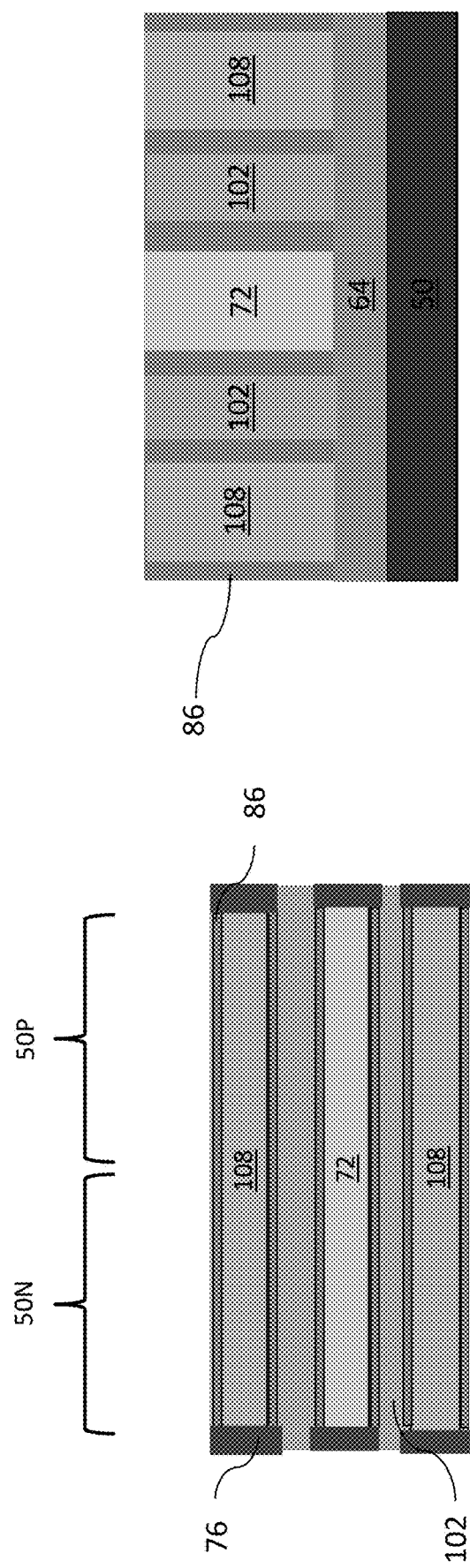
Figures 20D, 20E:
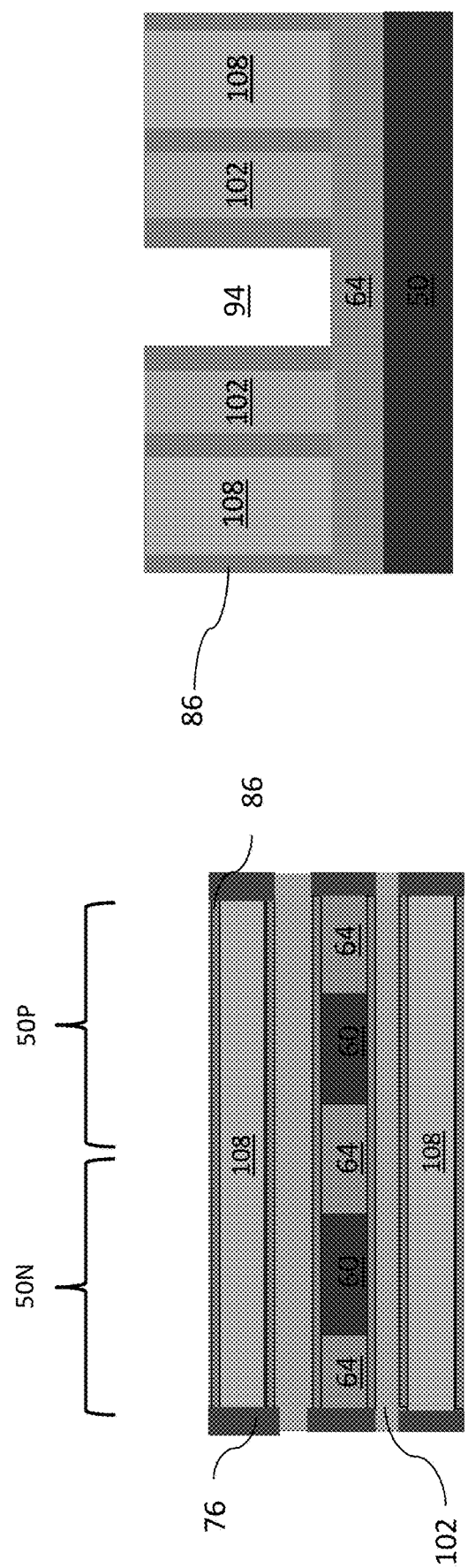
Figures 21D, 21E:
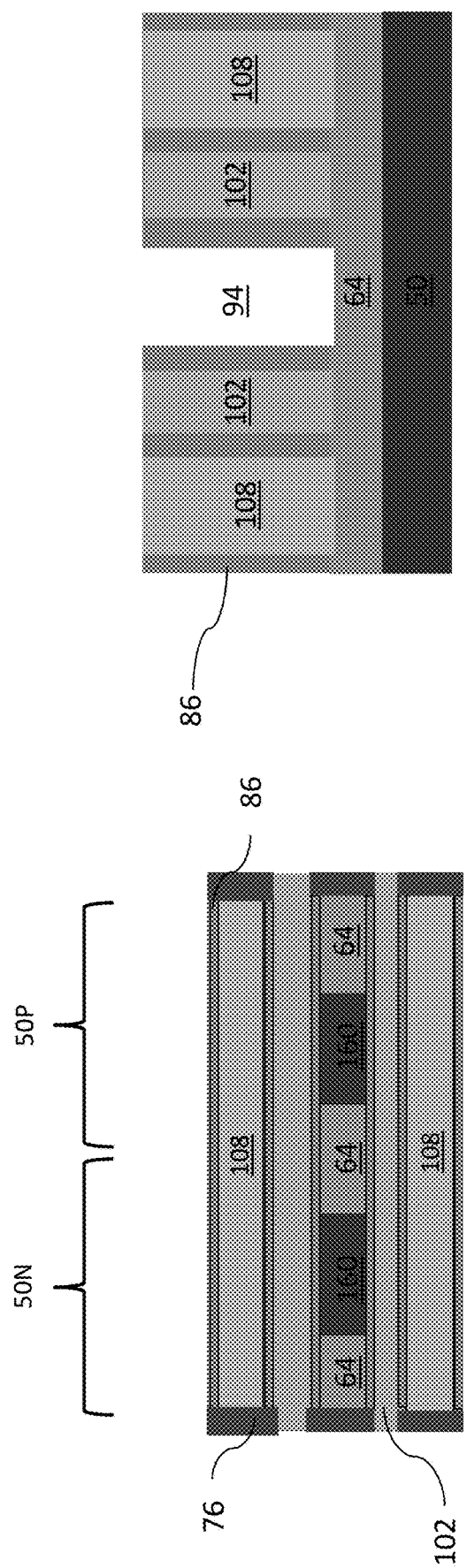
Figure 22E:
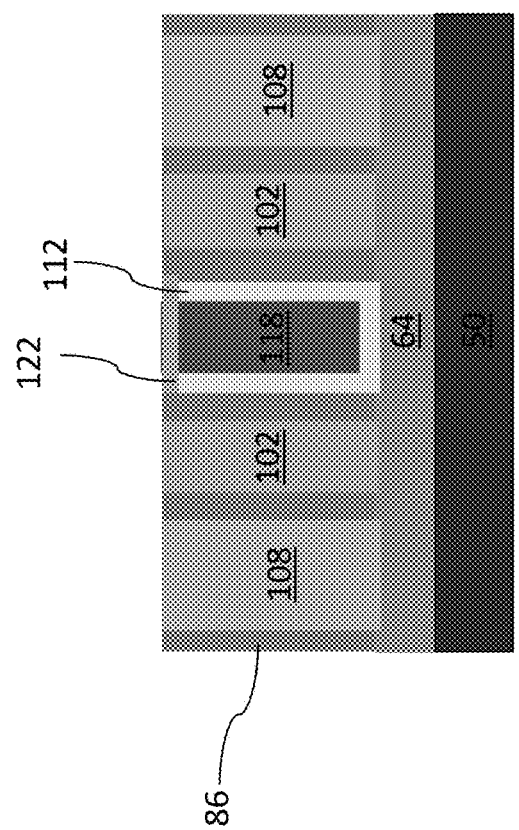
Figure 22D:
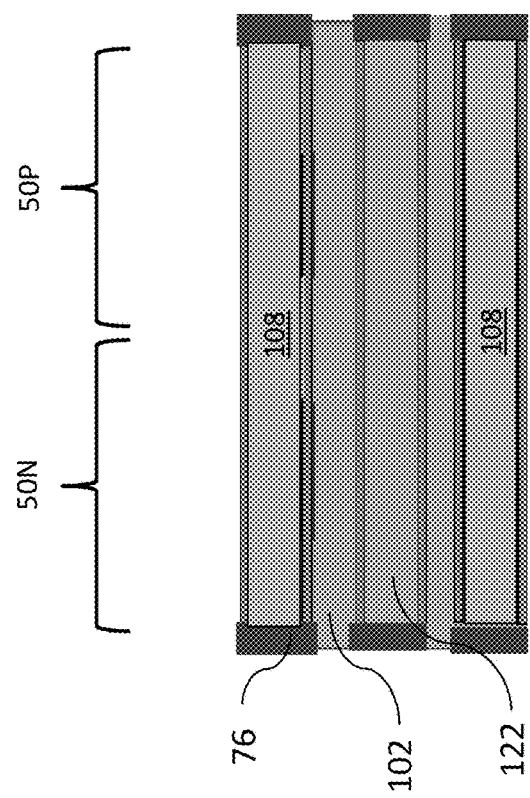
Figure 23E:
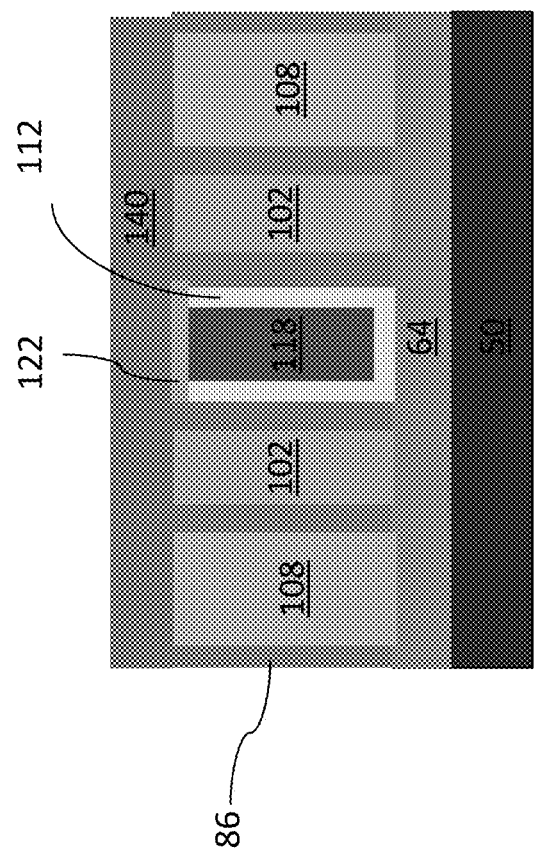
Figure 23D:
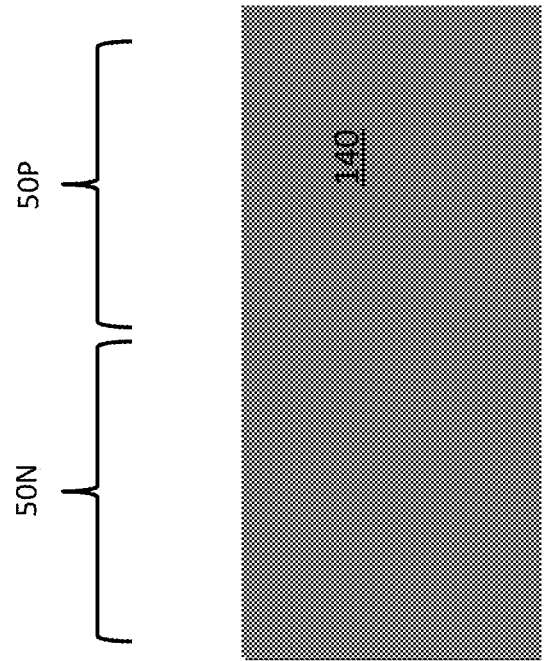
Figure 24E:
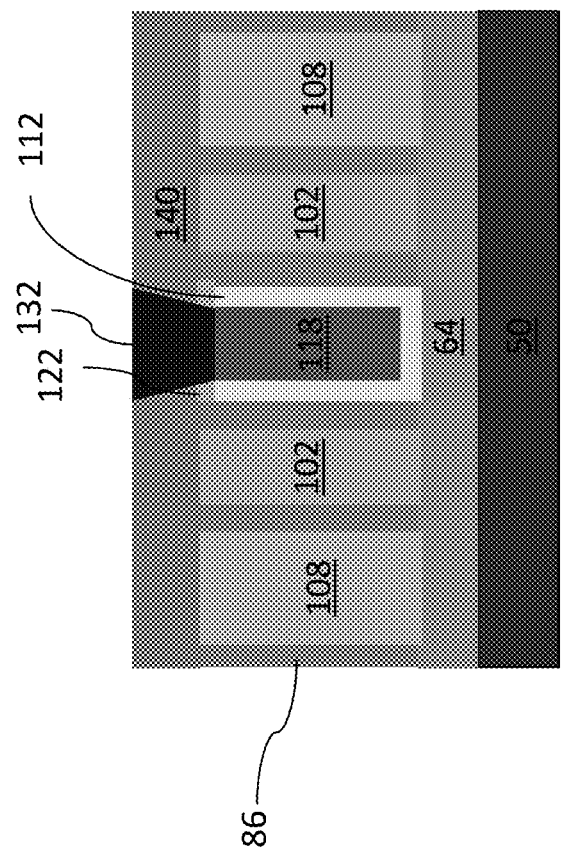
Figure 24D:
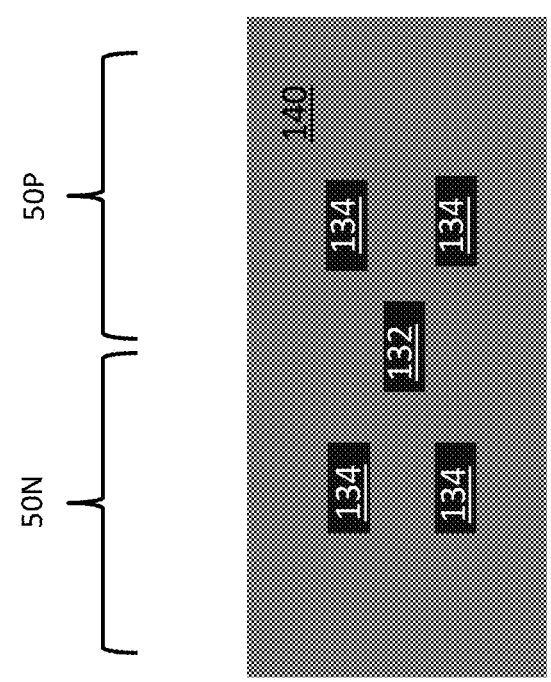

The dummy gates 72, and the masks 74 if present, may be removed in one or more etching steps. In some embodiments, the dummy gates 72 are removed by an anisotropic dry etch process. For example, the etching process may include a dry etch process using reaction gas(es) that selectively etch the dummy gates 72 without etching the first ILD 102, the top spacers 86, or the mask over the remaining dummy gate 72. The remaining dummy gate 72 may be masked by forming and patterning a masking layer (not shown) using suitable lithography processes and etching processes while removing the alternating dummy gates. In some embodiments, after the removal of the left and right dummy gates 72, one or more additional etching step(s) selective to the material of the second fins 60 and the substrate 50 remove portions of the second fins 60 and portions of the substrate 50 underlying the removed dummy gates 72, as shown in FIGS. 19B and 19C.

As further illustrated by FIGS. 19A-19E, dielectric base dummy gates 108 are formed in openings left by the removal of the alternating dummy gates 72, portions of the second fins 60, and portions of the substrate 50. The dielectric base dummy gates 108 may electrically isolate remaining portions of the second fins 60 from each other. The dielectric base dummy gates 108 may be deposited by any suitable method, such as CVD, plasma-enhanced CVD (PECVD), FCVD, or ALD. The dielectric base dummy gates 108 may be single or multiple layers of materials such as $SiO_2$, SiOC, an oxide containing carbon, an oxide containing nitrogen, an oxide containing carbon and nitrogen, a metal oxide dielectric, $HfO_2$, $Ta_2O_5$, $TiO_2$, $ZrO_2$, $Al_2O_3$, $Y_2O_3$, a La doped oxide containing multiple metals, a combination thereof, or the like. After the formation of the dielectric base dummy gates 108, the mask over the remaining dummy gate 72 may be removed by a suitable process.

In FIGS. 20A-20E, the remaining dummy gates 72, and the masks 74 if present, are removed in one or more etching steps, so that recesses 94 are formed. The dummy dielectric layer 68 in the recesses 94 may also be removed. In some embodiments, the dummy gates 72 are removed by an anisotropic dry etch process. For example, the etching process may include a dry etch process using reaction gas(es) that selectively etch the dummy gates 72 without etching or with little etching of the first ILD 102, the top spacers 86, or the dielectric base dummy gates 108. Each recess 94 exposes and/or overlies a channel region of a respective second fin 60. During the removal, the dummy dielectric layer 68 may be used as an etch stop layer when the dummy gates 72 are etched. The dummy dielectric layer 68 may then be removed after the removal of the dummy gates 72 using a suitable etching process, such as a wet etch or a combination of wet and dry etches.

In FIGS. 21A-21E, the exposed channel region portions of the second fins 60 are processed to remove the first sacrificial layer 52a and the second sacrificial layer 52b. A selective removal process for the sacrificial layers 52a and 52b (e.g., SiGe layers) is performed in the channel region portions of the second fins 60. In an embodiment in which the sacrificial layers 52a and 52b are formed of silicon germanium (SiGe) and the first sheet layer 54, the first fins 56, and the second sheet layer 58 are formed of silicon (Si), the sacrificial layers 52a and 52b may be removed, for example, by an SiGe selective removal process. In some embodiments, the selective removal process may use an etchant that selectively etches the silicon germanium at a higher rate than the silicon, such as $NH_4OH:H_2O_2:H_2O$ (ammonia peroxide mixture, APM), $H_2SO_4+H_2O_2$ (sulfuric acid peroxide mixture, SPM), or the like. Other suitable processes and materials may be used. This selective etching process removes the first sacrificial layer 52a and the second sacrificial layer 52b (e.g., SiGe layers), leaving the remaining portions of the first sheet layer 54, the first fins 56, and the second sheet layer 58 to form channel regions 160.

In FIGS. 22A-22E, gate dielectric 112 and gate electrodes 118 are formed for replacement gate structures. Gate dielectric 112 comprises one or more dielectric layers deposited in the recesses 94, such as on the top and bottom surfaces and the sidewalls of the channel regions 160, on sidewalls of the top spacers 86, and on exposed top surfaces of the substrate 50 underlying the channel regions 160. The gate dielectric 112 may also be formed on the top surface of the first ILD 102. In accordance with some embodiments, the gate dielectric 112 comprises silicon oxide, silicon nitride, or multi-layers thereof. In some embodiments, the gate dielectric 112 includes a high-k dielectric material, and in these embodiments, the gate dielectric 112 may have a k value greater than about 7.0, and may include a metal oxide or a silicate of hafnium, aluminum, zirconium, lanthanum, manganese, barium, titanium, lead, and combinations thereof. The formation methods of the gate dielectric 112 may include thermal oxidation, Molecular-Beam Deposition (MBD), ALD, PECVD, and the like.

The gate dielectric 112 may be formed to have a thickness T3 in a range of about 0.8 nm to about 3 nm, which may be advantageous for both device performance and gate dielectric leakage optimization. The gate dielectric 112 having a thickness T3 less than about 0.8 nm may be disadvantageous because it may lead to degraded gate dielectric leakage performance. The gate dielectric 112 having a thickness T3 greater than about 3 nm may be disadvantageous because it may lead to weak on current ($I_{on}$) performance.

Still referring to FIGS. 22A-22E, the gate electrodes 118 are deposited over the gate dielectric 112, respectively, and fill the remaining portions of the recesses 94. The gate electrodes 118 may include a metal-containing material such as titanium nitride (TiN), titanium oxide ($TiO_2$), TiAl, TiAlN, TaAl, tantalum nitride (TaN), TaAlN, tantalum carbide (TaC), TaAlC, TaCN, copper, cobalt, nickel, platinum, ruthenium, aluminum, tungsten, combinations thereof, or multi-layers thereof. For example, although a single layer gate electrode 118 is illustrated in FIGS. 22A-22E, the gate electrode 118 may comprise any number of liner layers, any number of work function tuning layers, and a fill material. After the filling of the recesses 94, a planarization process, such as a CMP, may be performed to remove the excess portions of the gate dielectric 112 and the material of the gate electrodes 118, which excess portions are over the top surface of the ILD 102. The remaining portions of material of the gate electrodes 118 and the gate dielectric layers 112 thus form replacement gates of the resulting MFCNSes. The gate electrodes 118 and the gate dielectric 112 may be collectively referred to as a "gate stack." The gate stacks may extend along sidewalls of the channel region 160 and between the gate end dielectrics 76. In some embodiments, the gate end dielectrics 76 are formed after the gate stack, as described above with respect to FIGS. 18A-18E.

FIGS. 22A-22E further illustrates recessing of the gate electrodes 118 and formation of the gate mask 122, in accordance with some embodiments. In some embodiments, the top spacers 86 adjacent to the gate electrodes 118 may be recessed and the gate mask 122 may be formed over the recessed top surfaces of the top spacers 86 as well. In some embodiments, the dielectric base dummy gates 108 may be recessed and the gate mask 122 may be formed over the recessed top surfaces of the dielectric base dummy gates 108 as well. The gate mask 122 protects the gate electrodes 118 during subsequent processing steps, such as etching processes to form a contact to the gate electrodes 118. After filling the recesses 94 and forming the gate electrodes 118 in the recesses, the gate electrodes 118 may be recessed by a dry etch to a depth in a range of about 10 nm to about 40 nm. The gate mask 122 comprises one or more layers of dielectric material, such as one or more layers of oxide, SiOC, SiN, SiON, SiOCN, nitride-based dielectric, metal oxide dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), a combination thereof, or the like, is filled in the recess, followed by a planarization process to remove excess portions of the dielectric material extending over the first ILD 102. The gate mask 122 may be a high-k dielectric capping that may function as a contact etch protection layer. The gate mask 122 has a thickness in a range of about 3 nm to about 30 nm. The subsequently formed gate contacts 132 (FIGS. 24A and 24E) penetrate through the gate mask 122 to contact the top surface of the recessed gate electrode 118. The gate mask 122 may be deposited by any suitable method, such as CVD, plasma-enhanced CVD (PECVD), FCVD, or ALD. After depositing the gate mask 122, excess material above top surfaces of the top spacers 86 may be removed by a planarization such as a CMP.

The formation of the gate dielectric 112 in the region 50N and the region 50P may occur simultaneously such that the gate dielectric 112 in each region are formed from the same materials, and the formation of the gate electrodes 118 may occur simultaneously such that the gate electrodes 118 in each region are formed from the same materials. In some embodiments, the gate dielectric 112 in each region may be formed by distinct processes, such that the gate dielectric 112 may be different materials, and/or the gate electrodes 118 in each region may be formed by distinct processes, such that the gate electrodes 118 may be different materials. Various masking steps may be used to mask and expose appropriate regions when using distinct processes.

In FIGS. 23A-23E, a second ILD 140 is deposited over the first ILD 102. In some embodiment, the second ILD 140 is a flowable film formed by a flowable CVD method. In some embodiments, the second ILD 140 is formed of a dielectric material such as PSG, BSG, BPSG, USG, or the like, and may be deposited by any suitable method, such as CVD and PECVD. After the deposition of the second ILD 140, a planarization process, such as a CMP, may be performed to remove excess top portions of the second ILD 140.

In FIGS. 24A-24E, gate contacts 132 and source/drain contacts 134 are formed through the second ILD 140, the gate mask 122, and the first ILD 102 in accordance with some embodiments. Openings for the source/drain contacts 134 are formed through the first and second ILDs 102 and 140, and openings for the gate contacts 132 are formed through the second ILD 140 and the gate mask 122. The portions of the openings for the source/drain contacts 132 through the second ILD 140 may be formed using acceptable photolithography and etching techniques. In some embodiments, the portions of the openings for the source/drain contacts 134 through the first ILD 102 are formed by a self-aligned contact process. The self-aligned contact process comprises an etching process that uses the top spacers 86 as a mask for removing portions of the first ILD 102 between the top spacers 86 and over the source/drain regions 96. The source/drain contacts 134 are then formed in the openings left by the removal of the portions of the first ILD 102. The openings for the gate contacts 132 may be formed using acceptable photolithography and etching techniques.

A liner, such as a diffusion barrier layer, an adhesion layer, or the like, and a conductive material are formed in the openings. The liner may include titanium, titanium nitride, tantalum, tantalum nitride, or the like. The conductive material may be titanium, TiN, TaN, copper, a copper alloy, platinum, silver, gold, tungsten, cobalt, ruthenium, aluminum, nickel, a combination thereof, or the like. A planarization process, such as a CMP, may be performed to remove excess material from a surface of the ILD 140. The remaining liner and conductive material form the source/drain contacts 134 and gate contacts 132 in the openings. An anneal process may be performed to form a silicide 136 at the interface between the epitaxial source/drain regions 96 and the source/drain contacts 134. The source/drain contacts 134 are physically and electrically coupled to the epitaxial source/drain regions 96, and the gate contacts 132 are physically and electrically coupled to the gate electrodes 118. The source/drain contacts 134 and gate contacts 132 may be formed in different processes, or may be formed in the same process. As illustrated in FIGS. 24A-24E, it should be appreciated that each of the source/drain contacts 134 and gate contacts 132 may be formed in different cross-sections, which may avoid shorting of the contacts.

As illustrated in FIG. 24A, the channel region 160 has a first sheet portion 154 (a remaining bottom sheet portion of the first sheet layer 54), a second sheet portion 158 (a remaining top sheet portion of the second sheet layer 58), and a fin portion 156 extending from the top surface of the first sheet portion 154 to the bottom surface of the second sheet portion 158. The gate electrodes 118 may have a length L1 measured between opposite gate end dielectrics 76 in a range of about 60 nm to about 300 nm, such as about 120 nm. Following the formation of the source/drain contacts 134 and gate contacts 132, additional inter-metal dielectric (IMD) layers, conductive lines and vias may be formed over the second ILD 140, the source/drain contacts 134, and the gate contacts 132.

The Multi-Finger-Channel Nanostructure (MFCNS) shape of the channel region 160 may provide benefits in device performance. The larger size of the channel region 160 including the horizontal sheet portions 154 and 158 and the vertical fin portions 156 may lead to improvement of device on current ($I_{on}$) performance. Current crowding in the top-facing channel sheet portion 158 during on stage and high voltage operation may be reduced by the inclusion of the vertical fin portion 156 in the channel region 160.

FIGS. 25 through 37C illustrate some embodiments with three horizontal channel sheets separated by a vertical fin. In other embodiments, more than three horizontal channel sheets, such as four or five channel sheets, may be formed.

Figure 25:
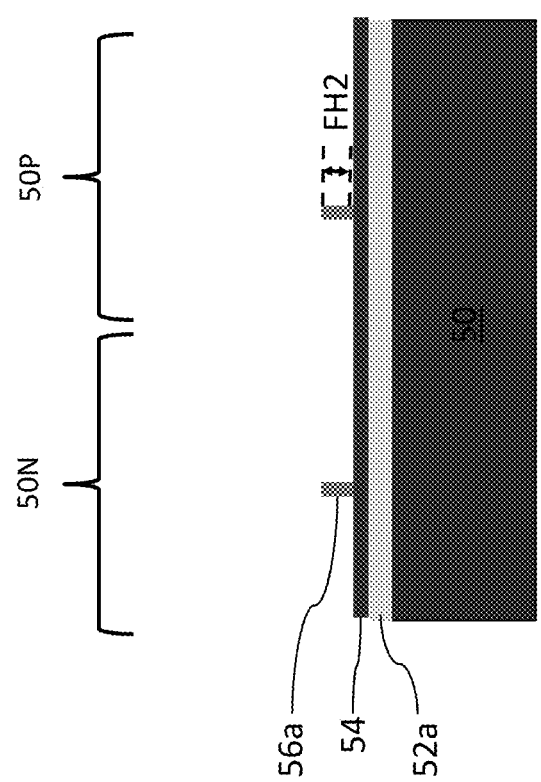

FIG. 25 follows from FIGS. 2 and 3 as described above. In FIG. 25, first fins 56a are formed on the first sheet layer 54 in the regions 50N and 50P. The first fins 56a may be formed by substantially similar processes as the first fins 56 as described above with respect to FIG. 4A. The first fins 56a may be formed to have heights FH2 in a range of about 10 nm to about 40 nm, which may be advantageous for device performance. The first fins 56a having a height FH2 less than about 10 nm may be disadvantageous because it may lead to weaker on current ($I_{on}$) performance. The first fins 56a having a height FH2 greater than about 40 nm may be disadvantageous because it may lead to increased capacitance between the gate and the source/drain regions. The first fins 56a may be formed to have substantially similar widths as the widths FW1 of the first fins 56 as described above with respect to FIG. 4A.

Figure 26:
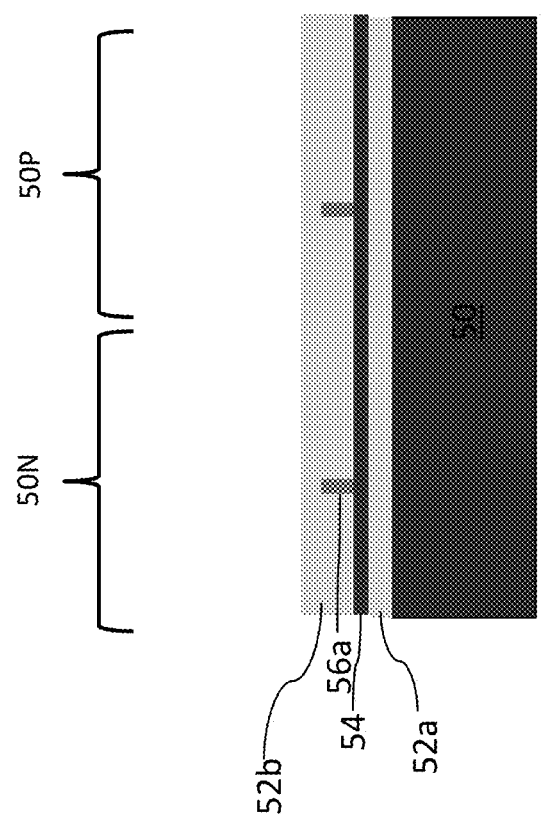

In FIG. 26, a second sacrificial layer 52b is formed over the first sheet layer 54 and the first fins 56a. In some embodiments, the second sacrificial layer 52b is epitaxially grown using a substantially similar process and substantially similar materials as used to form the first sacrificial layer 52a as described above with respect to FIG. 3.

Figure 27:
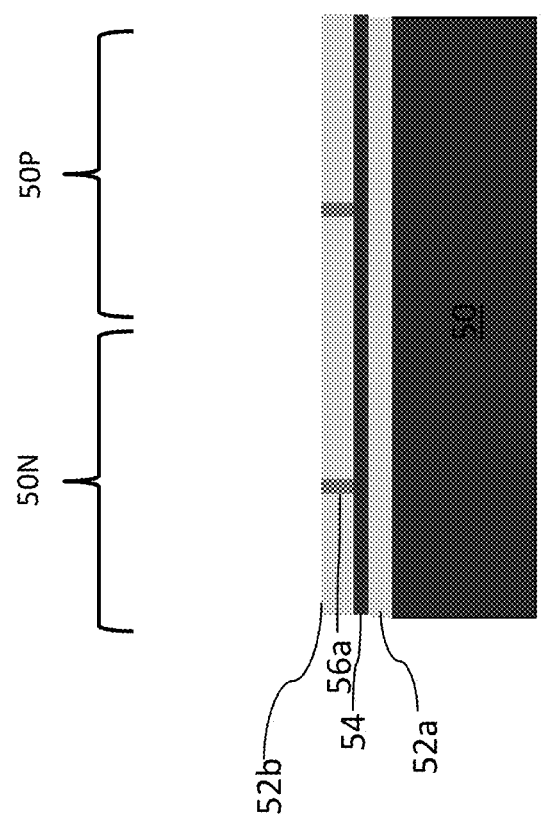

In FIG. 27, a top portion of the second sacrificial layer 52b is removed to expose top surfaces of the first fins 56a. The removal of the top portion of the second sacrificial layer 52b may be performed by a planarization such as, e.g., a chemical mechanical polish (CMP).

Figure 28:
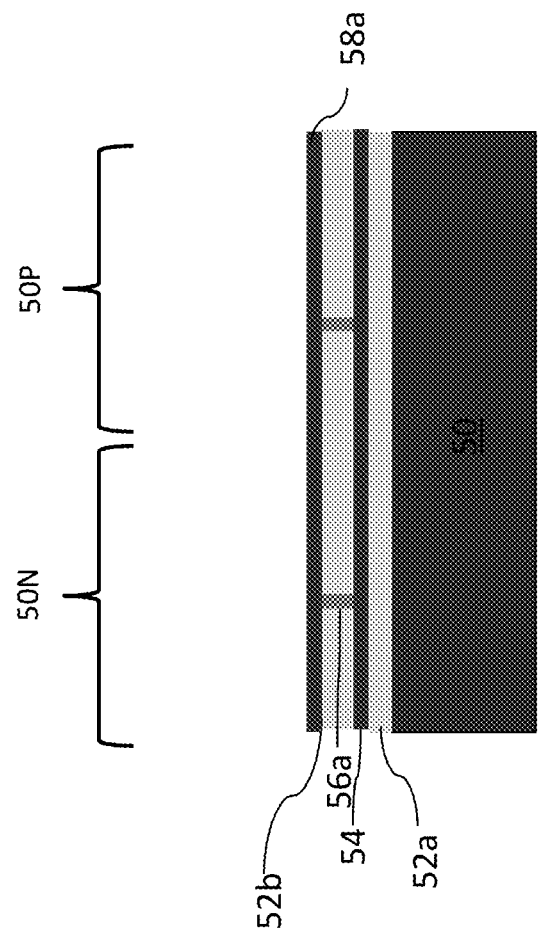

In FIG. 28, a second sheet layer 58a is formed on the second sacrificial layer 52b and on top surfaces of the first fins 56a. The second sheet layer 58a, together with the first fins 56a, the first sheet layer 54, and subsequently formed fins and sheet layers, will be subsequently patterned to form a channel region of a transistor. In some embodiments, the second sheet layer 58a is epitaxially grown using a substantially similar process and substantially similar materials as used to form the first sheet layer 54, as described above with respect to FIGS. 4A-4D. In some embodiments, the second sheet layer 58a is planarized by a CMP after being epitaxially grown in order to achieve a desired thickness. The second sheet layer 58a may have a substantially similar thickness T2 as the second sheet layer 58 as described above with respect to FIG. 7A.

Figure 29A:
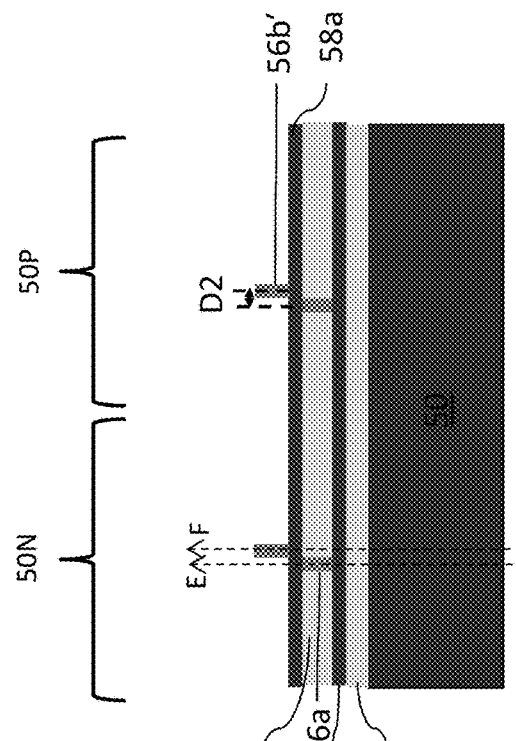

In FIG. 29A, which follows from FIG. 28 in accordance with embodiments in which the vertical fins of each channel region are aligned along the same vertical axis, first fins 56b extending from the second sheet layer 58 directly over the first fins 56a are formed. The first fins 56b may be formed by substantially similar processes and to substantially similar heights and widths as the first fins 56a, as described above with respect to FIG. 25. FIG. 29A further illustrates cross-section E-E' through the first fins 56a and 56b and cross-section F-F' along a vertical axis horizontally displaced from the first fins 56a and 56b.

Figure 29B:
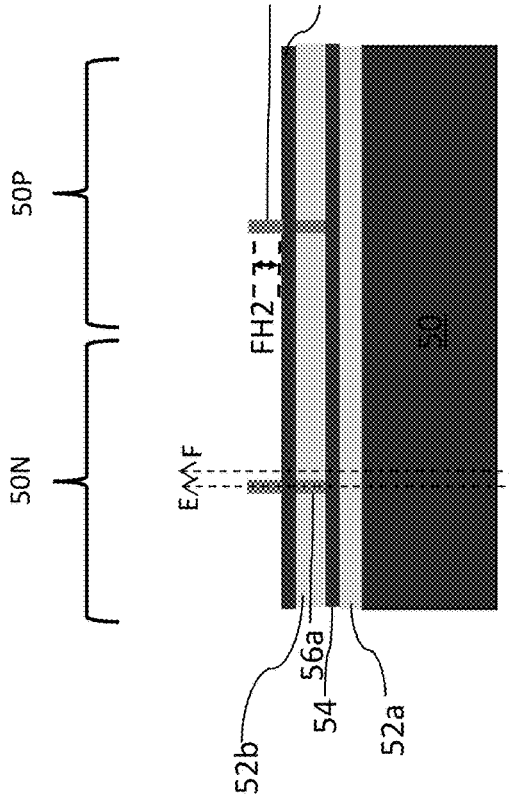

FIG. 29A illustrates embodiments in which the first fins 56a and 56b are laterally aligned. In other embodiments, such as the embodiment illustrated in FIG. 29B, the vertical fins of each channel region are along parallel vertical axes offset in a horizontal direction. For example, a vertical axis of first fins 56b' extends from the second sheet layer 58a at an offset from a vertical axis of the first fins 56a by a distance D2 in a range of less than about 5 nm are formed, which may be advantageous for ideal device performance. The first fins 56b' having a distance D2 from the first fins 56a greater than about 5 nm may be disadvantageous because it may lead to adverse device performance. The first fins 56b' may be formed by substantially similar processes and to substantially similar heights and widths as the first fins 56a, as described above with respect to FIG. 25. FIG. 29B further illustrates cross-section E-E' through the first fin 56a and cross-section F-F' through the first fin 56b'.

Figure 30B:
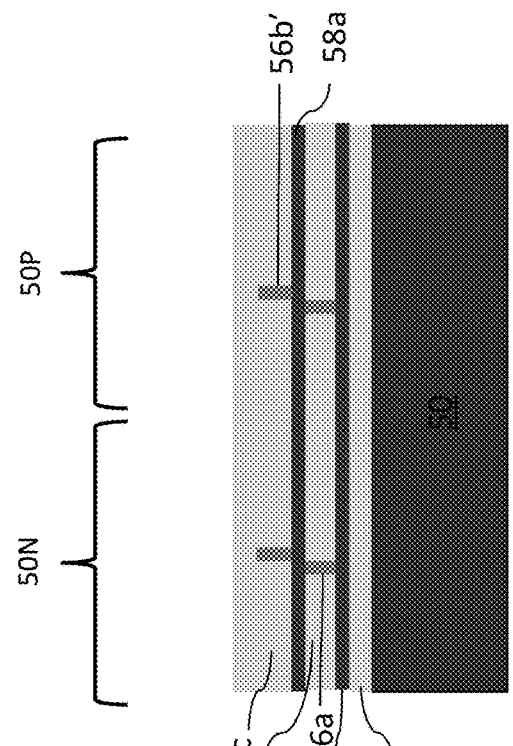
Figure 30A:
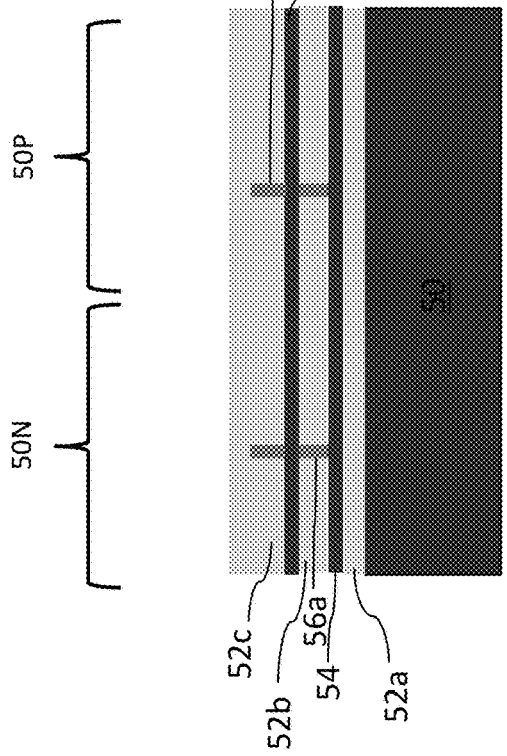

In FIGS. 30A and 30B, which follow from FIGS. 29A and 29B, respectively, a third sacrificial layer 52c is formed over the second sheet layer 58a and the first fins 56b or 56b'. In some embodiments, the third sacrificial layer 52c is epitaxially grown using a substantially similar process and substantially similar materials as used to form the first and second sacrificial layers 52a and 52b as described above with respect to FIGS. 3 and 26.

Figures 31A, 31B:
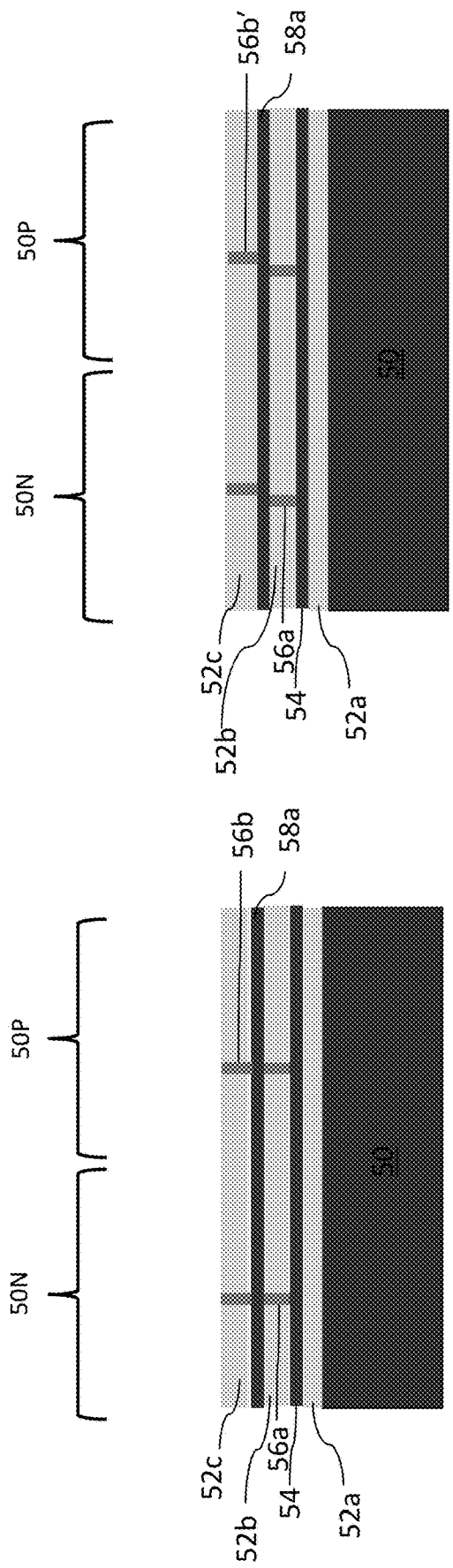

In FIGS. 31A and 31B, which follow from FIGS. 30A and 30B, respectively, a top portion of the third sacrificial layer 52c is removed to expose top surfaces of the first fins 56b or 56b'. The removal of the top portion of the third sacrificial layer 52c may be performed by a planarization such as, e.g., a chemical mechanical polish (CMP).

Figure 32B:
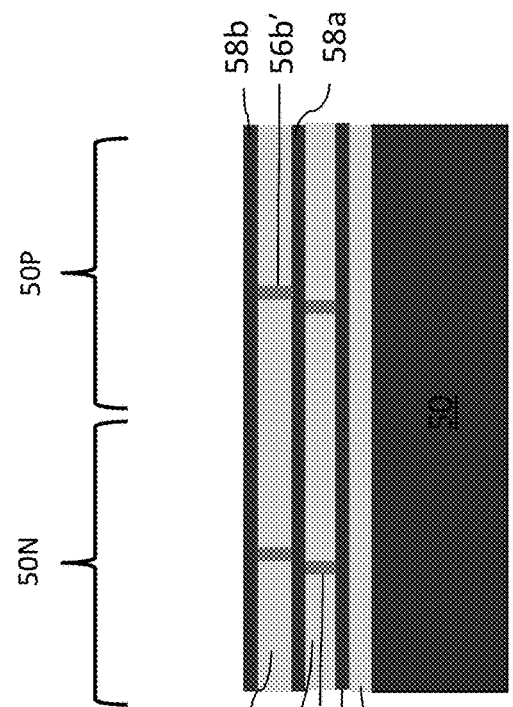
Figure 32A:
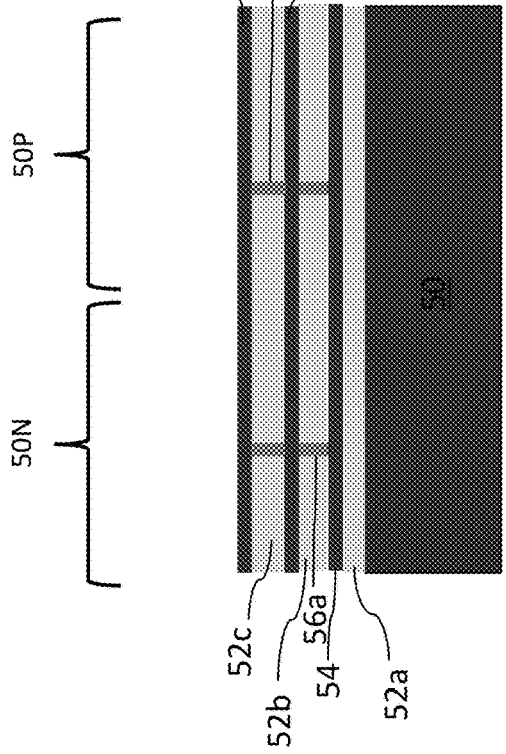

In FIGS. 32A and 32B, which follow from FIGS. 31A and 31B, respectively, a third sheet layer 58b is formed on the third sacrificial layer 52c and on top surfaces of the first fins 56b or 56b'. The third sheet layer 58b, together with the first fins 56b or 56b', the first sheet layer 54, and the second sheet layer 58a will be subsequently patterned to form a channel region of a transistor. In some embodiments, the third sheet layer 58b is epitaxially grown using a substantially similar process and substantially similar materials as used to form the first sheet layer 54 and the second sheet layer 58a, as described above with respect to FIGS. 4A-4D and FIG. 28. In some embodiments, the third sheet layer 58b is planarized by a CMP after being epitaxially grown in order to achieve a desired thickness. The third sheet layer 58b may have a substantially similar thickness T2 as the second sheet layers 58 and 58a as described above with respect to FIGS. 7A and 28.

In some embodiments, the first sheet layer 54, the first fins 56a and 56b or 56b', the second sheet layer 58a, and the third sheet layer 58b are doped in situ during the epitaxial growth or by implantation after the epitaxial growth. In embodiments in which the first sheet layer 54, the first fins 56a or 56b, the second sheet layer 58, and the third sheet layer 58b are doped in situ, the materials in the region 50N and region 50P may be grown separately. In some embodiments, the first sheet layer 54, the first fins 56a or 56b, the second sheet layer 58, and the third sheet layer 58b in region 50N may be doped with boron to a concentration in a range of about $1\times10^{16}$ cm$^{-3}$ to about $1\times10^{18}$ cm$^{-3}$, and the first sheet layer 54, the first fins 56a or 56b, the second sheet layer 58, and the third sheet layer 58b in region 50P may be doped with phosphorus to a concentration in a range of about $1\times10^{16}$ cm$^{-3}$ to about $1\times10^{18}$ cm$^{-3}$. Additionally, the first sheet layer 54, the first fins 56a and 56b or 56b', the second sheet layer 58a, and/or the third sheet layer 58b may be a gradient layer having a varying concentration of elements and/or doping levels.

Figure 33A:
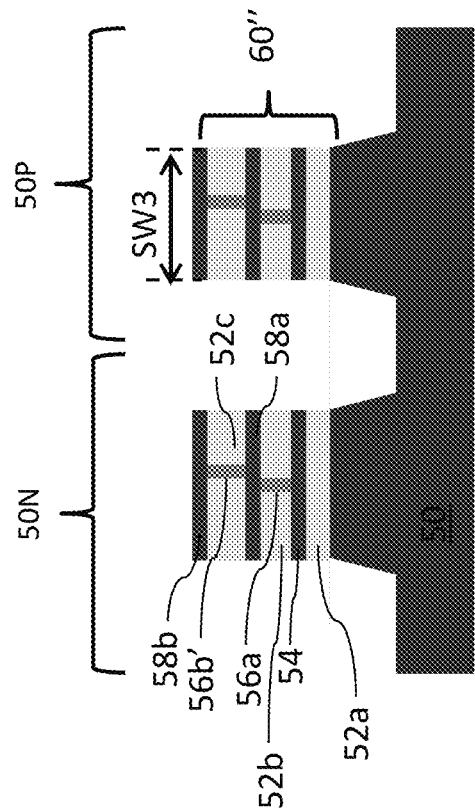
Figure 33B:
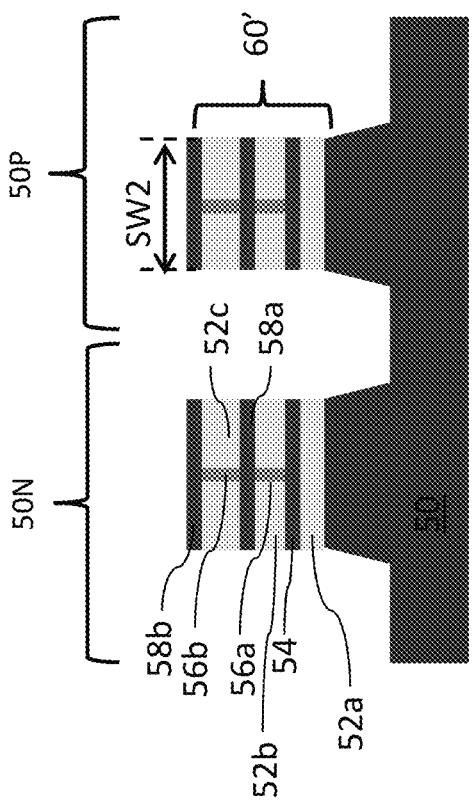

In FIGS. 33A and 33B, which follow from FIGS. 32A and 32B, respectively, the first sacrificial layer 52a, the first sheet layer 54, the first fins 56a, 56b, and 56b', the second sacrificial layer 52b, the second sheet layer 58a and third sheet layer 58b, and the third sacrificial layer 52c are patterned to form second fins 60' and 60''. The third sheet layer 58b forms the top surfaces of the second fins 60' and 60'' as illustrated in FIGS. 33A and 33B, respectively. The second fins 60' and 60'' may be patterned by substantially similar methods as the second fins 60 as described above with respect to FIGS. 8A-8D.

With respect to FIG. 33A, the second fins 60' may be formed to have sheet widths SW2 measured between opposite sidewalls of the second fins 60' in a range of about 10 nm to about 70 nm, which may be advantageous for improved $I_{on}$ and capacitance performance. The second fins 60' having a sheet width SW2 less than about 10 nm may be disadvantageous because it may lead to weak $I_{on}$ performance. The second fins 60' having a sheet width SW2 greater than about 70 nm may be disadvantageous because it may lead to higher capacitance between gate and source/drain regions, which may result in worse power consumption.

With respect to FIG. 33B, the second fins 60'' may be formed to have sheet widths SW3 measured between opposite sidewalls of the second fins 60'' in a range of about 10 nm to about 70 nm, which may be advantageous for improved $I_{on}$ and capacitance performance. The second fins 60'' having a sheet width SW3 less than about 10 nm may be disadvantageous because it may lead to weak $I_{on}$ performance. The second fins 60' having a sheet width SW3 greater than about 70 nm may be disadvantageous because it may lead to higher capacitance between gate and source/drain regions, which may result in worse power consumption.

Figure 34B:
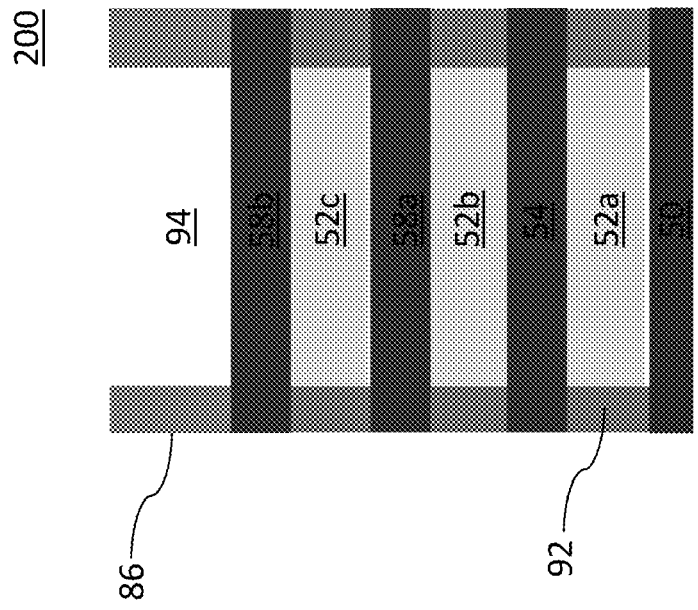
Figure 34A:
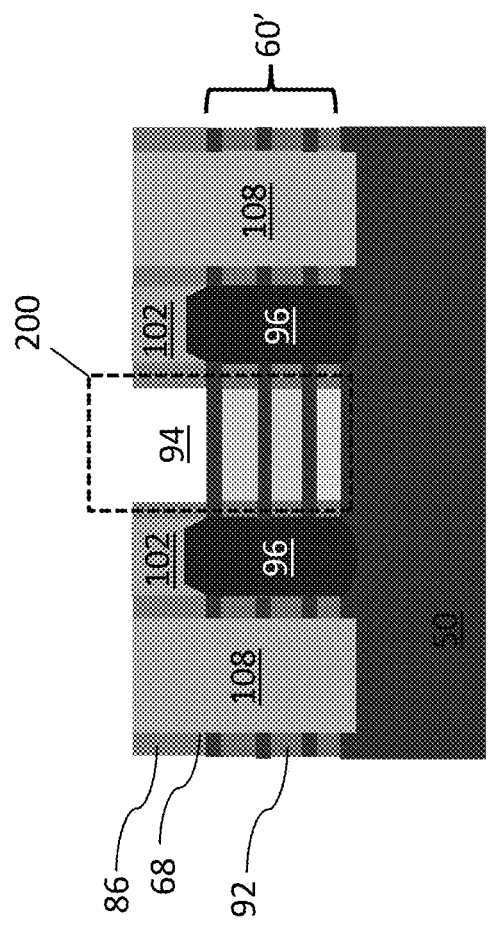

FIGS. 34A and 34B follow from FIGS. 33A and 33B by processing steps that may be substantially similar as described above with respect to FIGS. 9A through 19E. FIG. 34A follows from FIG. 33A as illustrated along cross-section F-F' shown in FIG. 29A. FIG. 34A shows the formation of recess 94 by the removal of the remaining dummy gate 72 (and the mask 74 if present), which may be performed by a substantially similar process as described above with respect to FIGS. 20A-20E. FIG. 34B illustrates a detailed view of region 200 of FIG. 34A, showing the sacrificial layers 52a, 52b, and 52c disposed between the substrate 50 and the sheet layers 54, 58a, and 58b, respectively.

Figure 35B:
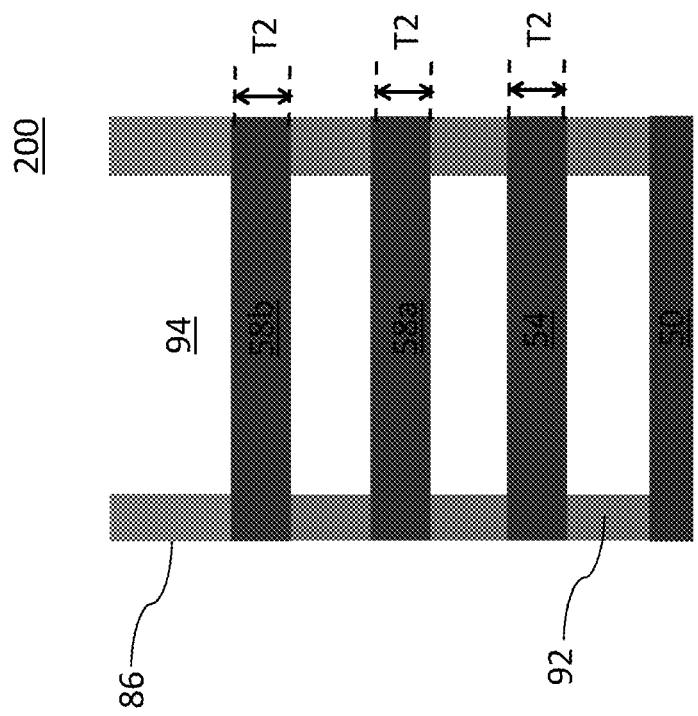
Figure 35A:
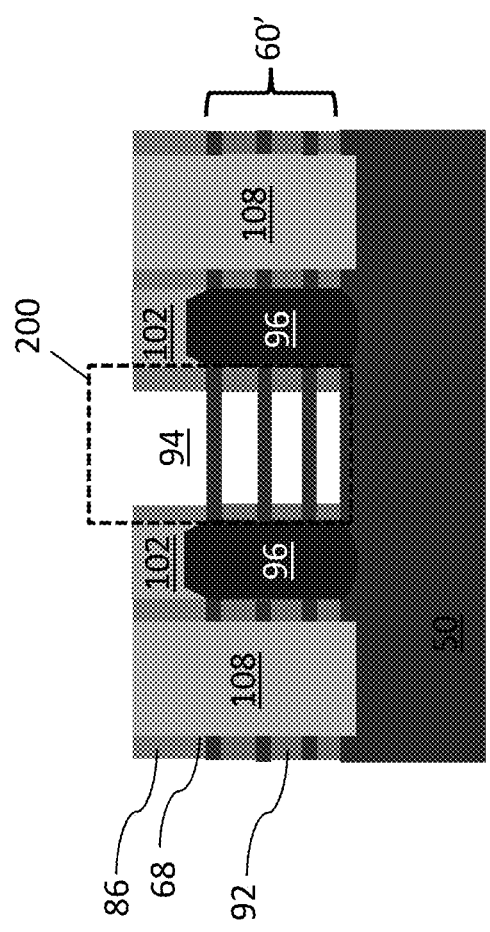
Figure 36E:
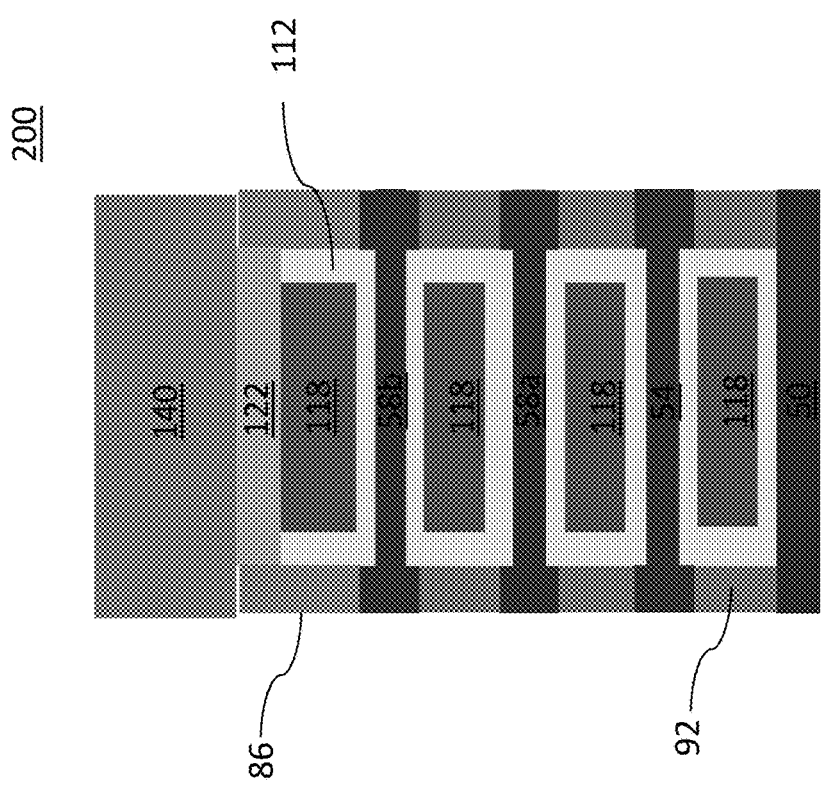

FIGS. 35A and 35B follow from FIGS. 34A and 34B, respectively. FIGS. 35A and 35B show the removal of the sacrificial layers 52a, 52b, and 52c. A selective removal process for the sacrificial layers 52a, 52b, and 52c (e.g., SiGe layers) is performed in the channel region portions of the second fins 60'. The selective removal process may be substantially similar as described above with respect to FIGS. 21A-E. In other embodiments, the sacrificial layers 52a, 52b, and 52c may be removed from the channel region portions of the second fins 60'' (not illustrated) by a substantially similar process.

Figure 35D:
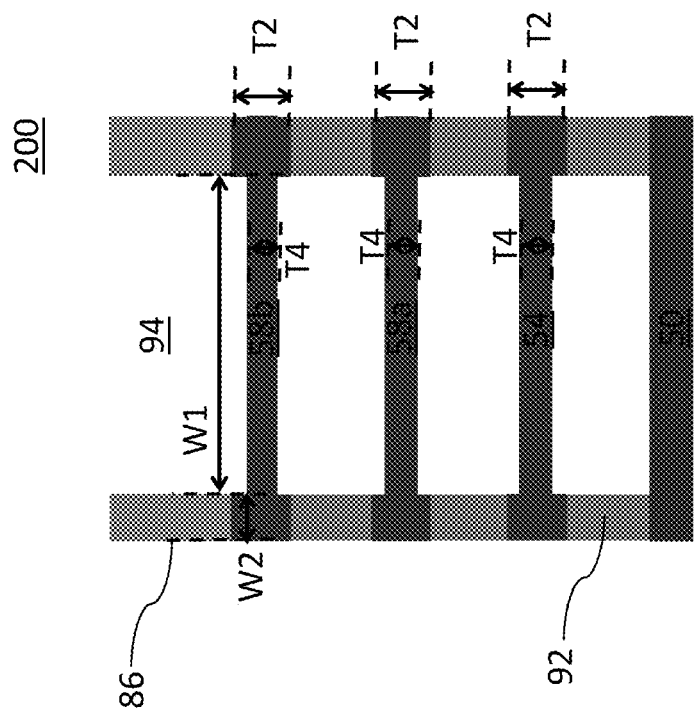
Figure 35C:
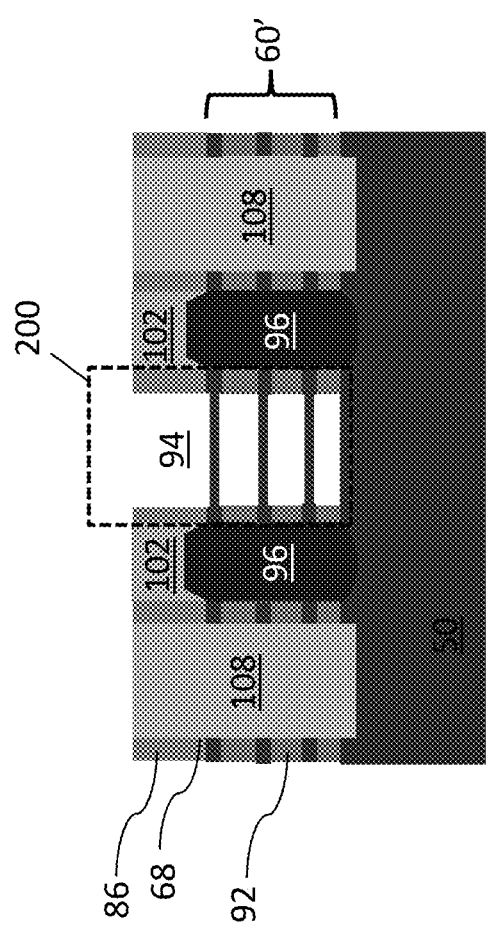

FIGS. 35C and 35D follow from FIGS. 35A and 35B, respectively, and illustrate other embodiments in which the exposed portions of the channel sheets 54, 58a, and 58b are over-etched to a thickness T4. The exposed portions of the channel sheets 54, 58a, and 58b may be over-etched by an isotropic dry or wet etch to a depth in a range of about 0.3 nm to about 2 nm. In some embodiments, the ratio of the thickness T2 of the unexposed portions of the channel sheets 54, 58a, and 58b to the thickness T4 of the exposed portions of the channel sheets 54, 58a, and 58b is in a range of about 1.1 to about 3. In some embodiments, the thickness T2 is greater than the thickness T4 by at least 0.5 nm, or by at least 1 nm. Over-etching the exposed portions of the channel sheets 54, 58a, and 58b may provide a relatively thinner T4 for improvement of the ratio of on current ($I_{on}$) to sub-threshold leakage current ($I_{soff}$) and a relatively thicker T2 for resistance reduction in portions of the lightly doped source/drain (LDD) regions. The exposed portions of the channel sheets 54, 58a, and 58b may have a width W1 measured between opposite sidewalls of the exposed portions in a range of about 5 nm to about 120 nm. The unexposed portions of the channel sheets 54, 58a, and 58b may have a width W2 measured between opposite sidewalls of the unexposed portions in a range of about 4 nm to about 10 nm. In some embodiments, following from FIG. 21C in which the channel region 160 is two channel sheets 54 and 58 connected by one channel fin 56, the exposed portions of the two channel sheets 54 and 58 may be over-etched by a similar process as described above in reference to FIGS. 35C and 35D.

FIGS. 36A, 36B, and 36C follow from FIGS. 35A and 35B by processing steps that may be substantially similar as described above with respect to FIGS. 22A through 24E. FIG. 36A follows from FIGS. 35A and 35B as illustrated along cross-section A-A' shown in FIG. 1, FIG. 36B follows from FIGS. 35A and 35B as illustrated along cross-section E-E' shown in FIG. 29A, and FIG. 36C follows from FIGS. 35A and 35B as illustrated along cross-section F-F' shown in FIG. 29A. FIGS. 36A-36C show the channel region 160' with three horizontal channel sheets 54, 58a, and 58b and two vertical channel fins 56a and 56b along the same vertical axis surrounded by the gate dielectric 112 and the gate electrode 118.

As illustrated in FIG. 36A, the channel region 160' has a first sheet portion 154 (a remaining bottom sheet portion of the first sheet layer 54), a second sheet portion 158a (a remaining middle sheet portion of the second sheet layer 58a), a first fin portion 156a extending from the top surface of the first sheet portion 154 to the bottom surface of the second sheet portion 158a, a third sheet portion 158b (a remaining top sheet portion of the third sheet layer 58b), and a second fin portion 156b extending from the top surface of the second sheet portion 158a to the bottom surface of the third sheet portion 158b. The first fin portion 156a and the second fin portion 156b are along a single vertical axis perpendicular to the sheet portions 154, 158a, and 158b. The gate electrode 118 may have a length L2 measured between opposite gate end dielectrics 76 in a range of about 60 nm to about 300 nm, such as about 120 nm.

Figure 36D:
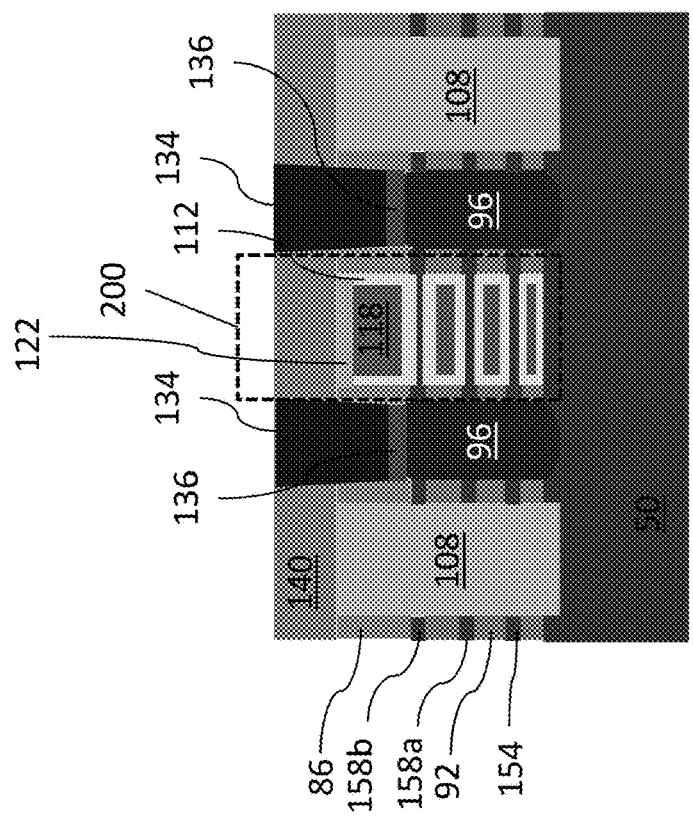

FIGS. 36D and 36E follow from FIGS. 35C and 35D, respectively, by processing steps that may be substantially similar as described above with respect to FIGS. 22A through 24E, in accordance with embodiments in which the channel sheets are over-etched. FIGS. 36D and 36E illustrate a similar structure as FIGS. 36A, 36B, and 36C but with channel sheets 54, 58a, and 58b are over-etched to the thickness T4. Over-etching the channel sheets 54, 58a, and 58b to the thickness T4 may provide a relatively thinner T4 for improvement of the ratio of on current ($I_{on}$) to sub-threshold leakage current ($I_{soff}$) and a relatively thicker T2 for resistance reduction in portions of the lightly doped source/drain (LDD) regions. In some embodiments, the channel region has just a first sheet portion and a second sheet portion as illustrated above in FIG. 24A, with the first sheet portion and the second sheet portion over-etched to the thickness T4.

FIGS. 37A, 37B, and 37C follow from FIG. 33B by processing steps that may be substantially similar as described above with respect to FIGS. 9A through 24E, in accordance with embodiments in which vertical channel fins 56a and 56b' are along parallel vertical axes separated by a horizontal offset. FIG. 37A follows from FIG. 33B as illustrated along cross-section A-A' shown in FIG. 1, FIG. 37B follows from FIG. 33B as illustrated along cross-section E-E' shown in FIG. 29B, and FIG. 37C follows from FIG. 33B as illustrated along cross-section F-F' shown in FIG. 29B. FIGS. 37A-37C show the channel region 160" with three horizontal channel sheets 154, 158a, and 158b and two vertical channel fins 156a and 156b' parallel vertical axes separated by a horizontal offset surrounded by the gate dielectric 112 and the gate electrode 118. The gate electrode 118 may have a length L2 measured between opposite gate end dielectrics 76 in a range of about 60 nm to about 300 nm, such as about 120 nm.

As illustrated in FIG. 37A, the channel region 160" has a first sheet portion 154 (a remaining bottom sheet portion of the first sheet layer 54), a second sheet portion 158a (a remaining middle sheet portion of the second sheet layer 58a), a first fin portion 156a extending from the top surface of the first sheet portion 154 to the bottom surface of the second sheet portion 158a, a third sheet portion 158b (a remaining top sheet portion of the third sheet layer 58b), and a second fin portion 156b' extending from the top surface of the second sheet portion 158a to the bottom surface of the third sheet portion 158b. The first fin portion 156a and the second fin portion 156b' are along parallel vertical axes perpendicular to the sheet portions 154, 158a, and 158b and separated by a horizontal distance D1, as shown above in FIG. 29B. Following the formation of the source/drain contacts 134 and gate contacts 132 in accordance with the embodiments illustrated by FIGS. 36A-37C, additional inter-metal dielectric (IMD) layers, conductive lines and vias may be formed over the second ILD 140, the source/drain contacts 134, and the gate contacts 132.

The Multi-Finger-Channel Nanostructure (MFCNS) shape of the channel regions 160' or 160" may provide benefits in device performance. The larger size of the channel regions 160' or 160" including the horizontal sheet portions 154, 158a, and 158b and the vertical fin portions 156a and 156b or 156b' may lead to improvement of device on current ($I_{on}$) performance. Current crowding in the top-facing channel sheet portion 158b during on stage and high voltage operation may be reduced by the inclusion of the vertical fin portions 156a and 156b or 156b' in the channel region 160' or 160".

Embodiments of Multi-Finger-Channel Nanostructure (MFCNS) devices may be useful for future high performance and low supply voltage applications. MFCNS devices include channel regions made up of horizontal sheets physically connected by vertical fins. These channel regions may have two to five horizontal sheets physically connected by vertical fins. The vertical fins of each channel region may be aligned along one vertical axis, or the vertical fins in each channel region may be along parallel vertical axes offset in a horizontal direction. The larger space along sidewalls of the channel region provided by the vertical fins may increase the epitaxial growth margin of the source/drain regions. The combination of horizontal sheets and vertical fins may improve on current ($I_{on}$) performance with more effective channel width. The new structure of multiple horizontal sheets connected by one or more vertical fins may reduce the top-facing channel sheet current crowding issue during on stage and high voltage operation. The MFCNS device structure may provide for more balanced performance between NMOSFETs and PMOSFETs by comprising both vertical and horizontal channel orientations. Input/output devices and core devices may enable cost reduction by sharing the same MFCNS device structure.

In accordance with an embodiment, a semiconductor device includes a channel region, the channel region including a first portion having a first surface and a second surface opposite the first surface, a second portion having a third surface and a fourth surface opposite the third surface, such that the third surface of the second portion faces the second surface of the first portion, and a fin portion extending from the second surface of the first portion to the third surface of the second portion. The semiconductor device further includes a first source/drain region and a second source/drain region on opposing sides of the channel region, and a gate electrode over the channel region, the gate electrode surrounding at least a portion of the channel region. In an embodiment, the first portion and the fin portion include different portions of a same material. In an embodiment, the first portion includes a first material and the second portion includes a second material. In an embodiment, the gate electrode is interposed between the first portion and the second portion. In an embodiment, the fin portion is perpendicular to the first portion and to the second portion. In an embodiment, the semiconductor device further includes a gate dielectric covering outer surfaces of the channel region. In an embodiment, a first inner spacer is interposed between the gate dielectric and the first source/drain region, and a second inner spacer is interposed between the gate dielectric and the second source/drain region.

In accordance with another embodiment, a nanostructure device includes a channel region on a substrate, the channel region including a first sheet portion having a first surface and a second surface opposite the first surface, a second sheet portion having a third surface and a fourth surface opposite the third surface, such that the third surface of the second sheet portion faces the second surface of the first sheet portion, a third sheet portion having a fifth surface and a sixth surface opposite the fifth surface, such that the fifth surface of the third sheet portion faces the fourth surface of the second sheet portion, a first fin portion extending from the second surface of the first sheet portion to the third surface of the second sheet portion, and a second fin portion extending from the fourth surface of the second sheet portion to the fifth surface of the third sheet portion. The nanostructure device further includes a source/drain region extending from the substrate, the source/drain region adjacent to the channel region, and a gate electrode over the channel region, first portions of the gate electrode being interposed between the first sheet portion and the second sheet portion, second portions of the gate electrode being interposed between the second sheet portion and the third sheet portion. In an embodiment, a sidewall of the first fin portion and a sidewall of the second fin portion are coplanar. In an embodiment, a first vertical axis of the first fin portion and a second vertical axis of the second fin portion are spaced apart by a distance in a range of less than 5 nm. In an embodiment, the first sheet portion has a width in a range of 10 nm to 70 nm. In an embodiment, the nanostructure device further includes a gate dielectric interposed between the gate electrode and the channel region, and an inner spacer interposed between the gate dielectric and the source/drain region, the gate dielectric covering a sidewall of the inner spacer. In an embodiment, the first sheet portion has a first thickness under the gate electrode, such that the first sheet portion has a second thickness at an interface between the first sheet portion and the source/drain region, and such that the second thickness is greater than the first thickness. In an embodiment, a ratio of the second thickness to the first thickness is in a range of 1.1 to 3.

In accordance with yet another embodiment, a method of forming a nanostructure device includes forming a first fin over a substrate, including forming a first horizontal portion and a first vertical portion protruding from the first horizontal portion, forming a second horizontal portion, the second horizontal portion contacting the first vertical portion, and forming one or more sacrificial layers around the first horizontal portion, the first vertical portion, and the second horizontal portion. The method further includes forming a dummy gate structure over a channel region of the first fin, removing a first portion of the first fin on a first side of the dummy gate structure to form a first recess, forming a source/drain region in the first recess, removing the dummy gate structure, removing a portion of the one or more sacrificial layers to expose the first horizontal portion, the first vertical portion, and the second horizontal portion in the channel region in a second recess, and forming a gate electrode around the channel region in the second recess. In an embodiment, the method further includes forming, prior to removing the first portion of the first fin, top spacers on the second horizontal portion of the first fin, the top spacers covering sidewalls of the dummy gate structure, and forming, after removing the first portion of the first fin, inner spacers under the top spacers and along sidewalls of the first fin, the inner spacers having a lower dielectric constant than the top spacers. In an embodiment, the method further includes forming a dielectric base dummy gate on the substrate, the dielectric base dummy gate being adjacent to the source/drain region. In an embodiment, the method further includes forming a second vertical portion of the first fin protruding from the second horizontal portion, and forming a third horizontal portion of the first fin, the third horizontal portion contacting the second vertical portion. In an embodiment, the first vertical portion of the first fin and the second vertical portion of the first fin are formed along the same vertical axis. In an embodiment, the method further includes, prior to forming the gate electrode, recessing the first horizontal portion of the first fin, the second horizontal portion of the first fin, and the third horizontal portion of the first fin in the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor structure including a channel region, the semiconductor structure comprising:
        a first layer having a first surface and a second surface opposite the first surface;
        a second layer having a third surface and a fourth surface opposite the third surface, wherein the third surface of the second layer faces the second surface of the first layer; and
        a semiconductor fin extending from the second surface of the first layer to the third surface of the second layer;
    a gate electrode over the semiconductor structure, the gate electrode surrounding at least a portion of the semiconductor structure; and
    a first source/drain region extending through the semiconductor structure and a second source/drain region extending through the semiconductor structure, the first source/drain region and the second source/drain region being on opposing sides of the gate electrode, the semiconductor fin physically contacting opposing sidewalls of the first source/drain region.

2. The device of claim 1, wherein the first layer and the semiconductor fin comprise different portions of a same material.

3. The device of claim 1, wherein the first layer comprises a first material and the second layer comprises a second material.

4. The device of claim 1, wherein the gate electrode is interposed between the first layer and the second layer.

5. The device of claim 1, wherein the semiconductor fin is perpendicular to the first layer and to the second layer.

6. The device of claim 1 further comprising a gate dielectric covering outer surfaces of the channel region.

7. The device of claim 6, wherein a first inner spacer is interposed between the gate dielectric and the first source/drain region, and a second inner spacer is interposed between the gate dielectric and the second source/drain region.

8. A nanostructure device, comprising:
a semiconductor nanostructure on a substrate, the semiconductor nanostructure including a channel region, the semiconductor nanostructure comprising:
a first sheet portion having a first surface and a second surface opposite the first surface;
a second sheet portion having a third surface and a fourth surface opposite the third surface, wherein the third surface of the second sheet portion faces the second surface of the first sheet portion;
a third sheet portion having a fifth surface and a sixth surface opposite the fifth surface, wherein the fifth surface of the third sheet portion faces the fourth surface of the second sheet portion;
a first semiconductor fin portion extending from the second surface of the first sheet portion to the third surface of the second sheet portion; and
a second semiconductor fin portion extending from the fourth surface of the second sheet portion to the fifth surface of the third sheet portion;
a first source region extending from the substrate, a first sidewall of the first source region physically contacting the first semiconductor fin portion and the second semiconductor fin portion;
a first drain region extending from the substrate, a second sidewall of the first drain region physically contacting the first semiconductor fin portion and the second semiconductor fin portion, wherein the first sidewall of the first source region and the second sidewall of the first drain region are opposing sidewalls; and
a gate electrode over the semiconductor nanostructure, first portions of the gate electrode being interposed between the first sheet portion and the second sheet portion, second portions of the gate electrode being interposed between the second sheet portion and the third sheet portion.

9. The device of claim 8, wherein a sidewall of the first semiconductor fin portion and a sidewall of the second semiconductor fin portion are coplanar.

10. The device of claim 8, wherein a first vertical axis of the first semiconductor fin portion and a second vertical axis of the second semiconductor fin portion are spaced apart by a distance in a range of less than 5 nm.

11. The device of claim 8, wherein the first sheet portion has a width in a range of 10 nm to 70 nm.

12. The device of claim 8 further comprising:
a gate dielectric interposed between the gate electrode and the channel region; and
an inner spacer interposed between the gate dielectric and the first source region, the gate dielectric covering a sidewall of the inner spacer.

13. The device of claim 12, wherein the first sheet portion has a first thickness under the gate electrode, wherein the first sheet portion has a second thickness at an interface between the first sheet portion and the first source region, and wherein the second thickness is greater than the first thickness.

14. The device of claim 13, wherein a ratio of the second thickness to the first thickness is in a range of 1.1 to 3.

15. A semiconductor device, comprising:
a semiconductor substrate;
a semiconductor structure over the semiconductor substrate, the semiconductor structure including a channel region, the semiconductor structure comprising:
a bottom layer having a first lower surface and a first upper surface opposite the first lower surface, the first lower surface facing the semiconductor substrate;
a top layer having a second lower surface and a second upper surface opposite the second lower surface, the second lower surface of the top layer facing the first upper surface of the bottom layer; and
a middle layer extending from the first upper surface to the second lower surface, a width of the middle layer being less than a width of the bottom layer and a width of the top layer, the middle layer having a first sidewall perpendicular to the first upper surface;
a dielectric base dummy gate on the semiconductor substrate, the dielectric base dummy gate extending through the bottom layer, the middle layer, and the top layer; and
a gate electrode over the semiconductor substrate, a first portion of the gate electrode being interposed between the first lower surface and the semiconductor substrate.

16. The device of claim 15 further comprising a gate dielectric and a first dielectric layer, the gate dielectric and the first dielectric layer being the same material, the gate dielectric covering outer surfaces of the channel region, the first dielectric layer covering a top surface of the semiconductor substrate, the first portion of the gate electrode being interposed between the gate dielectric and the first dielectric layer.

17. The device of claim 15, wherein a second portion of the gate electrode is interposed between the top layer and the bottom layer on a first side of the middle layer, a third portion of the gate electrode is interposed between the top layer and the bottom layer on a second side of the middle layer opposite the first side, and the middle layer is interposed between the second portion of the gate electrode and the third portion of the gate electrode.

18. The device of claim 15 further comprising a source/drain region on the semiconductor substrate, the source/drain region extending from an upper surface of the semiconductor structure to a lower surface of the semiconductor structure.

19. The device of claim 18, wherein the semiconductor structure is interposed between the source/drain region and the dielectric base dummy gate.

20. The device of claim 15, wherein the dielectric base dummy gate extends below a top surface of the semiconductor substrate.

* * * * *